(12) United States Patent
Ando et al.

(10) Patent No.: US 7,221,015 B2
(45) Date of Patent: May 22, 2007

(54) SEMICONDUCTOR DEVICE AND METHOD OF MANUFACTURING THE SAME

(75) Inventors: Takashi Ando, Kawasaki (JP); Jiro Miura, Kawasaki (JP); Yukinobu Hikosaka, Kawasaki (JP); Akio Itoh, Kawasaki (JP); Junichi Watanabe, Kawasaki (JP); Kenkichi Suezawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 9 days.

(21) Appl. No.: 10/388,596

(22) Filed: Mar. 17, 2003

(65) Prior Publication Data

US 2003/0227046 A1    Dec. 11, 2003

(30) Foreign Application Priority Data

Mar. 18, 2002 (JP) .............................. 2002-074566
Aug. 28, 2002 (JP) .............................. 2002-249448
Mar. 11, 2003 (JP) .............................. 2003-064601

(51) Int. Cl.
*H01L 27/108* (2006.01)
*H01L 29/76* (2006.01)

(52) U.S. Cl. ...................................... 257/306; 257/310

(58) Field of Classification Search ........ 257/295–296, 257/301, 303, 298, 532, 535, 306, 308, 310, 257/751, 311, 304; 438/3, 239–240, 396, 438/244, 253, 387
See application file for complete search history.

(56) References Cited

U.S. PATENT DOCUMENTS 5,773,314 A    6/1998 Jiang et al.

| 5,877,062 A | 3/1999 | Horii |
| 5,953,619 A | 9/1999 | Miyazawa et al. |
| 6,291,250 B1 | 9/2001 | Igarashi |
| 6,307,228 B1 | 10/2001 | Miyazawa et al. |
| 6,339,008 B1 | 1/2002 | Takenaka |
| 6,388,281 B1 | 5/2002 | Jung et al. |
| 6,441,420 B1 | 8/2002 | Nagano et al. |

(Continued)

FOREIGN PATENT DOCUMENTS

CN                 472384            1/2002

(Continued)

OTHER PUBLICATIONS

Office Action from Japanese Patent Office dated May 9, 2006 Application No. 2003-064601.

*Primary Examiner*—Hung Vu
(74) *Attorney, Agent, or Firm*—Westerman, Hattori, Daniels & Adrian, LLP.

(57) ABSTRACT

There are contained first and second conductive plugs formed in first insulating layer, an island-like oxygen-barrier metal layer for covering the first conductive plug, an oxidation-preventing insulating layer formed on the first insulating layer to cover side surfaces of the oxygen-barrier metal layer, a capacitor having a lower electrode formed on the oxygen-barrier metal layer and the oxidation-preventing insulating layer, a dielectric layer formed on the lower electrode, and an upper electrode formed on the dielectric layer, a second insulating layer for covering the capacitor and the oxidation-preventing insulating layer, a third hole formed in respective layers from the second insulating layer to the oxidation-preventing insulating layer on the second conductive plug, and a third conductive plug formed in the third hole and connected to the second conductive plug.

9 Claims, 53 Drawing Sheets

U.S. PATENT DOCUMENTS

| | | | |
|---|---|---|---|
| 6,485,988 B2 * | 11/2002 | Ma et al. ................... | 438/3 |
| 6,664,578 B2 * | 12/2003 | Lee et al. ................... | 257/295 |
| 6,686,265 B2 | 2/2004 | Beitel et al. | |
| 2002/0185683 A1 | 12/2002 | Yamazaki et al. | |

FOREIGN PATENT DOCUMENTS

| | | |
|---|---|---|
| EP | 1 061 573 A2 | 12/2000 |
| JP | 5-129156 | 5/1993 |
| JP | 10-150155 | 6/1998 |
| JP | 10-303398 | 11/1998 |
| JP | 11-54716 | 2/1999 |
| JP | 2000-138349 | 5/2000 |
| JP | 2000-174224 | 6/2000 |
| JP | 2000-349252 | 12/2000 |
| JP | 2000-349255 | 12/2000 |
| JP | 2001-44376 | 2/2001 |
| JP | 2001-44377 | 2/2001 |
| JP | 2001-250922 | 9/2001 |
| JP | 2001-525986 | 12/2001 |
| WO | WO 97/50116 A1 | 12/1997 |
| WO | WO 01/29885 A2 | 4/2001 |

* cited by examiner

SEMICONDUCTOR DEVICE AND METHOD OF MANUFACTURING THE SAME

CROSS-REFERENCE TO RELATED APPLICATIONS

This application is based upon and claims priority of Japanese Patent Applications No. 2002-74566, filed on Mar. 18, 2002, No. 2002-249448, filed on Aug. 28, 2002, and No. 2003-64601, filed on Mar. 11, 2003, the contents being incorporated herein by reference.

BACKGROUND OF THE INVENTION

1. Field of the Invention

The present invention relates to a semiconductor device and a method of manufacturing the same and, more particularly, a semiconductor device having a capacitor and a method of manufacturing the same.

2. Description of the Prior Art

The ferroelectric capacitor of FeRAM (Ferroelectric Random Access Memory) that is mass-produced currently has the planar structure.

However, the capacitor having the stacked structure, a cell area of which can be reduced smaller, is needed in future in reply to the request for the higher integration. The stacked structure has the conductive plug, which is used to provide contact with the semiconductor substrate, directly under the lower electrode of the ferroelectric capacitor. As set forth in Patent Application Publication (KOKAI) 2001-443476, for example, it is normal that tungsten or polysilicon is used as the material of such conductive plug.

While, the FeRAM and the logic device are hybrid-integrated in many products. For example, there are the semiconductor chip used in the security field that needs the authentication, the IC card that is utilized gradually in the local self-governing body, etc.

In the logic semiconductor device, it is common that the process using the tungsten plug is employed to connect the underlying conductive pattern and the overlying conductive pattern. It is of course that, as the spice parameter used to design the circuit, the resistance value of the tungsten plug is employed.

Therefore, if the significances to make efficient use of accumulated circuit design properties and to lower the development man-hour/cost are considered, it has the great merit to use the tungsten plug as the contact plug in the logic hybrid-integrated FeRAM like the prior art.

Next, steps of forming the memory cell having the stacked capacitor will be explained hereunder.

First, steps required until a structure shown in FIG. 1A is formed will be explained hereunder.

An element isolation insulating film 102 is formed around an element forming region of a silicon substrate 101, and then a well 103 is formed in the element forming region. Then, two MOS transistors 104 are formed in one well 103.

The MOS transistors 104 have gate electrodes 104b formed on the well 103 via a gate insulating film 104a, and impurity diffusion regions 104c, 104d formed in the well 103 on both sides of the gate electrodes 104b to serve as the source/drain. Also, insulating sidewalls 105 used to form high concentration impurity regions 104e in the impurity diffusion regions 104c, 104d are formed on both side surfaces of the gate electrodes 104b.

Then, a transistor protection insulating film 106 for covering the MOS transistors 104 is formed on the silicon substrate 101, and then a first interlayer insulating film 107 is formed on the transistor protection insulating film 106.

And, first contact holes 107a are formed in the first interlayer insulating film 107 on one impurity diffusion regions 104c of the MOS transistors 104, and then first contact plugs 108 are buried in the first contact holes 107a.

Then, a first metal film 109, a ferroelectric film 110, and a second metal film 111 are formed sequentially on the first contact plugs 108 and the first interlayer insulating film 107. As the ferroelectric film 110, for example, a PZT film is formed.

Then, as shown in FIG. 1B, capacitors 112 are formed by patterning the first metal film 109, the ferroelectric film 110, and the second metal film 111 by virtue of the photolithography method.

In the capacitor 112, a lower electrode 109a is formed of the first metal film 109, a dielectric film 110a is formed of the ferroelectric film 110, and an upper electrode 111a is formed of the second metal film 111. The capacitor is the stacked capacitor, and the lower electrodes 109a are connected to one impurity diffusion regions 104c of the MOS transistors 104 via the underlying first contact plugs 108 respectively.

Then, as shown in FIG. 1C, a capacitor protection film 113 is formed on the capacitors 112 and the first interlayer insulating film 107. Then, a second interlayer insulating film 114 is formed on the capacitor protection film 113. Then, a second contact hole 114a is formed on the other impurity diffusion region 104d of the MOS transistors 104 by patterning the second interlayer insulating film 114, the capacitor protection film 113, the first interlayer insulating film 107, and the transistor protection insulating film 106 by virtue of the photolithography method. Then, a second contact plug 115 is formed in the second contact hole 114a.

Next, steps required until a structure shown in FIG. 1D is formed will be explained hereunder.

Third contact holes 114b are formed on the upper electrodes 110a of the capacitors 112 by patterning the second interlayer insulating film 114 and the capacitor protection film 113. Then, a conductive film is formed on the second interlayer insulating film 114 and in the third contact holes 114b, and then this conductive film is patterned. Thus, wirings 116a connected to the upper electrodes 111a of the capacitors 112 respectively are formed and simultaneously a conductive pad 116b is formed on the second contact plug 115.

Then, a third interlayer insulating film 117 is formed on the wirings 116a, the conductive pad 116b, and the second interlayer insulating film 114. Then, a hole 117a is formed on the conductive pad 116b by patterning the third interlayer insulating film 117. Then, a fourth conductive plug 118 is formed in the hole 117a.

Then, a bit line 118 connected to the fourth conductive plug 118 is formed on the third interlayer insulating film 117.

As the ferroelectric film 110 of the ferroelectric capacitor 112, for example, the PZT film is formed. After the formation, this PZT film is annealed in the oxygen atmosphere to crystallize. After the later etching, the recovery annealing of the PZT film, etc. are carried out in the oxygen atmosphere.

Here, the situation in which the tungsten plugs are formed as the contact plug directly under the ferroelectric capacitors shown in FIGS. 1A to 1D will be considered.

As set forth in Patent Application Publication (KOKAI) Hei 10-303398, the tungsten plug is oxidized very quickly at a low temperature. Also, oxidation of the tungsten plug spreads throughout the plug once such oxidation occurs, so that the contact failure is caused easily and reduction in the yield of the FeRAM device is brought about.

Also, even if the polysilicon is employed as the material of the contact plug, such polysilicon is also oxidized though the oxidation is not so serious as the tungsten.

By the way, as explained above, in order to improve the performance of the ferroelectric capacitor, the annealing is required in various oxygen atmospheres.

Therefore, improvement in the performance of the ferroelectric capacitor and improvement in the performance of the contact plug were in the trade-off relationship.

In contrast, various trials were made to prevent the abnormal oxidation of the tungsten plug in the crystallization annealing of the ferroelectric film or in the recovery annealing of the ferroelectric capacitor. For example, in Patent Application Publication (KOKAI) Hei 10-303398, Patent Application Publication (KOKAI) 2000-349255, Patent Application Publication (KOKAI) 2001-44377, Patent Application Publication (KOKAI) Hei 10-150155, and Patent Application Publication (KOKAI) 2000-349252, the structure in which the oxygen-barrier-metal layer is formed between the capacitor and the tungsten plug is set forth.

As described above, in the MOS transistor 104 constituting the memory cell, one impurity diffusion region 104c is connected to the ferroelectric capacitor 112 via the contact plug 108, and the other impurity diffusion region 104d is connected to the bit line 119 via another contact plug 115.

The reason why the contact plug 115 for bit-line connection is formed after the ferroelectric capacitor 112 is formed is to prevent the oxidation of the contact plug 115 in the crystallization annealing of the ferroelectric film 110 in the oxygen atmosphere or in the recovery annealing of the ferroelectric capacitor 112.

However, an aspect ratio of the contact plug 115 for bit-line connection is increased more and more with the further miniaturization in future. Therefore, technical subjects that are to be overcome newly such as the etching to form the contact hole 114a for bit-line connection, the filling of the glue layer in the contact hole 114a for bit-line connection, etc. are brought about.

SUMMARY OF THE INVENTION

It is an object of the present invention to provide a semiconductor device capable of forming satisfactorily a conductive plug connected to a capacitor and other conductive plugs, and a method of manufacturing the same.

According to one aspect of the present invention, there is provided a semiconductor device comprising: a first impurity diffusion region and a second impurity diffusion region formed on a surface layer of a semiconductor substrate; a first insulating layer formed over the semiconductor substrate; a first hole and a second hole formed in the first insulating layer; a first conductive plug formed in the first hole and connected electrically to the first impurity diffusion region; a second conductive plug formed in the second hole and connected electrically to the second impurity diffusion region; an island-like oxygen-barrier metal layer formed on the first insulating layer over the first conductive plug and its peripheral area; an oxidation preventing layer formed on the first insulating layer and made of material that prevents oxidation of the second conductive plug; a capacitor having a lower electrode formed on the oxygen-barrier metal layer, a dielectric layer formed on the lower electrode, and an upper electrode formed on the dielectric layer; a second insulating layer for covering the capacitor and the oxidation preventing layer; a third hole formed in the second insulating layer on the second conductive plug; and a third conductive plug formed in the third hole and connected electrically to the second conductive plug.

The above subject is overcome by providing a semiconductor device manufacturing method that comprises the steps of forming a first impurity diffusion region and a second impurity diffusion region on a surface layer of a semiconductor substrate; forming a first insulating layer over the semiconductor substrate; forming a first hole and a second hole in the first insulating layer; forming a first conductive plug, which is connected electrically to the first impurity diffusion region, in the first hole and simultaneously a second conductive plug, which is connected electrically to the second impurity diffusion region, in the second hole; forming an oxygen-barrier metal layer on the first conductive plug and the second conductive plug and the first insulating layer; patterning the oxygen-barrier metal layer to leave the oxygen-barrier metal layer like an island on the first conductive plug; forming an oxidation preventing layer on the first insulating layer over the second conductive plug and its peripheral area; forming an insulating adhesion layer on the oxidation preventing layer and the oxygen-barrier metal layer; exposing an upper surface of the oxygen-barrier metal layer by polishing the insulating adhesion layer; forming a first conductive layer on the oxygen-barrier metal layer and the insulating adhesion layer; forming a dielectric layer on the first conductive layer; forming a second conductive layer on the dielectric layer; forming a capacitor on the oxygen-barrier metal layer over the first conductive plug by patterning the second conductive layer, the dielectric layer, and the first conductive layer; forming a second insulating layer over the capacitor, the insulating adhesion layer, and the oxidation preventing layer; forming a third hole over the second conductive plug by patterning the second insulating layer; and forming a third conductive plug, which is connected electrically to the second conductive plug, in the third hole.

According to the present invention, the first and second conductive plugs are formed in the first insulating layer over the semiconductor substrate, then the oxygen-barrier metal layer is formed on the first conductive plug and the oxidation-preventing insulating layer is formed on the second conductive plug, then the capacitor is formed on the first conductive plug via the oxygen-barrier metal layer, then the second insulating layer for covering the capacitor is formed, and then the third conductive plug is formed on the second conductive plug and in the second insulating layer.

Therefore, the structure for connecting the impurity diffusion region and the upper wiring is made on a via-to-via basis, and it is not needed to form the holes having the large aspect ratio at a time, and the filling of the holes can be facilitated. As a result, the up-to-date equipment is not required, and the development cost and the step cost can be reduced.

Also, the oxygen-barrier metal layer is formed on the first insulating layer over the first conductive plug and its peripheral area out of the first conductive plug and the second conductive plug. Also, the oxidation-preventing insulating layer is formed on the second conductive plug and the first insulating layer. Therefore, the abnormal oxidation of the first conductive plug is prevented by the oxygen-barrier metal layer, and also the abnormal oxidation of the second conductive plug is prevented by the oxidation-preventing insulating layer. As a result, in the step of growing the insulating adhesion layer as the underlying layer of the capacitor, the step of crystallization annealing of the dielectric layer executed to form the capacitor on the first conductive plug, and the step of the recovery annealing after formation of the capacitor, the first and second conductive plugs are never abnormally oxidized.

In addition, since the oxygen-barrier metal layer and the insulating adhesion layer are planarized simultaneously by the polishing, the capacitor lower electrode formed on the oxygen-barrier metal layer is formed flat. Thus, generation of the degradation of the dielectric layer formed on the lower electrode is avoided, and also formation of the capacitor with good characteristics can be formed.

Also, the third conductive plug is formed in the second insulating layer for covering the capacitor to connect the third conductive plug and the second conductive plug. Thus, the abnormal oxidation of the second conductive plug can be avoided until the third conductive plug is formed after the oxidation-preventing insulating layer is formed. In other words, since the oxidation-preventing insulating layer is present around the second conductive plug, the entering of the oxygen from the upper surface of the interlayer insulating layer is prevented and thus the oxidation of the second conductive plug is prevented much more. In this case, since the step of the oxygen annealing is not contained in the steps executed from the formation of the first and second conductive plugs to the formation of the insulating adhesion layer, the abnormal oxidation of the first and second conductive plugs is not caused prior to the formation of the oxidation-preventing insulating layer.

Further, according to the present invention, the oxygen-barrier metal layer instead of the oxidation-preventing insulating layer is formed like the island on the second conductive plug. Therefore, not only the same advantages as the oxidation-preventing insulating layer is obtained but also the step of forming the oxidation-preventing insulating layer is omitted. In this case, the oxygen-barrier metal layer formed like the island on the first and second conductive plugs respectively can be formed simultaneously, and thus the number of steps is never increased.

Also, the oxidation-preventing layer made of the same material as the oxygen-barrier metal layer is formed on the second conductive plug and its peripheral area and, in addition, side surfaces of the oxygen-barrier metal layer formed on the first and second conductive plugs respectively are covered with the oxidation-preventing insulating layer. Therefore, the oxygen is prevented from entering from the clearance between the oxygen-barrier metal layer and the first insulating layer, and also the oxidation of the first and second conductive plugs is prevented.

In this case, the step of patterning the lower electrode is reduced, by adopting the oxygen-barrier metal layer formed on the first conductive plug under the capacitor as the lower electrode.

The peeling-off of the capacitor lower electrode is prevented, by forming the conductive adhesion layer between the conductive layer constituting the capacitor lower electrode and the oxygen-barrier metal layer.

The adherence between the oxygen-barrier metal layer and the first insulating layer is improved, by forming the conductive adhesion layer between the oxygen-barrier metal layer and the first insulating layer. Therefore, the oxygen is prevented without fail from being supplied from the clearance between the oxygen-barrier metal layer and the first insulating layer to the conductive plug.

Further, when the oxygen-barrier metal layer is formed as the multi-layered structure and the upper layer is formed of the material that can be relatively easily polished, e.g., iridium oxide, the underlying layer of the capacitor is formed flatter by polishing the insulating adhesion layer and the oxygen-barrier metal layer. Therefore, the characteristic of the capacitor is improved.

In the case that the oxygen-barrier metal layer is patterned by using the hard mask, the insulating adhesion layer is formed on the hard mask and the oxidation-preventing insulating layer after the patterning of the oxygen-barrier metal layer, and then the insulating adhesion layer and the hard mask is polished continuously until the oxygen-barrier metal layer is exposed. Therefore, the independent step of removing the hard mask is omitted. In addition, since the second conductive plug is covered with the insulating adhesion layer in removing the hard mask, the damage of the second conductive plug in removing the hard mask is avoided.

DESCRIPTION OF THE PREFERRED EMBODIMENTS

Embodiments of the present invention will be explained in detail with reference to the drawings hereinafter.

First Embodiment

Figure 2A:
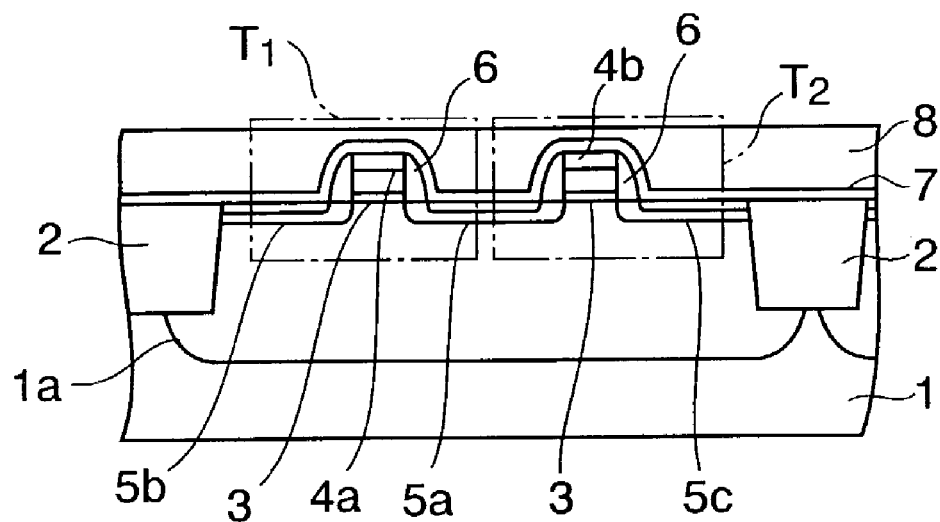
FIGS. 2A to 2O are sectional views showing steps of manufacturing a semiconductor device according to a first embodiment of the present invention.
Figure 2B:
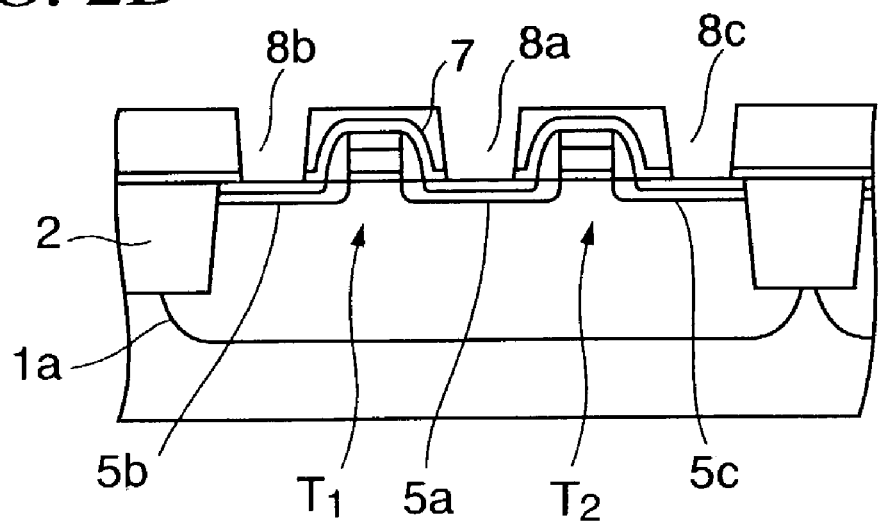
Figure 2C:
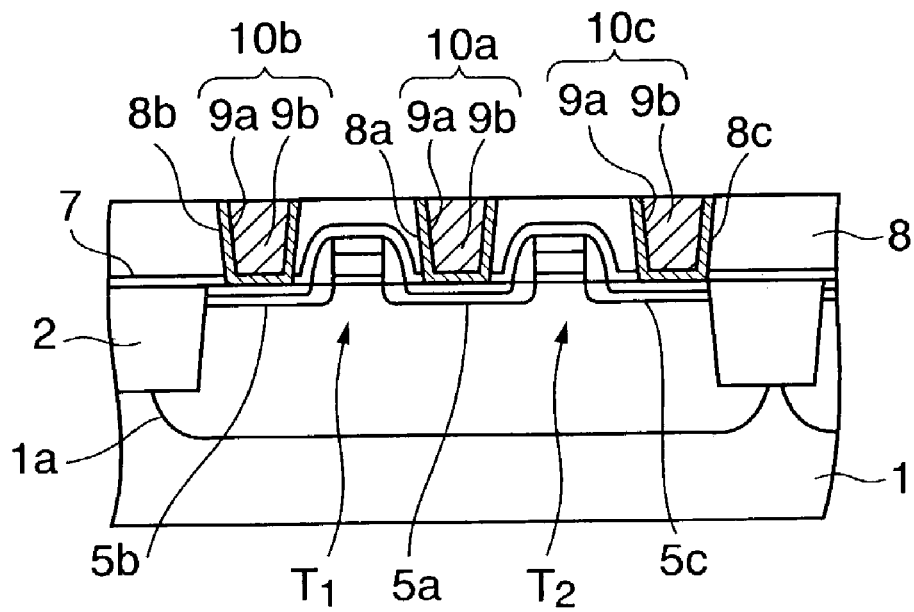
Figure 2D:
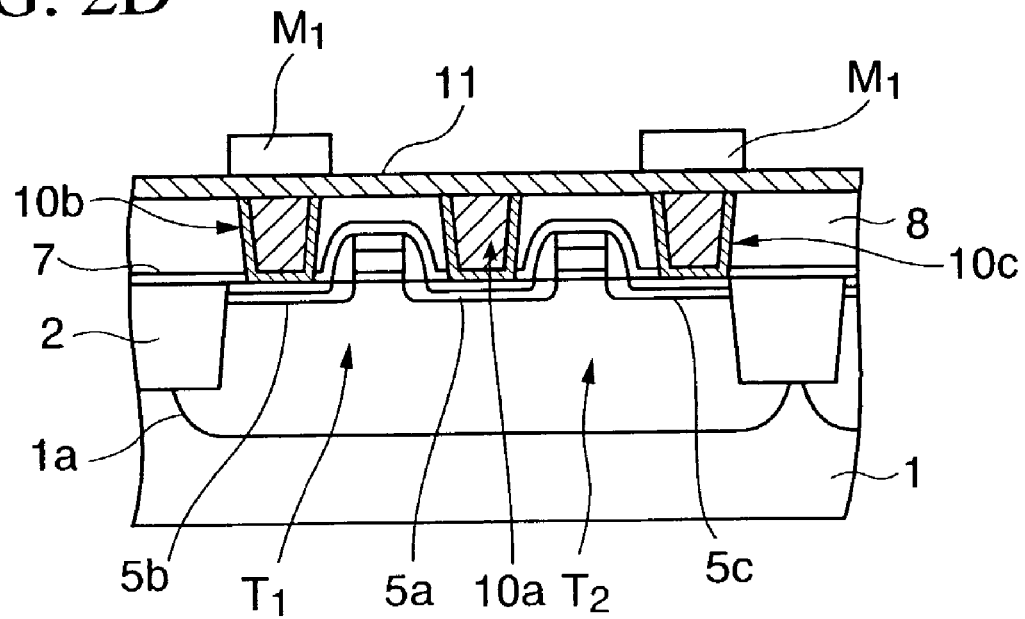
Figure 2E:
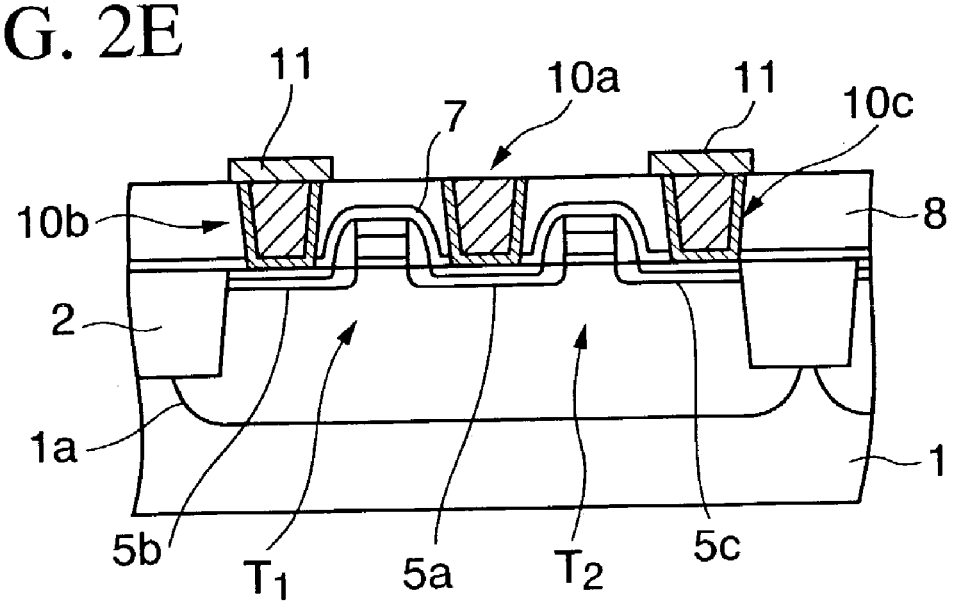
Figure 2F:
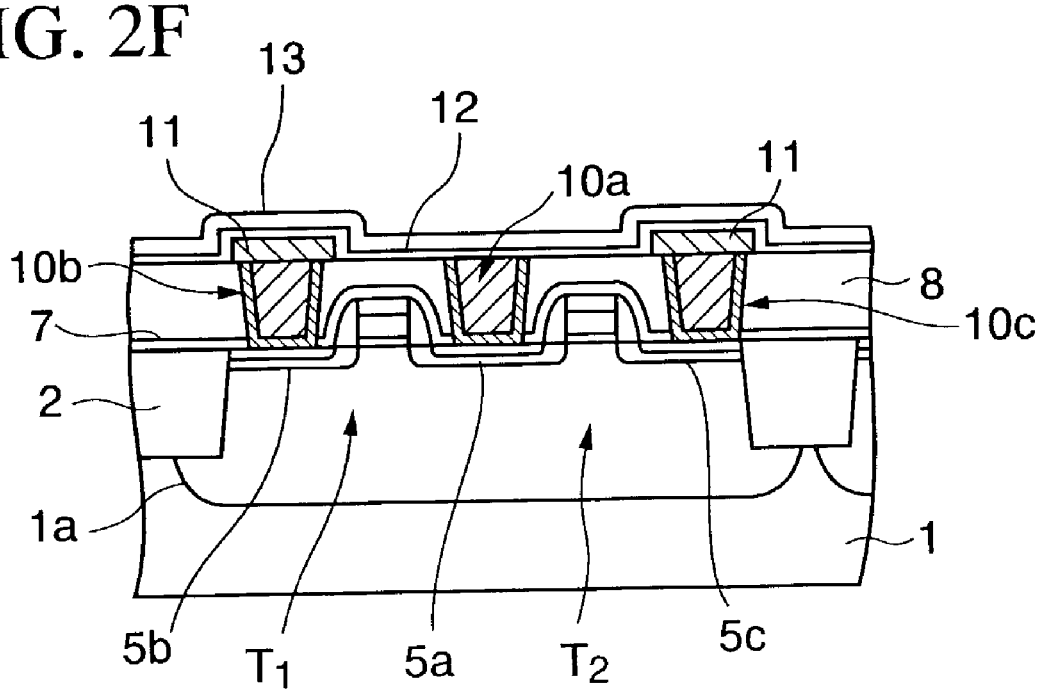
Figure 2G:
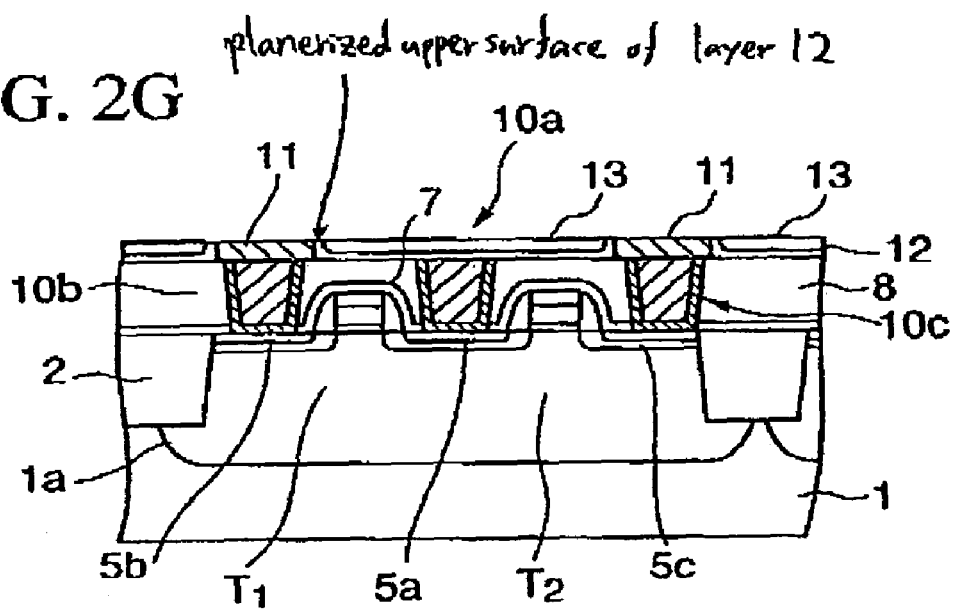
Figure 2H:
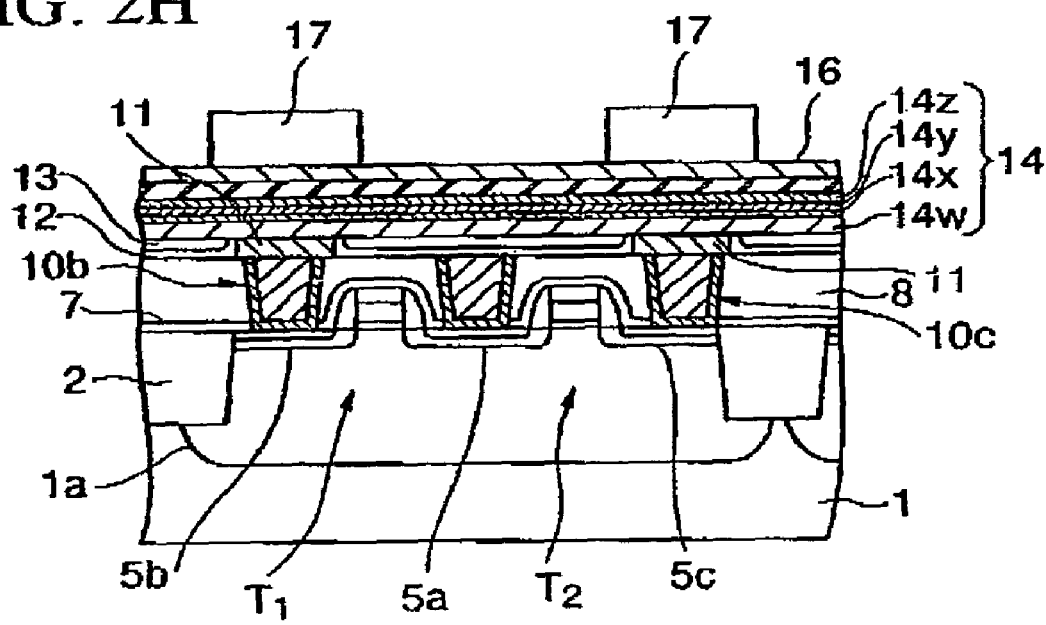
Figure 2I:
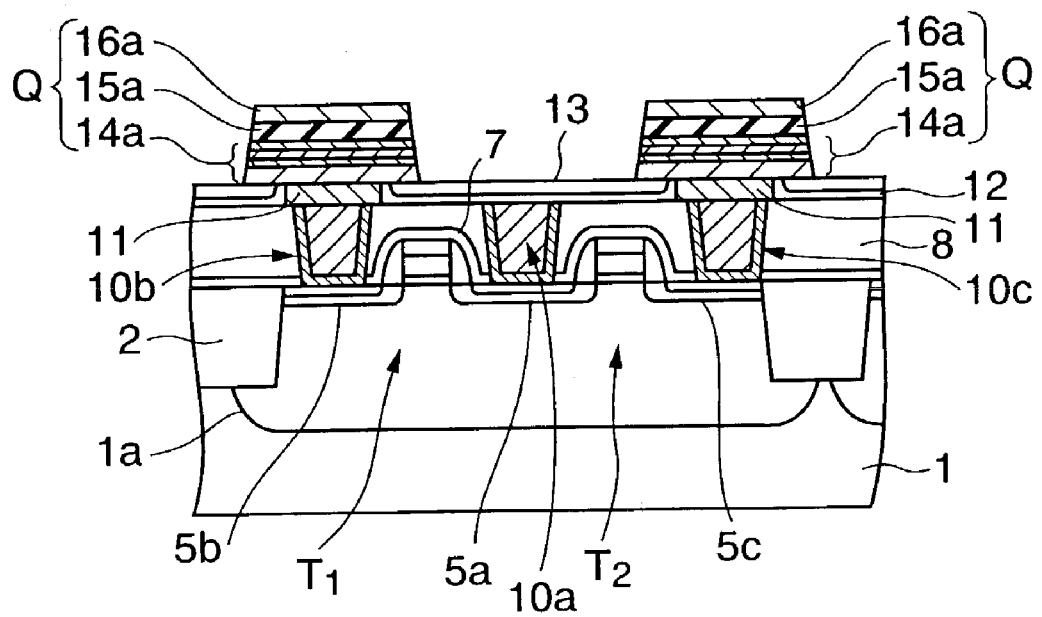
Figure 2J:
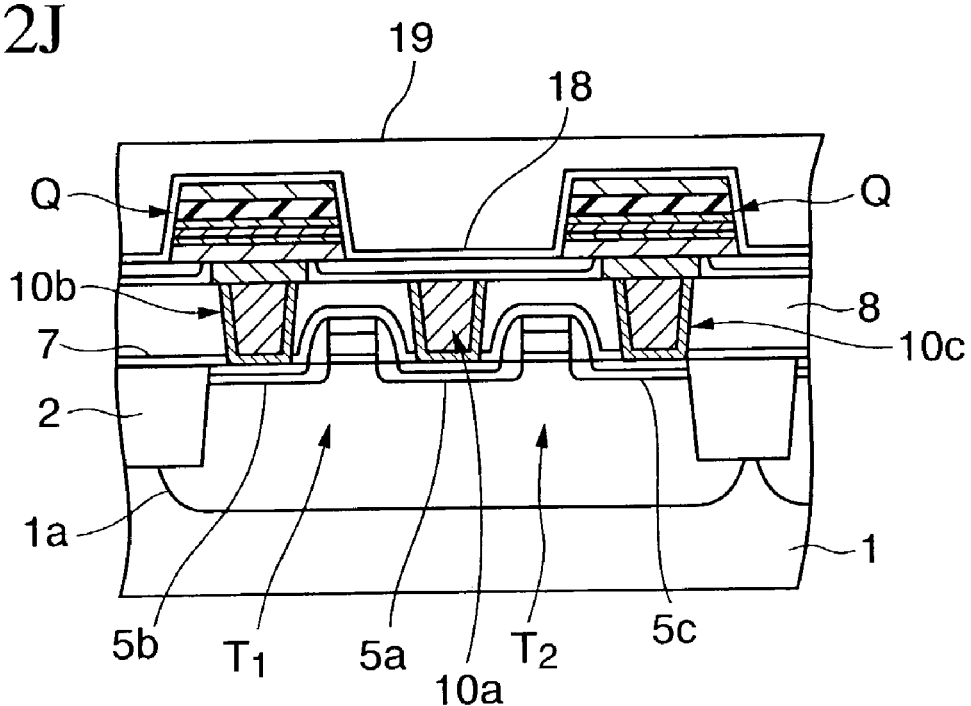
Figure 2K:
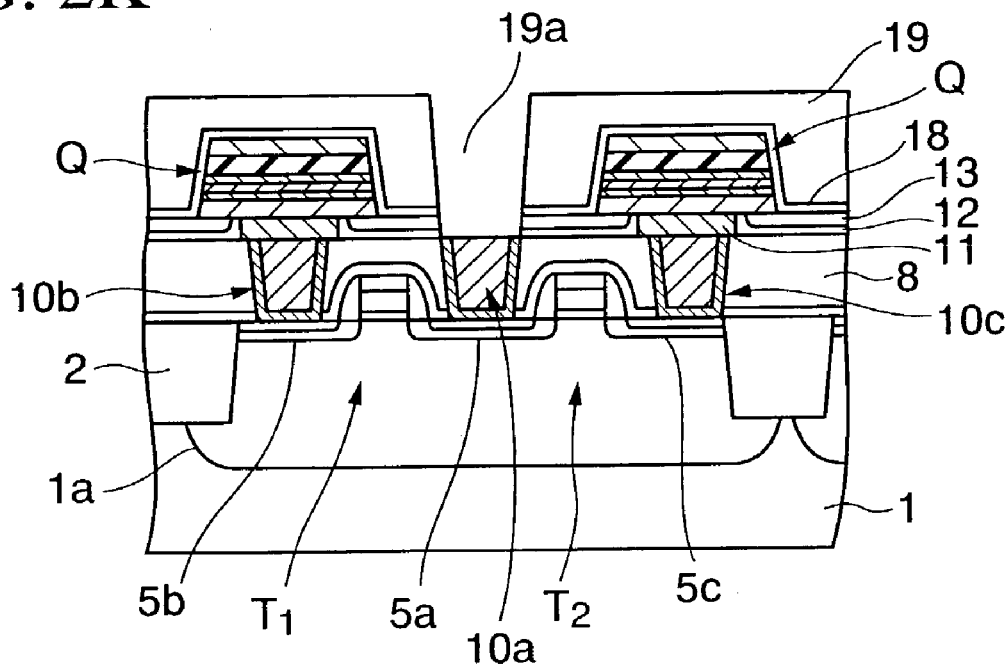
Figure 2L:
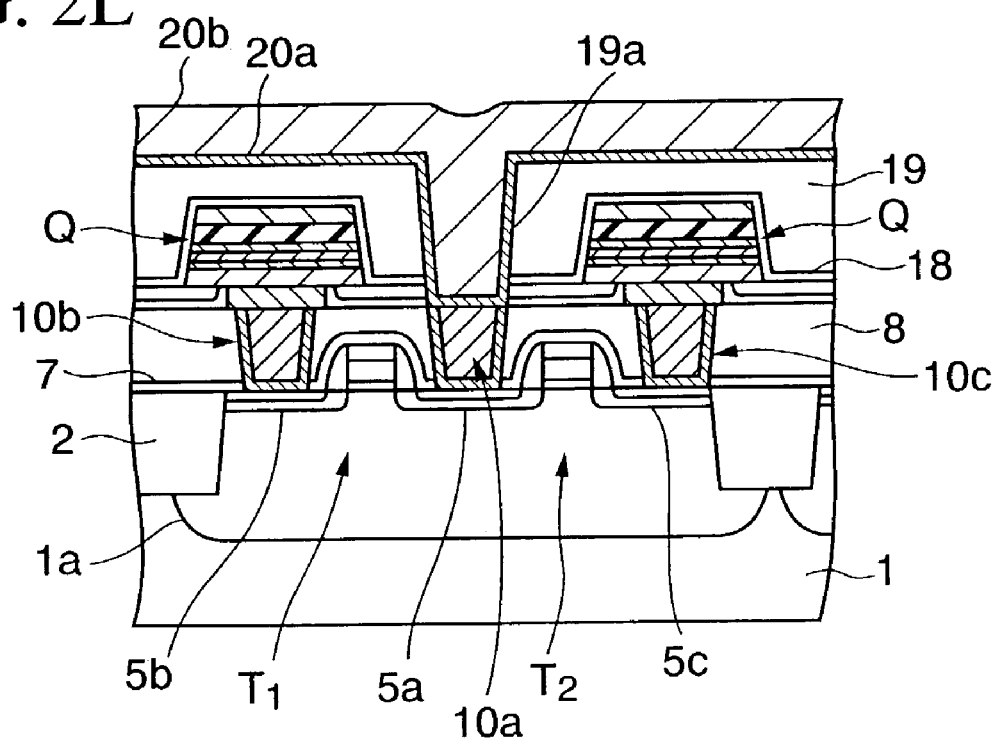
Figure 2M:
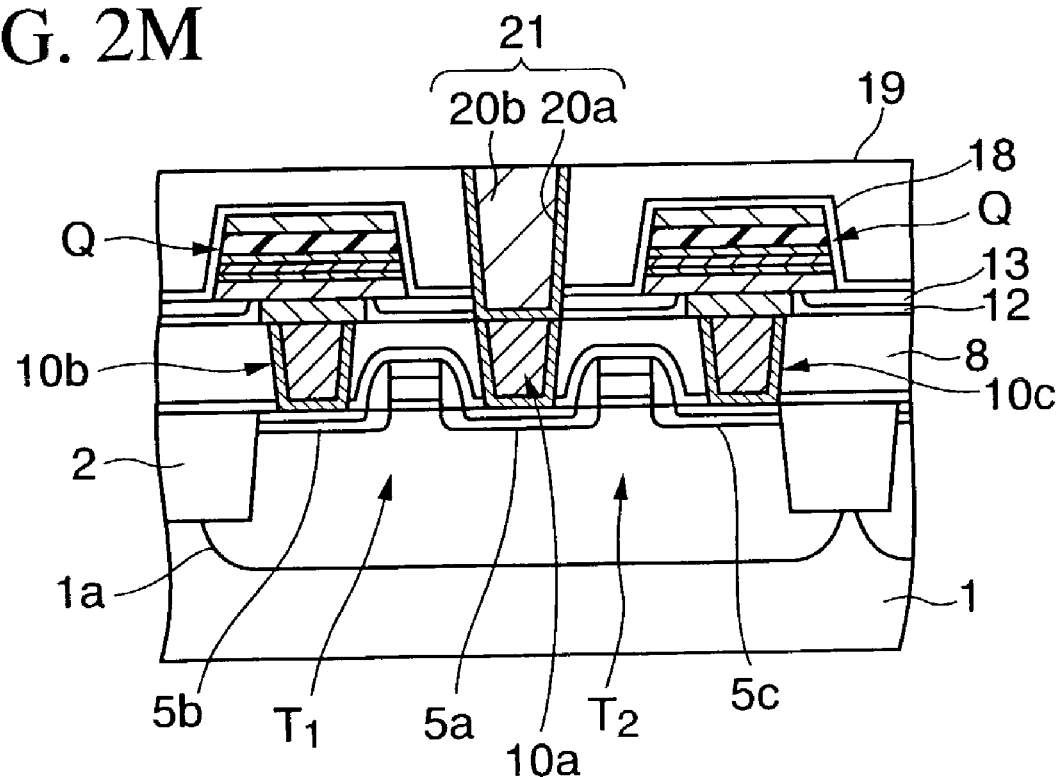
Figure 2N:
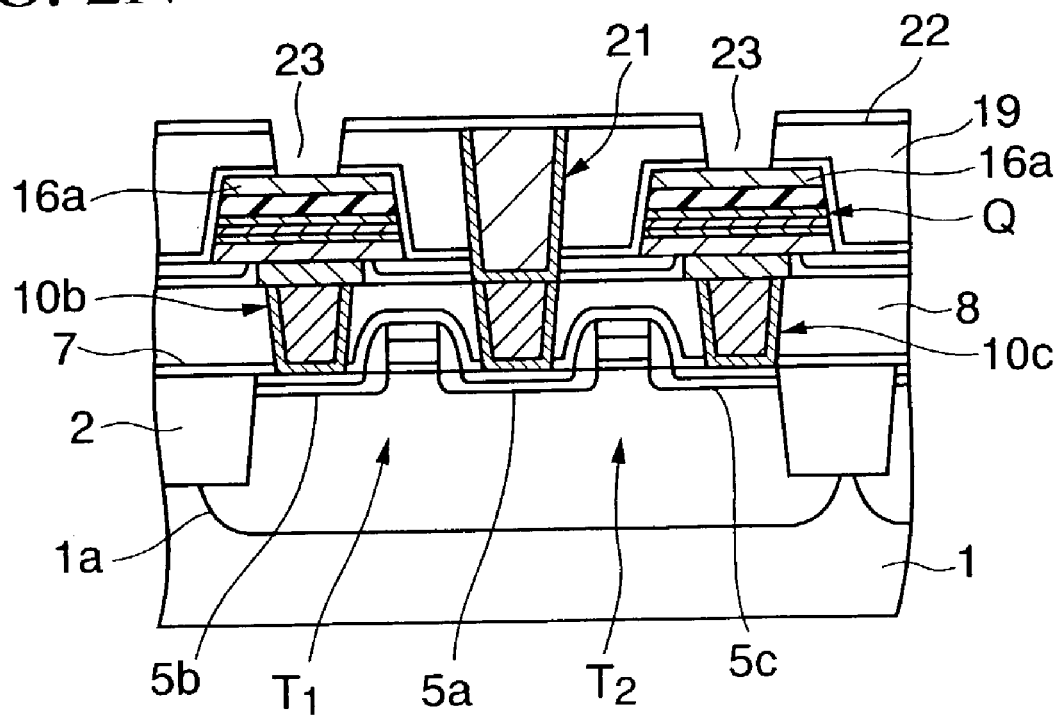
Figure 2O:
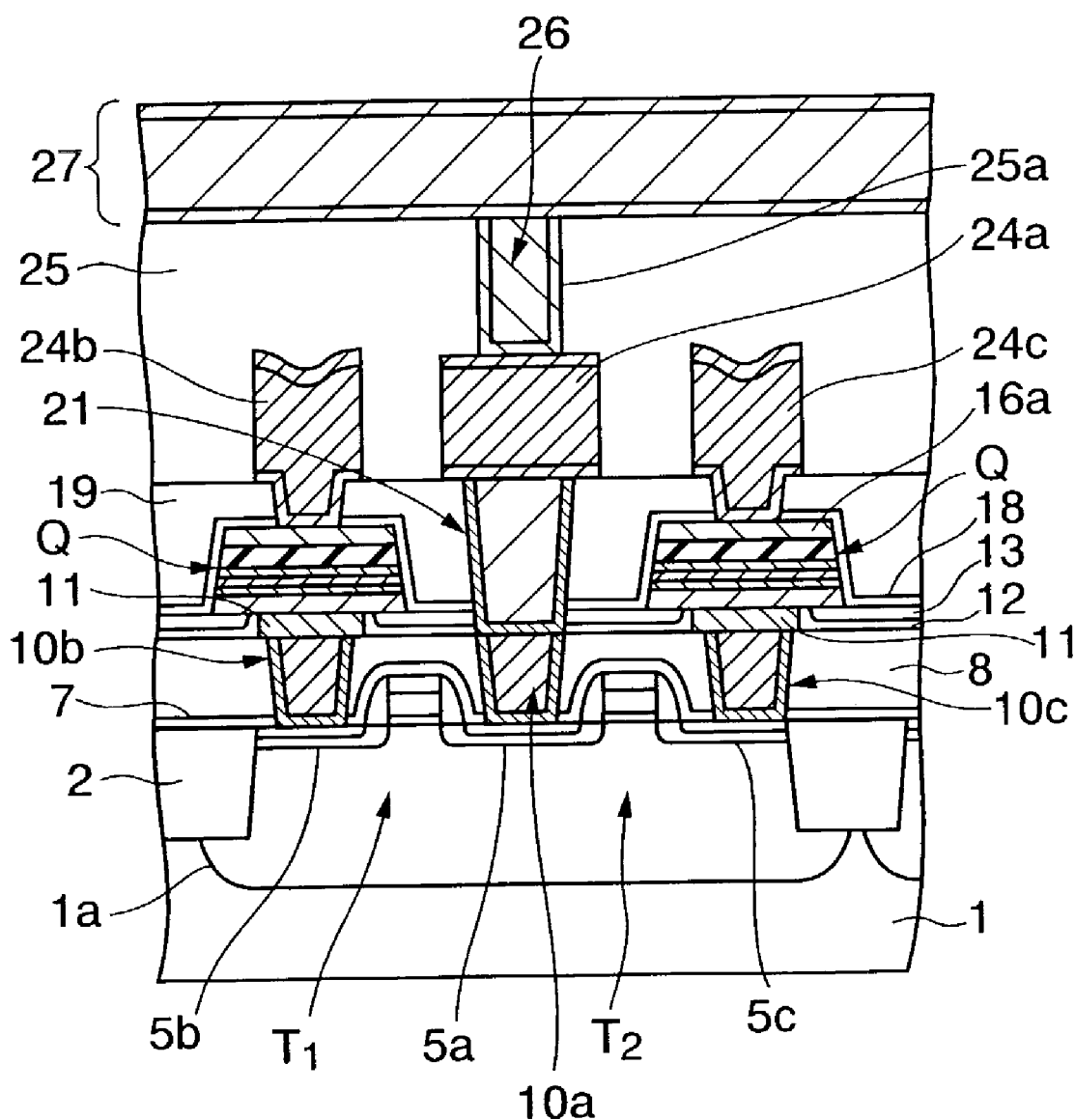

FIGS. 2A to 2O are sectional views showing steps of manufacturing a semiconductor device according to a first embodiment of the present invention.

Next, steps required until a sectional structure shown in FIG. 2A is formed will be explained hereunder.

First, an element isolation recess is formed around a transistor forming region of an n-type or p-type silicon (semiconductor) substrate 1 by the photolithography method, and then an element isolation insulating layer 2 is formed by burying silicon oxide ($SiO_2$) in the element isolation recess. The element isolation insulating layer 2 having such structure is called STI (Shallow Trench Isolation). In this case, an insulating layer formed by the LOCOS (Local Oxidation of Silicon) method may be employed as the element isolation insulating layer.

Then, a p-type well 1a is formed by introducing the p-type impurity selectively into the transistor forming region of the silicon substrate 1 in the memory cell region.

Then, a silicon oxide layer as a gate insulating layer 3 is formed by thermally oxidizing a surface of the p-type well 1a of the silicon substrate 1.

Then, an amorphous silicon or polysilicon layer and a tungsten silicide layer are formed sequentially on an overall upper surface of the silicon substrate 1. Then, gate electrodes 4a, 4b are formed on the p-type well 1a in the memory cell region by patterning the silicon layer and the tungsten silicide layer by virtue of the photolithography method. These gate electrodes 4a, 4b are formed on the silicon substrate 1 via the gate insulating layer 3.

In this case, in the memory cell region, two gate electrodes 4a, 4b are formed on one p-type well 1a in parallel and these gate electrodes 4a, 4b constitute a part of the word line.

Then, first to third n-type impurity diffusion regions 5a to 5c serving as the source/drain are formed by ion-implanting the n-type impurity, e.g., phosphorus, into the p-type well 1a on both sides of the gate electrodes 4a, 4b.

Then, an insulating layer, e.g., a silicon oxide ($SiO_2$) layer is formed on the overall surface of the silicon substrate 1 by the CVD method. Insulating sidewall spacers 6 are left on both side portions of the gate electrodes 4a, 4b by etching back the insulating layer.

Then, in the p-type well 1a, the n-type impurity is ion-implanted once again into the first to third n-type impurity diffusion regions 5a to 5c by using the gate electrodes 4a, 4b and the sidewall spacers 6 as a mask. Thus, high-concentration impurity regions are formed in the first to third n-type impurity diffusion regions 5a to 5c respectively.

In this case, in one p-type well 1a, the first n-type impurity diffusion region 5a formed between two gate electrodes 4a, 4b is connected electrically to the bit line to be described later, and also the second and third n-type impurity diffusion regions 5b, 5c formed near both end sides of the p-type well 1a are connected electrically to the capacitor lower electrodes to be described later.

According to the above steps, two n-type MOS transistors $T_1$, $T_2$ having the gate electrodes 4a, 4b and the n-type impurity diffusion regions 5a to 5c of the LDD structure are formed in the p-type well 1a while using one n-type impurity diffusion region 5a commonly.

Then, as a cover layer 7 for covering the MOS transistors $T_1$, $T_2$, a silicon oxide nitride (SiON) layer of about 200 nm thickness is formed on the overall surface of the silicon substrate 1 by the plasma CVD method. Then, a silicon oxide ($SiO_2$) layer of about 1.0 µm thickness is formed as a first interlayer insulating layer 8 on the cover layer 7 by the plasma CVD method using the TEOS gas.

Then, the first interlayer insulating layer 8 is annealed at the temperature of 700° C. for 30 minute in the nitrogen atmosphere at the atmospheric pressure, for example, whereby the first interlayer insulating layer 8 is densified. Then, an upper surface of the first interlayer insulating layer 8 is planarized by the CMP (Chemical Mechanical Polishing) method.

Then, as shown in FIG. 2B, the first interlayer insulating layer 8 and the cover layer 7 are etched by using a resist pattern (not shown). Thus, first, second, and third contact holes 8a, 8b, 8c are formed on the first, second, and third n-type impurity diffusion regions 5a, 5b, 5c in the memory cell region respectively.

Next, steps required until a structure shown in FIG. 2C is formed will be explained hereunder.

First, a titanium (Ti) layer of 20 nm thickness and a titanium nitride (TiN) layer of 50 nm thickness are formed sequentially as a glue layer 9a on the first interlayer insulating layer 8 and in the first to third contact holes 8a to 8c by the sputter method. Then, a tungsten (W) layer 9b is grown on the glue layer 9a by the CVD method using $WF_6$ to fill perfectly insides of the contact holes 8a to 8c.

Then, the tungsten layer 9b and the glue layer 9a are polished by the CMP method to remove from an upper surface of the first interlayer insulating layer 8. As a result, the tungsten layer 9b and the glue layer 9a being left in the first, second, and third contact holes 8a, 8b, 8c respectively are used as first, second, and third conductive plugs 10a, 10b, 10c. The first, second, and third conductive plugs 10a, 10b, 10c are connected to the first, second, and third n-type impurity diffusion regions 5a, 5b, 5c respectively. Also, the first conductive plug 10a is connected electrically to the bit line to be described later, and the second and third conductive plugs 10b, 10c are connected electrically to the capacitors to be described later respectively.

Then, the first interlayer insulating layer 8 is exposed to the nitrogen plasma at the substrate temperature of 350° C. for 120 second.

Then, as shown in FIG. 2D, an iridium layer is formed as a conductive oxygen-barrier metal layer 11 on the first to third conductive plugs 10a to 10c and the first interlayer insulating layer 8 by the sputter. The iridium layer is formed to have a thickness enough to prevent the abnormal oxidation of the second and third conductive plugs 10b, 10c. In order to prevent the abnormal oxidation of the conductive plugs 10a to 10c caused when the annealing is carried out at the substrate temperature of 550° C. in the oxygen-containing atmosphere, the iridium layer is formed to have the thickness of 200 nm, for example, and is also formed to increase such thickness by 100 nm every time when the, substrate temperature is increased by 100° C.

Then, resist patterns are formed as a mask $M_1$ on the oxygen-barrier metal layer 11 over the second and third conductive plugs 10b, 10c and their peripheral regions.

Then, as shown in FIG. 2E, the oxygen-barrier metal layer 11 in the region that is not covered with the mask $M_1$ is etched, and thus the oxygen-barrier metal layers 11 are left like an island on the second and third conductive plugs 10b, 10c and their peripheral regions. Accordingly, the first conductive plug 10a is exposed. Then, the masks $M_1$ are removed. In this case, a hard mask made of titanium nitride, silicon oxide, or the like may be employed as the mask $M_1$. The hard mask consists of inorganic material, unlike the resist mask made of organic material.

Then, as shown in FIG. 2F, a silicon oxide nitride (SiON) layer or a silicon nitride ($Si_3N_4$) layer is formed as an oxidation-preventing insulating layer 12 on the first conductive plug 10a, the oxygen-barrier metal layers 11, and the first interlayer insulating layer 8 by the CVD method to have a thickness of 100 nm, for example. The SiON layer or the $Si_3N_4$ layer of 100 nm thickness has such a capability that is able to prevent the oxidation of the first conductive plug 10a in the oxygen annealing at about 650° C.

Then, an insulating adhesion layer 13 is formed on the oxidation-preventing insulating layer 12. The insulating adhesion layer 13 is formed to improve the adhesion to the capacitor lower electrode to be described later. As the insulating adhesion layer 13, a silicon oxide ($SiO_2$) layer of 100 nm thickness is formed by the CVD method using TEOS, for example.

Then, as shown in FIG. 2G, while making the oxygen-barrier metal layers 11 function as a stopper layer, the insulating adhesion layer 13 and the oxidation-preventing insulating layer 12 are polished by the CMP method to expose an upper surface of the oxygen-barrier metal layers 11. In this case, polished surfaces of the oxygen-barrier metal layers 11, the insulating adhesion layer 13, and the oxidation-preventing insulating layer 12 are made flat.

Then, as shown in FIG. 2H, a first conductive layer 14 is formed on the oxygen-barrier metal layers 11, the oxidation-preventing insulating layer 12, and the insulating adhesion layer 13. As the first conductive layer 14, an iridium (Ir) layer 14w of 200 nm thickness, an iridium oxide ($IrO_2$) layer 14x of 30 nm thickness, a platinum oxide (PtO) layer 14y of 30 nm thickness, and a platinum (Pt) layer 14z of 50 nm thickness, for example, are formed in sequence by the sputter.

In this case, the insulating adhesion layer 13 is annealed to prevent the peeling-off of the layer, for example, before or after the first conductive layer 14 is formed. As the annealing method, RTA (Rapid Thermal Annealing) executed at 750° C. for 60 second in the argon atmosphere, for example, may be employed.

Then, a PZT layer of 200 nm thickness, for example, is formed as a ferroelectric layer 15 on the first conductive layer 14 by the sputter method. As the method of forming the ferroelectric layer 15, there are the MOD (Metal Organic Desposition) method, the MOCVD (Metal Organic CVD) method, the sol-gel method, etc. in addition to this. Also, as the material of the ferroelectric layer 15, other PZT material such as PLCSZT, PLZT, etc., the Bi-layered structure compound material such as $SrBi_2Ta_2O_9$, $SrBi_2(Ta,Nb)_2O_9$, etc., and other metal oxide ferroelectric substance may be employed in addition to PZT.

Then, the ferroelectric layer 15 is annealed in the oxygen-containing atmosphere to crystallize. As such annealing, two-step RTA process having the first step that is executed at the substrate temperature of 600° C. for 90 second in the mixed-gas atmosphere containing argon (Ar) and oxygen ($O_2$) and the second step that is executed at the substrate temperature of 750° C. for 60 second in the oxygen atmosphere, for example, is employed.

An iridium oxide ($IrO_2$) of 200 nm thickness, for example, is formed as a second conductive layer 16 on the ferroelectric layer 15 by the sputter method.

Then, a TiN layer and a $SiO_2$ layer are formed in sequence as a hard mask 17 on the second conductive layer 16. The TiN layer is formed by the sputter, and the $SiO_2$ layer is formed by the CVD method using TEOS. The hard masks 17 are patterned into the capacitor planar shape over the oxygen-barrier metal layers 11 and their peripheries by the photolithography method.

Then, the second conductive layer 16, the ferroelectric layer 15, and the first conductive layer 14 in the region that is not covered with the hard masks 17 are etched sequentially. Thus, the capacitors Q are formed on the oxygen-barrier metal layers 11, the insulating adhesion layer 13, and the oxidation-preventing insulating layer 12. In this case, the second conductive layer 16, the ferroelectric layer 15, and the first conductive layer 14 are etched by the sputter reaction in the atmosphere containing a halogen element.

As shown in FIG. 2I, each of the capacitors Q consists of a lower electrode 14a made of the first conductive layer 14, a dielectric layer 15a made of the ferroelectric layer 15, and an upper electrode 16a made of the second conductive layer 16.

Two capacitors Q are formed over one well 1a. The lower electrodes 14a of the capacitors Q are connected electrically to the second or third n-type impurity diffusion region 5b, 5c via the second or third conductive plug 10b, 10c respectively.

In this case, if the insulating adhesion layer 13 is etched in forming the capacitors Q, the underlying oxidation-preventing insulating layer 12 functions as the etching stopper, and thus the first conductive plug 10a is never exposed.

The hard masks 17 are removed after patterns of the capacitors Q are formed.

Then, in order to recover the damage of the ferroelectric layer 15 caused by the etching, the recovery annealing of the capacitors Q is executed. The recovery annealing in this case is carried out at the substrate temperature of 650° C. for 60 minute in the furnace containing the oxygen, for example.

In this manner, when the annealing process such as the recovery annealing or the like is applied immediately after the patterning of the ferroelectric layer 15 is executed, the thermal resistance of the second and third conductive plugs 10b, 10c formed directly under the lower electrodes 14a is decided by the oxygen permeability of the oxygen-barrier metal layers 11 and also the oxidation resistance of the first conductive plug 10a not positioned directly under the lower electrodes 14a is decided by the oxygen permeability of the insulating adhesion layer 13 and the oxidation-preventing insulating layer 12.

Although the above-mentioned thermal processes are required to form the capacitors Q, the first conductive plug 10a made of tungsten is not abnormally oxidized in the condition of which the thickness of the silicon nitride layer used as the insulating adhesion layer 13 is set to 70 nm.

Also, assume that the iridium layer of 200 nm thickness is present on the second and third conductive plugs 10b, 10c made of tungsten, the second and third conductive plugs 10b, 10c are abnormally oxidized by the above oxygen annealing to cause the contact failure. Experimentally the thickness of the Ir layer as the oxygen-barrier metal layer 11 must be further increased by 100 nm to increase the annealing temperature by 100° C. For example, in order to form the tungsten plug, which can stand the thermal process, directly under the lower electrodes 14a, the oxygen-barrier metal layer made of Ir having a thickness of more than 400 nm must be formed. In this embodiment, a total thickness of the Ir layer, which consists of the iridium layer constituting the oxygen-barrier metal layers 11 and the iridium layer 14z constituting the first conductive layer 14, is set to 400 nm. Thus, the abnormal oxidation of the second and third conductive plugs 10b, 10c are prevented.

Then, as shown in FIG. 2J, alumina of 50 nm thickness is formed as a capacitor protection layer 18 on the capacitors Q and the insulating adhesion layer 13 by the sputter. This capacitor protection layer 18 protects the capacitors Q from the process damage, and may be formed of PZT in addition to alumina. Then, the capacitors Q are annealed at 650° C. for 60 minute in the oxygen atmosphere in the furnace.

Then, a silicon oxide ($SiO_2$) of about 1.0 µm thickness is formed as a second interlayer insulating layer 19 on the capacitor protection layer 18 by the plasma CVD method using the HDP (High Density Plasma) equipment.

Then, an upper surface of the second interlayer insulating layer 19 is planarized by the CMP method. In this example, a remaining thickness of the second interlayer insulating layer 19 after CMP is set to almost 300 nm on the upper electrodes 16a.

Then, as shown in FIG. 2K, the second interlayer insulating layer 19, the capacitor protection layer 18, the insulating adhesion layer 13, and the oxidation-preventing insulating layer 12 are etched by using a resist mask (not shown). Thus, a fourth contact hole 19a is formed on the first conductive plug 10a.

Then, as shown in FIG. 2L, a TiN layer of 50 nm thickness is formed as a glue layer 20a in the fourth contact hole 19a and on the second interlayer insulating layer 19 by the sputter method. Then, a tungsten layer 20b is grown on the glue layer 20a by the CVD method to bury perfectly the inside of the fourth contact hole 19a.

Then, as shown in FIG. 2M, the tungsten layer 20b and the glue layer 20a are polished by the CMP method to remove from an upper surface of the second interlayer insulating layer 19. Then, the tungsten layer 20b and the glue layer 20a left in the fourth contact hole 19a are used as a fourth conductive plug 21.

Accordingly, the fourth conductive plug 21 is connected to the first conductive plug 10a to form the via-to-via contact, and is connected electrically to the first impurity diffusion region 5a.

Then, the second interlayer insulating layer 19 is annealed at 350° C. for 120 second in the nitrogen plasma atmosphere.

Then, as shown in FIG. 2N, a $SiO_2$ layer of 100 nm thickness is formed as a second oxidation-preventing insulating layer 22 on the fourth conductive plug 21 and the second interlayer insulating layer 19 by the CVD method.

Then, holes 23 are formed on the upper electrodes 16a of the capacitors Q by patterning the second oxidation-preventing insulating layer 22, the second interlayer insulating layer 19, and the capacitor protection layer 18 by means of the photolithography method. The capacitors Q that are subjected to the damage by forming the holes 23 are recovered by the annealing. Such annealing is carried out at the substrate temperature of 550° C. for 60 minute in the oxygen-containing atmosphere, for example.

Next, steps required until a structure shown in FIG. 2O is formed will be explained hereunder.

First, the second oxidation-preventing insulating layer 22 formed on the second interlayer insulating layer 19 is removed by the etching-back. Thus, a surface of the fourth conductive plug 21 is exposed.

Then, a multi-layered metal layer is formed in the holes 23 on the upper electrodes 16a of the capacitors Q and on the second interlayer insulating layer 19. As the multi-layered metal layer, a Ti layer of 60 nm thickness, a TiN layer of 30 nm thickness, an Al—Cu layer of 400 nm thickness, a Ti layer of 5 nm thickness, and a TiN layer of 70 nm thickness are formed sequentially.

Then, a conductive pad 24a, which is connected to the fourth conductive plug 21, and first-layer metal wirings 24b, 24c, which are connected to the upper electrodes 16a via the holes 23, are formed by patterning the multi-layered metal layer.

In this case, in order to prevent the reduction of the pattern precision by the reflection of the exposure light upon patterning of the multi-layered metal layer, the method of forming a reflection preventing layer (not shown) made of silicon oxide nitride (SiON), or the like on the multi-layered metal layer to have a thickness of 30 nm, then forming resist patterns such as wiring shapes, etc. by coating a resist on the reflection preventing layer and exposing/developing the resist, and then etching the multi-layered metal layer by using the resist patterns is employed. The reflection preventing layer may be left as it is after the patterning of the multi-layered metal layer.

Then, a third interlayer insulating layer 25 is formed on the second interlayer insulating layer 19, the first-layer metal wirings 24b, 24c, and the conductive pad 24a.

Then, a bit-line contact hole 25a is formed on the conductive pad 24a by patterning the third interlayer insulating layer 25. Also, a fifth conductive plug 26 made of a TiN layer and a W layer sequentially from the bottom is formed in the hole 25a.

Then, a second-layer metal wiring containing a bit line 27 is formed on the third interlayer insulating layer 25. The bit line 27 has the multi-layered metal structure, like the first-layer metal wirings 24b, 24c. Also, when the bit line 27 is connected to the fifth conductive plug 26, such bit line 27 is connected electrically to the first n-type impurity diffusion region 5a via the conductive pad 24a, the fourth conductive plug 21, and the first conductive plug 10a.

Then, an insulating layer for covering the second-layer metal wiring, etc. are formed, and finally a cover layer made of a TEOS material silicon oxide layer and a silicon nitride layer is formed. But their details will be omitted herein.

In the above embodiment, under the lower electrodes 14a constituting the capacitors Q, the second and third conductive plugs 10b, 10c are covered with the oxygen-barrier metal layer 11 and also the first conductive plug 10a and the first interlayer insulating layer 8, which are connected to the bit line 27, are covered with the oxidation-preventing insulating layer 12. Hence, in the crystallization annealing and the recovery annealing of the ferroelectric layer 15, the abnormal oxidation of the first conductive plug 10a is prevented by the oxidation-preventing insulating layer 12 and also the abnormal oxidation of the second and third conductive plugs 10b, 10c are prevented by the oxygen-barrier metal layer 11. Also, since the oxidation-preventing insulating layer 12 still covers the first conductive plug 10a until the fourth contact hole 19a is formed, the first conductive plug 10a is never oxidized by the annealing applied in the formation of the capacitors Q and later steps. In addition, in the case that the second interlayer insulating layer 19 is formed over the first conductive plug 10a, the first conductive plug 10a is prevented from being oxidized since the first conductive plug 10a is covered with the oxidation-preventing insulating layer 12.

In addition, patterned side surfaces of the oxygen-barrier metal layer 11 are covered with the oxidation-preventing insulating layer 12. Therefore, if the size of the oxygen-barrier metal layer 11 is formed substantially identically to the second and third conductive plugs 10b, 10c, the oxygen is prevented from entering into the oxygen-barrier metal layer 11 from the side and thus the abnormal oxidation of the second and third conductive plugs 10b, 10c is never caused.

The oxygen-barrier metal layer 11 formed on the second and third conductive plugs 10b, 10c respectively functions as a stopper when the oxidation-preventing insulating layer 12 and the insulating adhesion layer 13 are polished by the CMP method. As a result, upper surfaces of the oxygen-barrier metal layer 11, the oxidation-preventing insulating layer 12, and the insulating adhesion layer 13 are made flat, and thus degradation of the crystal of the ferroelectric layer 15 formed on the first conductive layer 14 is prevented.

Figure 1A:
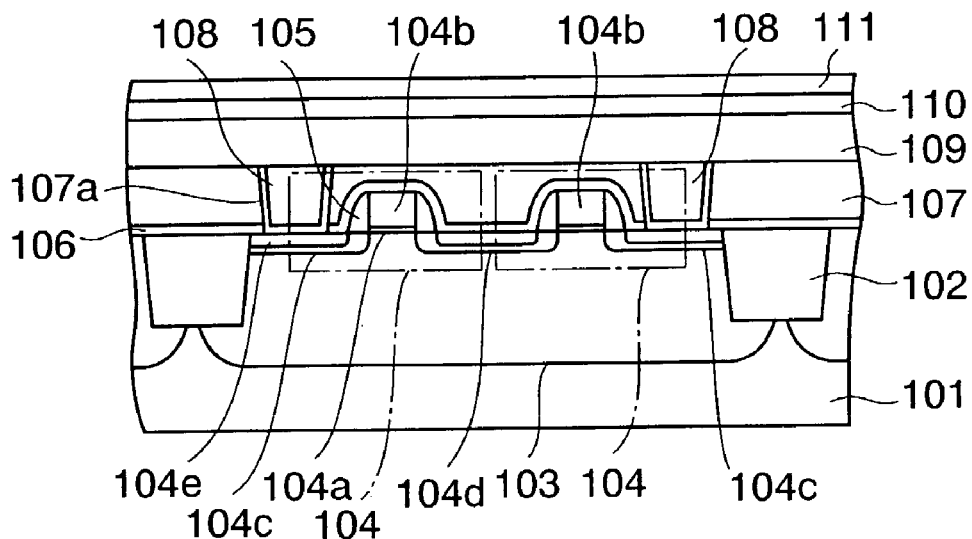
FIGS. 1A to 1D are sectional views showing steps of forming the semiconductor device in the prior art.
Figure 1B:
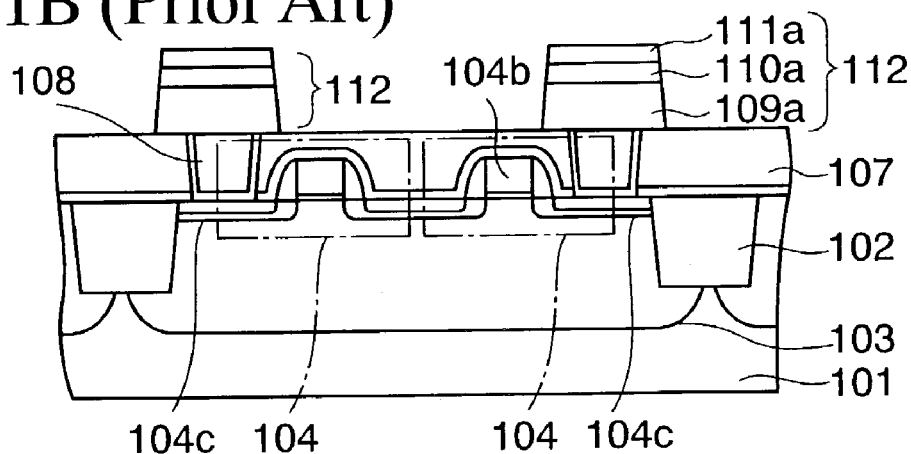
Figure 1C:
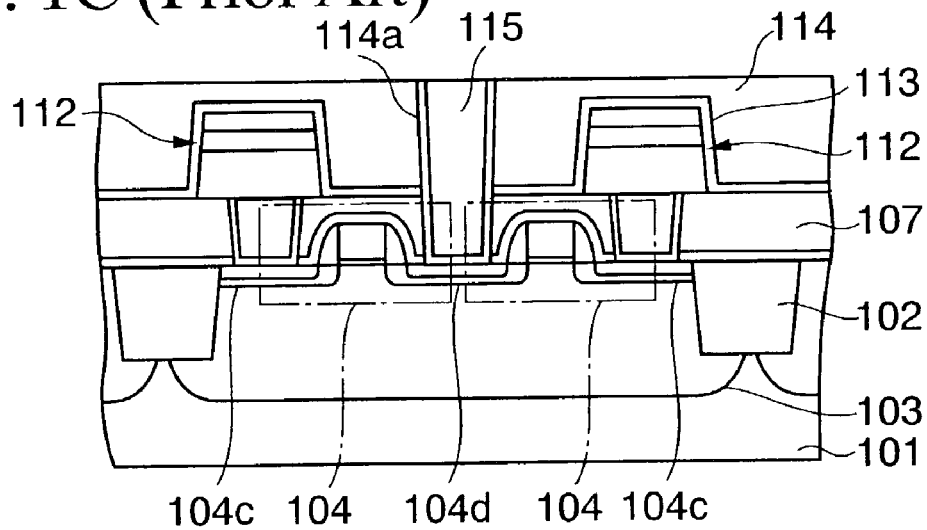
Figure 1D:
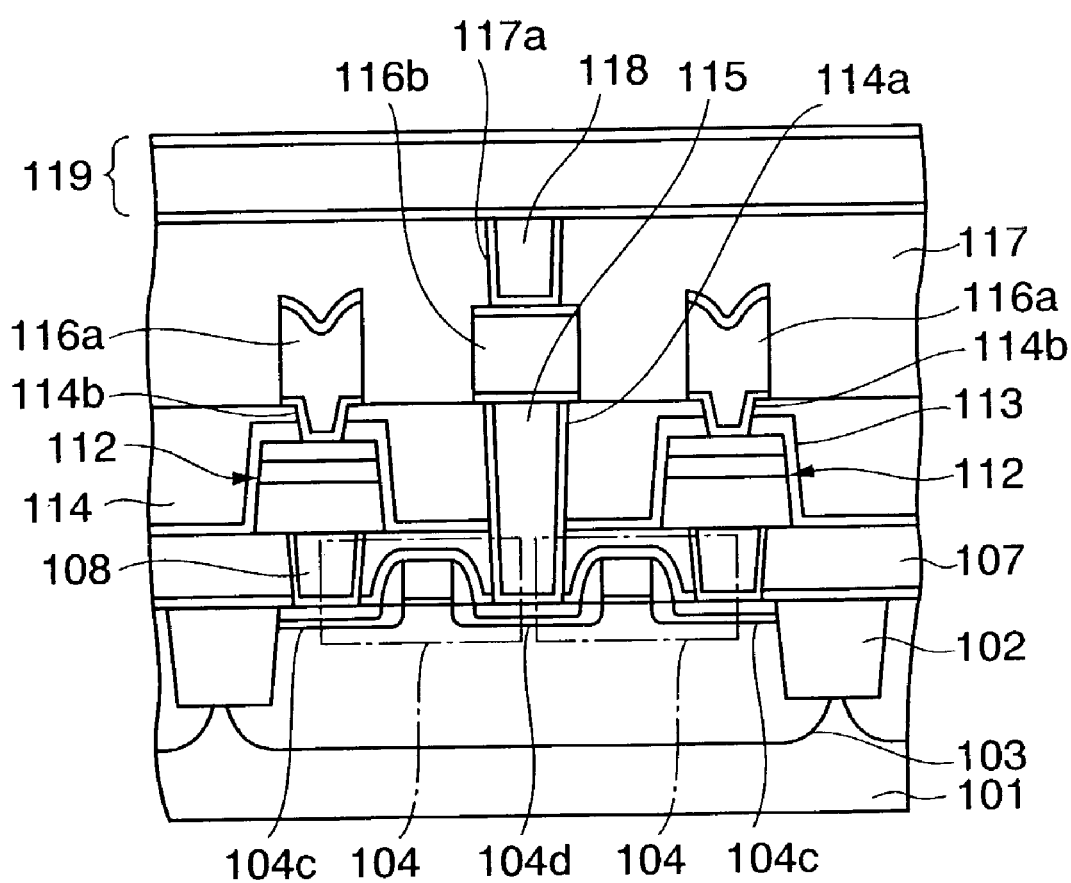

Also, since the FeRAM has level difference on the first interlayer insulating layer 8 by the ferroelectric capacitor rather than the normal logic product, it is possible that an aspect ratio of the contact hole from the first-layer metal wiring 24b to the first n-type impurity diffusion region 5a is increased. If it is tried to form this contact hole by the etching at one step like the prior art shown in FIGS. 1A to 1C, not only the etching itself becomes difficult but also the filling of the glue layer into the contact hole becomes severe. The up-to-date equipment is needed to eliminate such problem.

In contrast, like the present embodiment, the via-to-via contact is formed between the first n-type impurity diffusion region 5a and the contact pad 24a via two conductive plugs 21, 10a. As a result, not only yield of the FeRAM product can be increased but also the existing equipment can be still employed, so that there can be achieved such an advantage that reduction in the development cost and the step cost can be implemented.

Second Embodiment

In the first embodiment, the iridium layer formed on the second and third conductive plugs 10b, 10c as the oxygen-barrier metal layer 11 and the iridium layer 14w formed as the lowermost layer portion of the lower electrode 14a of the capacitor Q are formed by separate steps.

Therefore, in the present embodiment, a structure in which one of two iridium layers is omitted will be explained hereunder.

FIGS. 3A to 3I are sectional views showing steps of manufacturing a semiconductor device according to a second embodiment of the present invention.

Figure 3A:
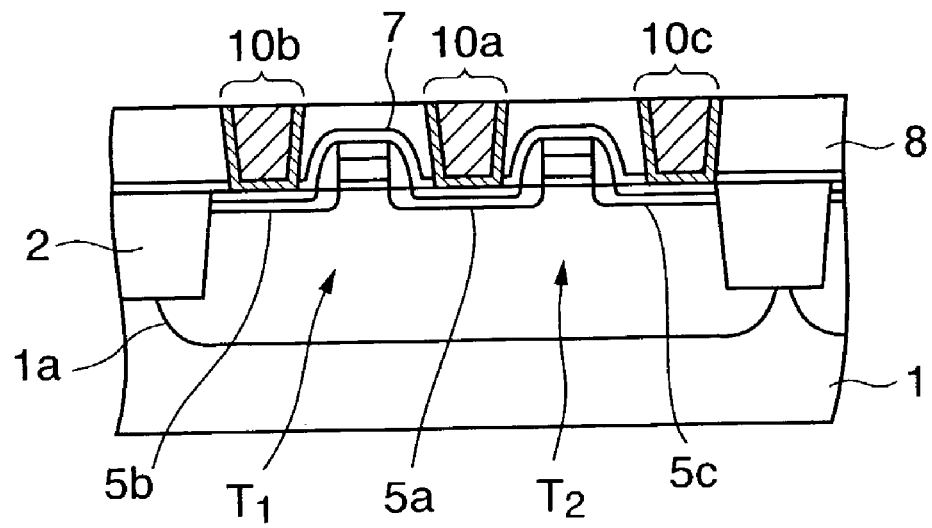
FIGS. 3A to 3I are sectional views showing steps of manufacturing a semiconductor device according to a second embodiment of the present invention.

First, as shown in FIG. 3A, in compliance with the steps shown in the first embodiment, the MOS transistors $T_1$, $T_2$ are formed on the silicon substrate 1 and then the cover layer 7, the first interlayer insulating layer 8, and the first to third conductive plugs 10a to 10c are formed.

Figure 3B:
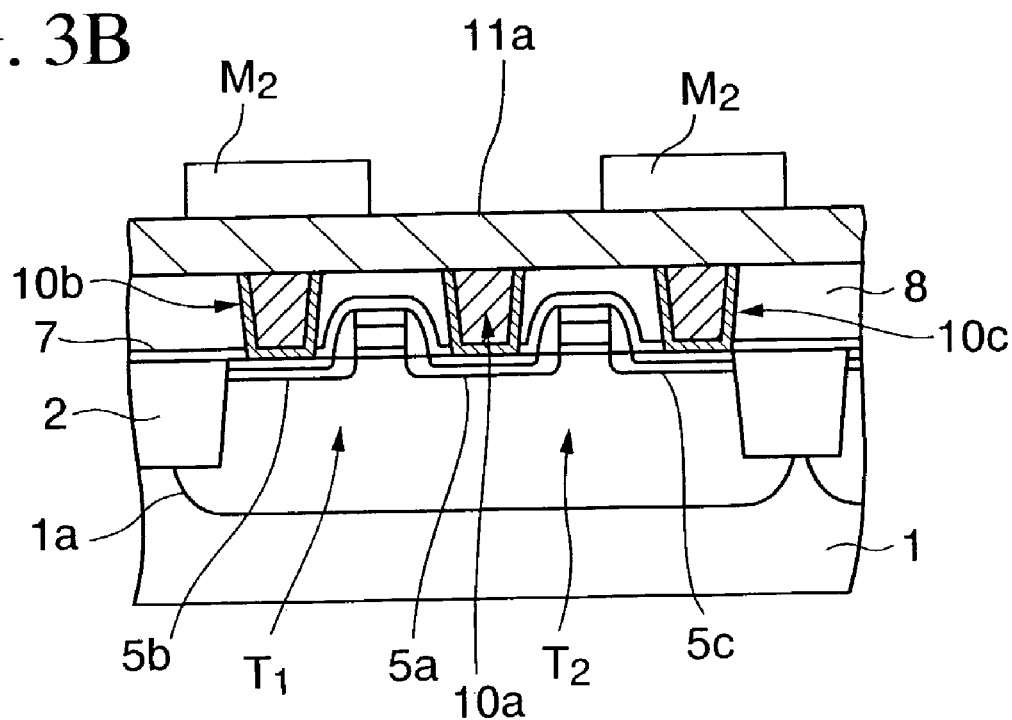

Then, as shown in FIG. 3B, the iridium layer is formed as a conductive oxygen-barrier metal layer 11a on the first to third conductive plugs 10a to 10c and the first interlayer insulating layer 8 by the sputter. The oxygen-barrier metal layer 11a constitutes a part of the lower electrode of the capacitor Q, as described later.

The iridium layer acting as the oxygen-barrier metal layer 11a is formed to have a thickness enough to prevent the abnormal oxidation of the first to third conductive plugs 10a to 10c. For instance, in order to prevent the abnormal oxidation of the first to third conductive plugs 10a to 10c in the annealing at the substrate temperature of 550° C. in the oxygen-containing atmosphere, such iridium layer is formed to have a thickness of 200 nm, for example, and also is formed to add the thickness by 100 nm every time when the substrate temperature is increased by 100° C. In other words, when the iridium layer has the thickness of 400 nm, the iridium layer can prevent the oxidation of the first to third conductive plugs 10a to 10c from the oxygen annealing at 750° C.

Then, masks $M_2$ are formed on the oxygen-barrier metal layer 11a over the second and third conductive plugs 10b, 10c and their peripheral areas. A planar shape of the mask $M_2$ is set equal to the shape of the lower electrode of the capacitor. As the mask $M_2$, a hard mask made of titanium nitride, silicon oxide, or the like may be employed.

Figure 3C:
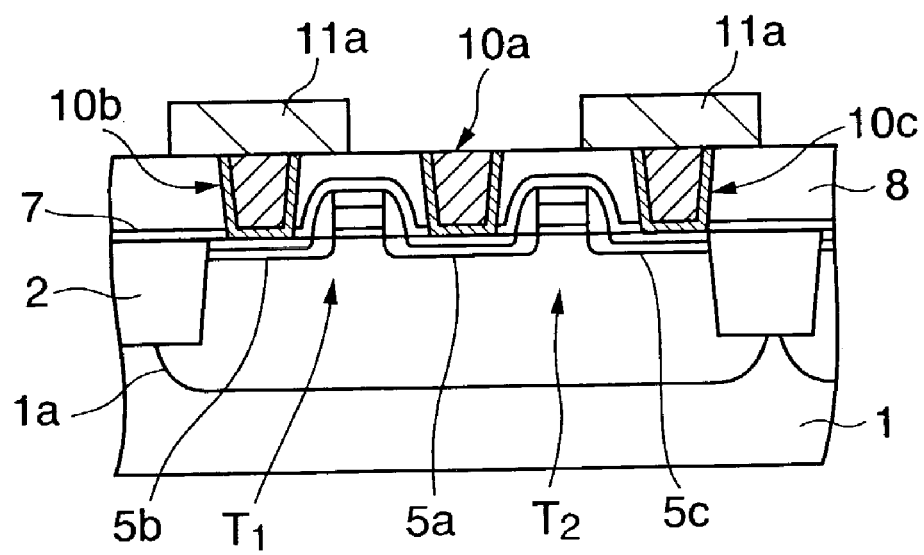

Then, as shown in FIG. 3C, the oxygen-barrier metal layer 11a in the region that is not covered with the masks $M_2$ is etched. Thus, the oxygen-barrier metal layer 11a is left on the second and third conductive plugs 10b, 10c and their peripheral areas to have a size of the capacitor. As the etching gas of the oxygen-barrier metal layer 11a, a halogen gas is used. Now, the first conductive plug 10a is exposed.

Then, the masks $M_2$ are removed.

Figure 3D:
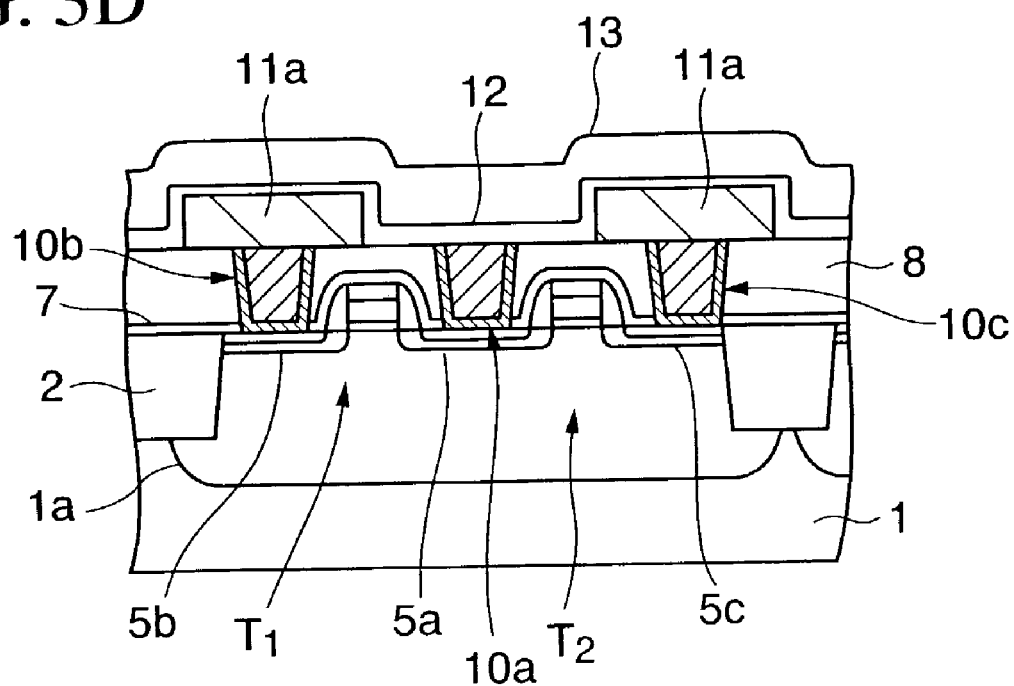

Then, as shown in FIG. 3D, the silicon oxide nitride (SiON) layer or the silicon nitride ($Si_3N_4$) layer of 100 nm thickness, for example, is formed as the oxidation-preventing insulating layer 12 on the first conductive plug 10a, the oxygen-barrier metal layer 11a, and the first interlayer insulating layer 8 by the CVD method. Then, the silicon oxide ($SiO_2$) layer of 300 nm thickness, for example, is formed as the insulating adhesion layer 13 on the oxidation-preventing insulating layer 12 by the CVD method using TEOS, for example.

Figure 3E:
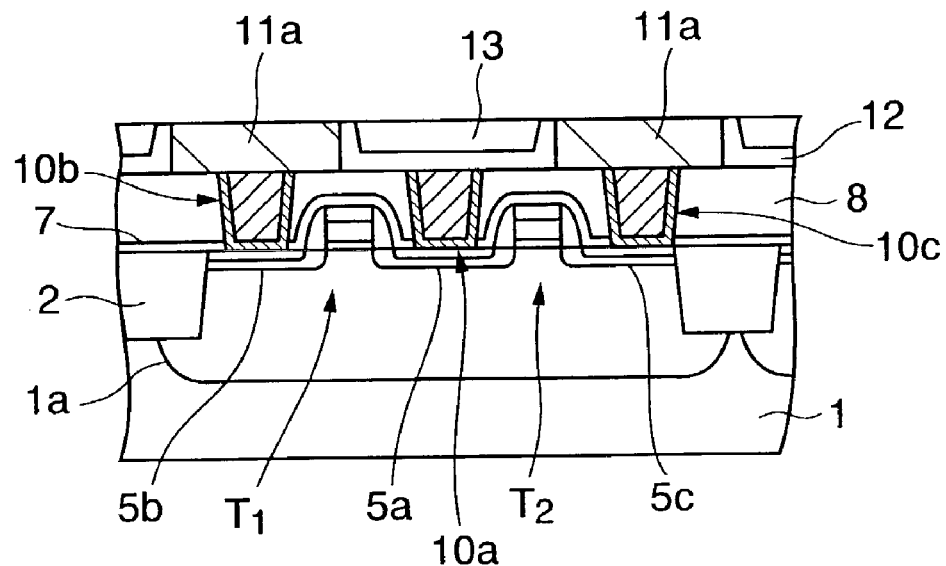

Then, as shown in FIG. 3E, an upper surface of the oxygen-barrier metal layer 11a is exposed by polishing the insulating adhesion layer 13 and the oxidation-preventing insulating layer 12 by means of the CMP method while causing the oxygen-barrier metal layer 11a to function as the stopper layer. In this case, upper surfaces of the oxygen-barrier metal layer 11a, the insulating adhesion layer 13, and the oxidation-preventing insulating layer 12 are made flat by the CMP method.

Figure 3F:
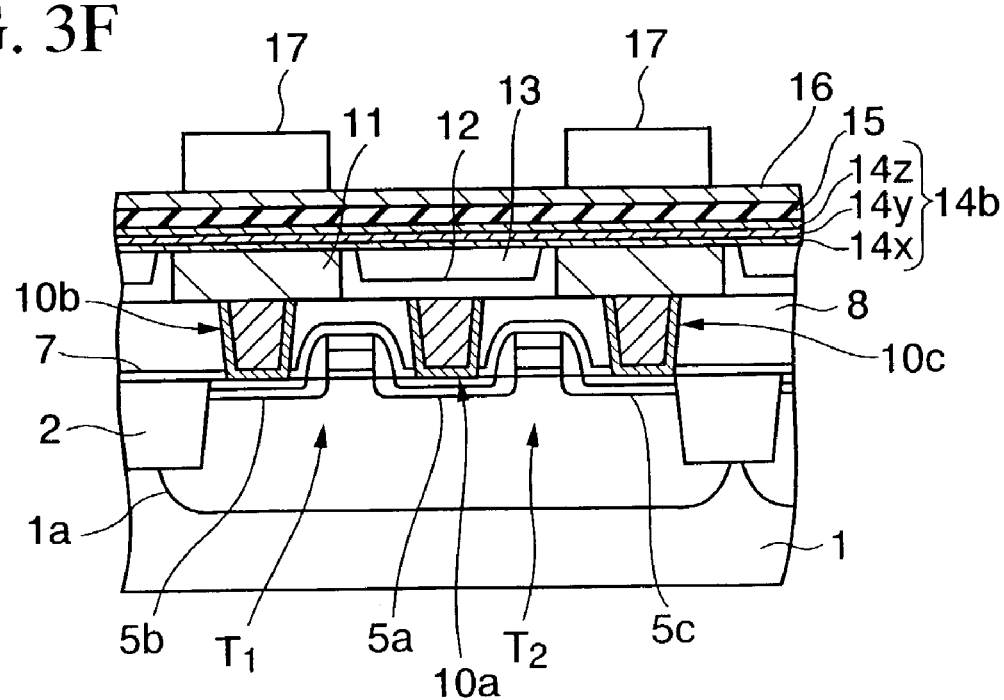

Then, as shown in FIG. 3F, a $IrO_2$ layer 14x of 30 nm thickness, a PtO layer 14y of 30 nm thickness, and a Pt layer 14z of 50 nm thickness, for example, are formed in sequence as a first conductive layer 14b on the oxygen-barrier metal layer 11a, the oxidation-preventing insulating layer 12, and the insulating adhesion layer 13 by the sputter.

In this case, the insulating adhesion layer 13 is annealed to prevent the peeling-off of the layer, for example, before or after the first conductive layer 14b is formed. As the annealing method, RTA (Rapid Thermal Annealing) executed at 750° C. for 60 second in the argon atmosphere, for example, may be employed.

Then, the PZT layer of 200 nm thickness, for example, is formed as the ferroelectric layer 15 on the first conductive layer 14b by the sputter method. As the method of forming the ferroelectric layer 15, there are the MOD method, the MOCVD method, the sol-gel method, etc. in addition to this. Also, as the material of the ferroelectric layer 15, other PZT material such as PLCSZT, PLZT, etc., the Bi-layered structure compound material such as $SrBi_2Ta_2O_9$, $SrBi_2(Ta,Nb)_2O_9$, etc., and other metal oxide ferroelectric substance may be employed in addition to PZT.

Then, the ferroelectric layer 15 is annealed in the oxygen-containing atmosphere to crystallize. As such annealing, two-step RTA process having the first step that is executed at the substrate temperature of 600° C. for 90 second in the mixed-gas atmosphere consisting of Ar and $O_2$ and the second step that is executed at the substrate temperature of 750° C. for 60 second in the oxygen atmosphere, for example, is employed.

Then, the $IrO_2$ layer of 200 nm thickness, for example, is formed as the second conductive layer 16 on the ferroelectric layer 15 by the sputter method.

Then, the TiN layer and the $SiO_2$ layer are formed in sequence as the hard mask 17 on the second conductive layer 16. The TiN layer is formed by the sputter, and the $SiO_2$ layer is formed by the CVD method using TEOS. The hard masks 17 are patterned into the planar shape, which is almost same as the oxygen-barrier metal layers 11a, over the second and third conductive plugs 10b, 10c.

Then, the second conductive layer 16, the ferroelectric layer 15, and the first conductive layer 14b in the region that is not covered with the hard masks 17 are etched sequentially. In this case, the second conductive layer 16, the ferroelectric layer 15, and the first conductive layer 14b are etched by the sputter reaction in the atmosphere containing the halogen element. Here, since the oxidation-preventing insulating layer 12 functions as the etching stopper even after the insulating adhesion layer 13 is etched by such etching, the first conductive plug is never exposed.

Figure 3G:
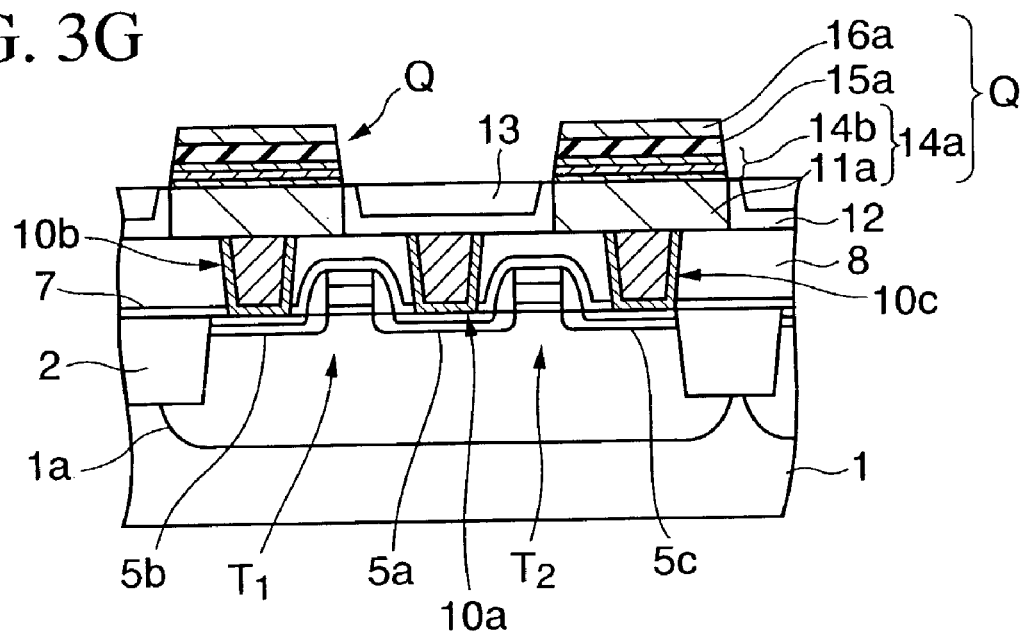

According to the above, as shown in FIG. 3G, the capacitors Q are formed on the first interlayer insulating layer 8. The lower electrode 14a of the capacitor Q is made of the first conductive layer 14b and the oxygen-barrier metal layers 11a. Also, the dielectric layer 15a of the capacitor Q is made of the ferroelectric layer 15. Also, the upper electrode 16a of the capacitor Q is made of the second conductive layer 16.

Two capacitors Q are arranged over one well 1a. These lower electrodes 14a are connected electrically to the second or third n-type impurity diffusion region 5b, 5c via the second or third conductive plug 10b, 10c respectively.

In this case, since a layer thickness of the first conductive layer 14b to be etched is thin rather than the first conductive layer 14 in the first embodiment, the hard masks 17 can be formed thinner than the first embodiment.

The hard masks 17 are removed after patterns of the capacitors Q are formed.

Then, in order to recover the damage of the ferroelectric layer 15 caused by the etching, the recovery annealing of the capacitors Q is executed. The recovery annealing in this case is carried out at the substrate temperature of 650° C. for 60 minute in the furnace containing the oxygen, for example.

In this manner, when the annealing process such as the recovery annealing or the like is applied immediately after the patterning of the ferroelectric layer 15 is executed, the thermal resistance of the second and third conductive plugs 10b, 10c formed directly under the lower electrodes 14a is decided by the oxygen permeability of the oxygen-barrier metal layers 11a, and also the oxidation resistance of the first conductive plug 10a not positioned directly under the lower electrodes 14a is decided by the oxygen permeability of the insulating adhesion layer 13 and the oxidation-preventing insulating layer 12.

Although the above thermal processes are required to form the capacitors Q, the first conductive plug 10a made of tungsten is not abnormally oxidized by condition of which the thickness of the silicon nitride layer used as the insulating adhesion layer 13 is set to 70 nm.

Also, in the condition of the iridium layer of 400 nm thickness formed on the second and third conductive plugs 10b, 10c made of tungsten, the abnormal oxidation of the second and third conductive plugs 10b, 10c is not caused by the oxygen annealing.

Figure 3H:
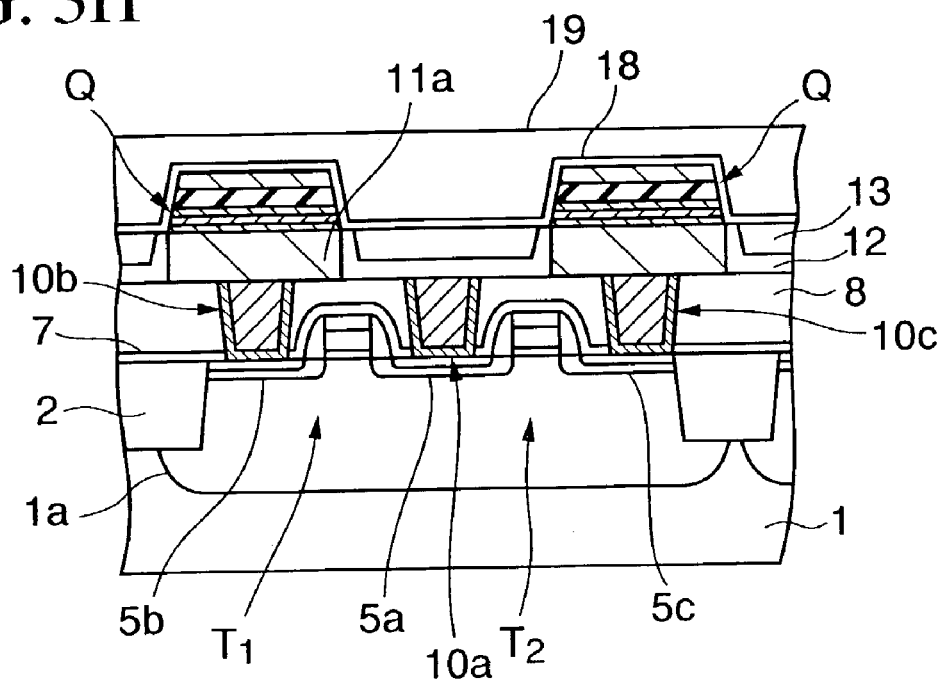

Then, as shown in FIG. 3H, the alumina of 50 nm thickness is formed as the capacitor protection layer 18 on the capacitors Q, the oxidation-preventing insulating layer 12, and the insulating adhesion layer 13 by the sputter. This capacitor protection layer 18 protects the capacitors Q from the process damage, and may be formed of PZT in addition to the alumina. Then, the capacitors Q are annealed at 650° C. for 60 minute in the oxygen atmosphere in the furnace.

Figure 3I:
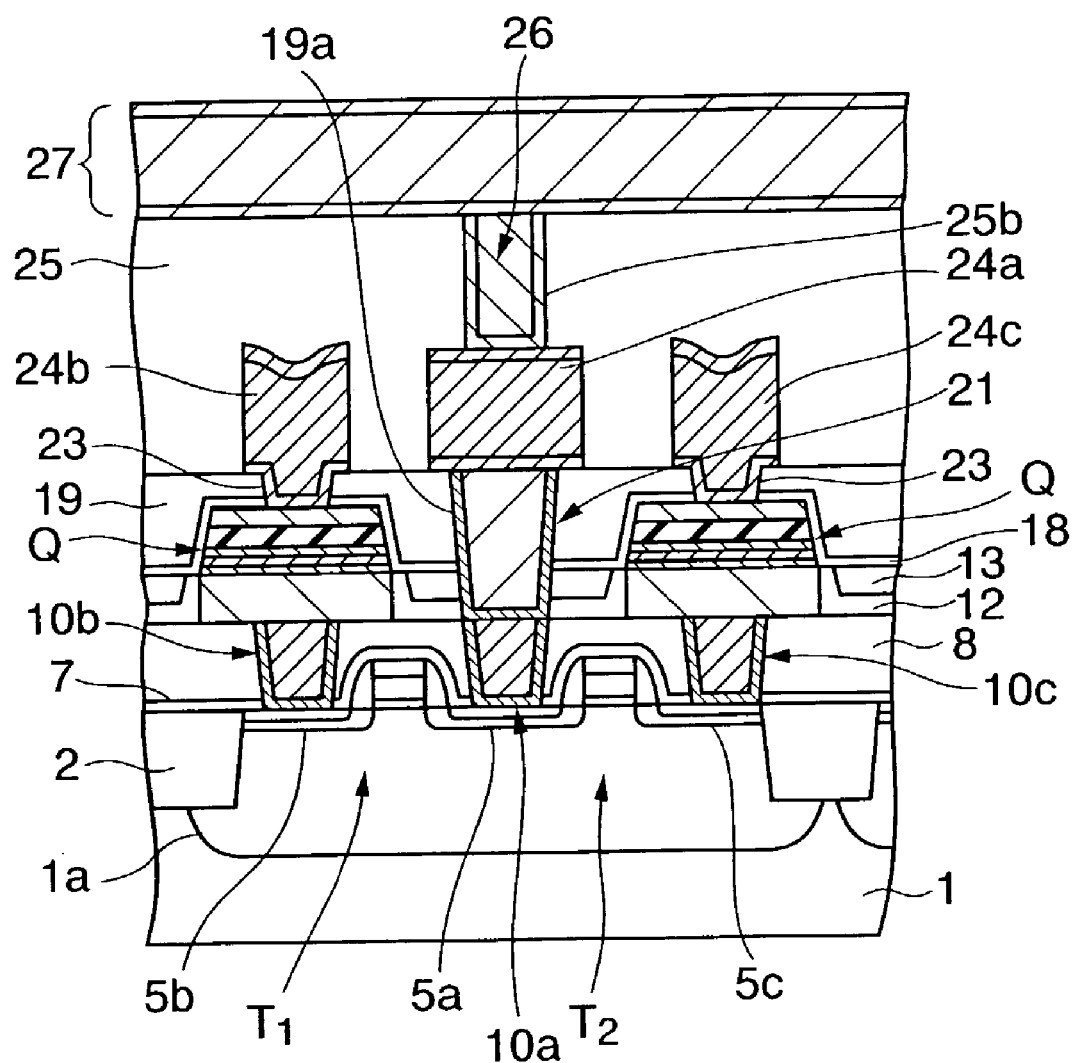

Then, as shown in FIG. 3I, in compliance with the steps shown in the first embodiment, the fourth conductive plug 21, the conductive pad 24a, the first-layer metal wirings 24b, 24c, the third interlayer insulating layer 25, the fifth conductive plug 26, the bit line 27, etc. are formed.

As described above, in the present embodiment, the oxygen-barrier metal layer 11a constituting the lowermost layer of the lower electrodes 14a of the capacitors Q is formed previously over the second and third conductive plugs 10b, 10c to have the lower electrode shape, then the oxidation-preventing insulating layer 12 and the insulating adhesion layer 13 are formed, then the oxygen-barrier metal layer 11a is exposed by polishing the oxidation-preventing insulating layer 12 and the insulating adhesion layer 13 by virtue of the CMP method, and then remaining metal layers of the lower electrodes 14a are formed on the oxygen-barrier metal layers 11a. Here, the iridium layer, for example, is formed as the oxygen-barrier metal and lower electrode.

In the first embodiment, the iridium layers constituting the oxygen-barrier metal layer and the lower electrode respectively are formed by separate steps and patterned separately. In the present embodiment, the iridium layer is formed by one layer forming step and one patterning step, and therefore there is such a merit that a part of steps of forming the lower electrodes can be reduced.

By the way, like the first embodiment, in the crystallization annealing of the ferroelectric layer 15 and the recovery annealing after the formation of the capacitors Q, the abnormal oxidation of the second and third conductive plugs 10b, 10c is prevented by the oxygen-barrier metal layers 11a and also the abnormal oxidation of the first conductive plug 10a is prevented by the oxidation-preventing insulating layer 12.

In addition, since upper surfaces of the oxygen-barrier metal layers 11a, the oxidation-preventing insulating layer 12, and the insulating adhesion layer 13 are planarized by the CMP method, the first conductive layer 14b formed on the oxygen-barrier metal layers 11a, the oxidation-preventing insulating layer 12, and the insulating adhesion layer 13 becomes flat in the neighborhood of the oxygen-barrier metal layers 11a. Thus, degradation of the crystal of the ferroelectric layer 15 formed on the first conductive layer 14b is prevented.

Also, the conductive plugs 10a, 21 for the bit-line contact are formed separately in the first interlayer insulating layer 8 and the second interlayer insulating layer 19. As a result, not only the yield of the FeRAM product can be increased but also the existing equipment can be still employed, so that there can be achieved such an advantage that reduction in the development cost and the step cost can be implemented.

In this case, if the oxidation-preventing insulating layer 12 is formed thicker than the oxygen-barrier metal layers 11a, the insulating adhesion layer 13 may be omitted.

Third Embodiment

In the lower electrodes 14a of the capacitors Q formed in accordance with the steps shown in the second embodiment, the peeling-off of the IrO layer 14x from the oxygen-barrier metal layer 11a rarely occurs.

Therefore, a structure for preventing the peeling-off of the IrO layer 14x from the oxygen-barrier metal layer 11a without fail in the multi-layered structure, which constitutes the lower electrodes 14a of the capacitors Q, and a method of forming the same will be explained hereunder.

FIGS. 4A to 4E are sectional views showing steps of manufacturing a semiconductor device according to a third embodiment of the present invention.

Figure 4A:
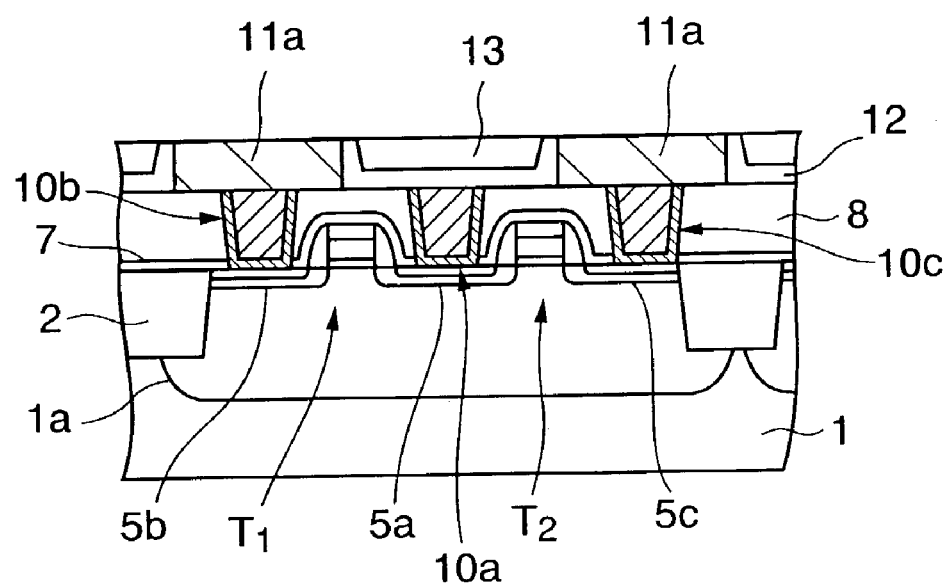
FIGS. 4A to 4E are sectional views showing steps of manufacturing a semiconductor device according to a third embodiment of the present invention.

First, as shown in FIG. 4A, in compliance with the steps shown in the first embodiment, the MOS transistors $T_1$, $T_2$ are formed on the silicon substrate 1 and then the cover layer 7, the first interlayer insulating layer 8, and the first to third conductive plugs 10a to 10c are formed. Then, in compliance with the steps shown in the second embodiment, the oxygen-barrier metal layers 11a each having the same size as the lower electrode of the capacitor Q are formed on the first to third conductive plugs 10a to 10c and their peripheral areas. The oxygen-barrier metal layer 11a is the iridium layer having a thickness of 400 nm, for example. Then, the oxidation-preventing insulating layer 12 and the insulating adhesion layer 13 are formed in sequence on the first conductive plug 10a, the oxygen-barrier metal layers 11a, and the first interlayer insulating layer 8. Then, the oxidation-preventing insulating layer 12 and the insulating adhesion layer 13 are polished by the CMP method to expose the upper surface of the oxygen-barrier metal layers 11a.

Figure 4B:
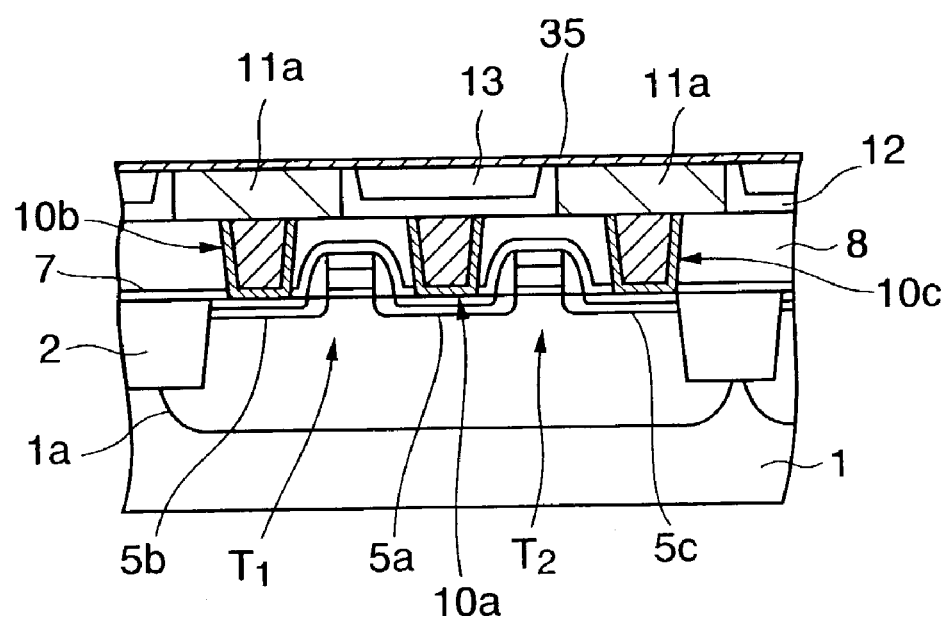

Then, as shown in FIG. 4B, a conductive adhesion layer 35 is formed on the oxygen-barrier metal layers 11a, the oxidation-preventing insulating layer 12, and the insulating adhesion layer 13. As the conductive adhesion layer 35, an iridium layer of 10 to 50 nm thickness, for example 30 nm, is formed by the sputter.

In this case, the insulating adhesion layer 13 is annealed to prevent the peeling-off of the layer, for example, before or after the conductive adhesion layer 35 is formed. As the annealing method, the RTA executed at 750° C. for 60 second in the argon atmosphere, for example, may be employed.

Figure 4C:
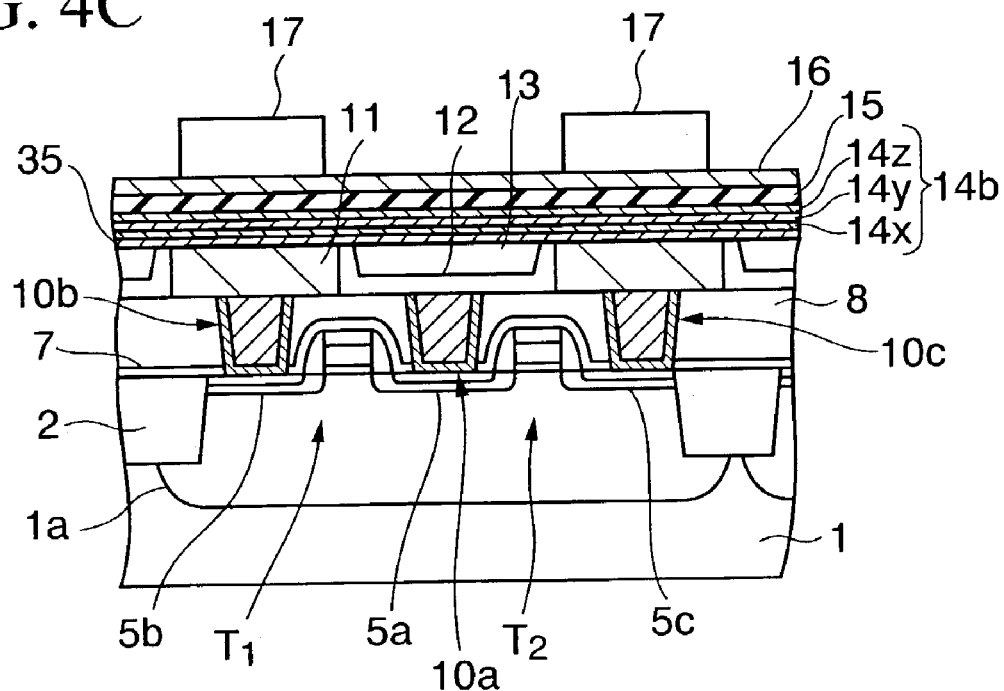

Then, as shown in FIG. 4C, the $IrO_2$ layer 14x of 30 nm thickness, the PtO layer 14y of 30 nm thickness, and the Pt layer 14z of 50 nm thickness, for example, are formed in sequence as the first conductive layer 14b on the conductive adhesion layer 35 by the sputter.

Then, the PZT layer of 180 nm thickness, for example, is formed as the ferroelectric layer 15 on the first conductive layer 14b by the sputter method or other method. Then, the ferroelectric layer 15 is annealed in the oxygen-containing atmosphere under the same conditions as the second embodiment to crystallize. Then, the $IrO_2$ of 200 nm thickness, for example, is formed as the second conductive layer 16 on the ferroelectric layer 15 by the sputter method.

Then, the hard masks 17 are formed on the second conductive layer 16 under the same conditions as the second embodiment.

Then, the second conductive layer 16, the ferroelectric layer 15, the first conductive layer 14b, and the conductive adhesion layer 35 in the region that is not covered with the hard masks 17 are etched sequentially. In this case, respective layers from the first conductive layer 14b to the conductive adhesion layer 35 are etched by the sputter reaction in the atmosphere containing the halogen element. Therefore, since the oxidation-preventing insulating layer 12 functions as the etching stopper even after the insulating adhesion layer 13 is etched by such etching, the first conductive plug is never exposed.

The hard masks 17 are removed after the patterns of the capacitors Q are formed.

Figure 4D:
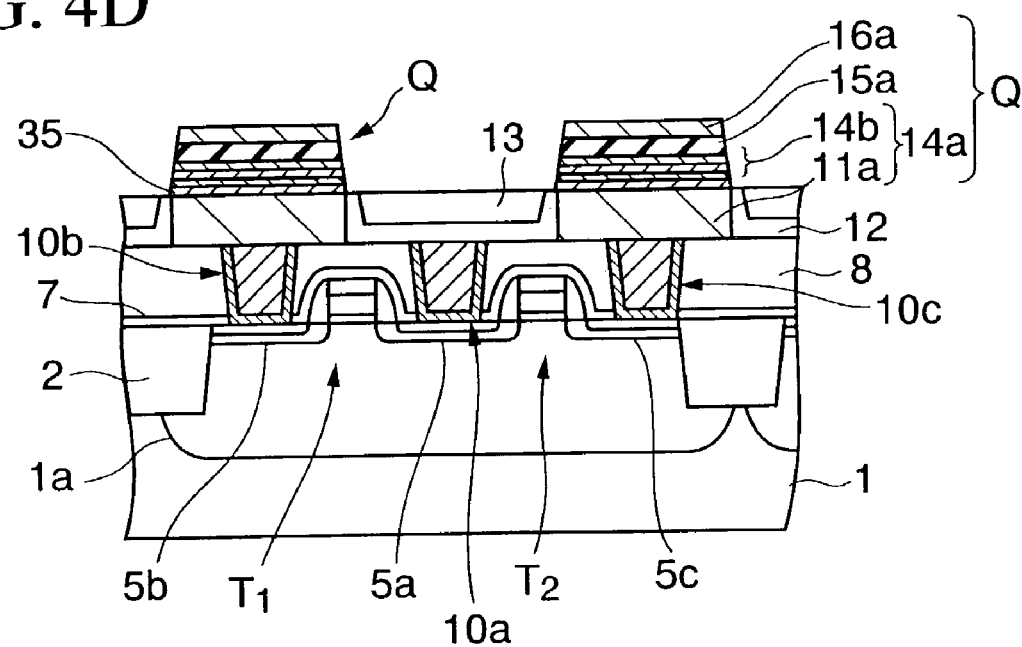

With the above, as shown in FIG. 4D, the capacitors Q are formed on the first interlayer insulating layer 8. The lower electrode 14a of the capacitor Q is made of the first conductive layer 14b, the conductive adhesion layer 35, and the oxygen-barrier metal layers 11a. Also, the dielectric layer 15a of the capacitor Q is made of the ferroelectric layer 15. Also, the upper electrode 16a of the capacitor Q is made of the second conductive layer 16.

Then, in order to recover the damage of the ferroelectric layer 15 caused by the etching, the recovery annealing of the capacitors Q is executed. The recovery annealing in this case is carried out at the substrate temperature of 650° C. for 60 minute in the furnace containing the oxygen, for example.

Figure 4E:
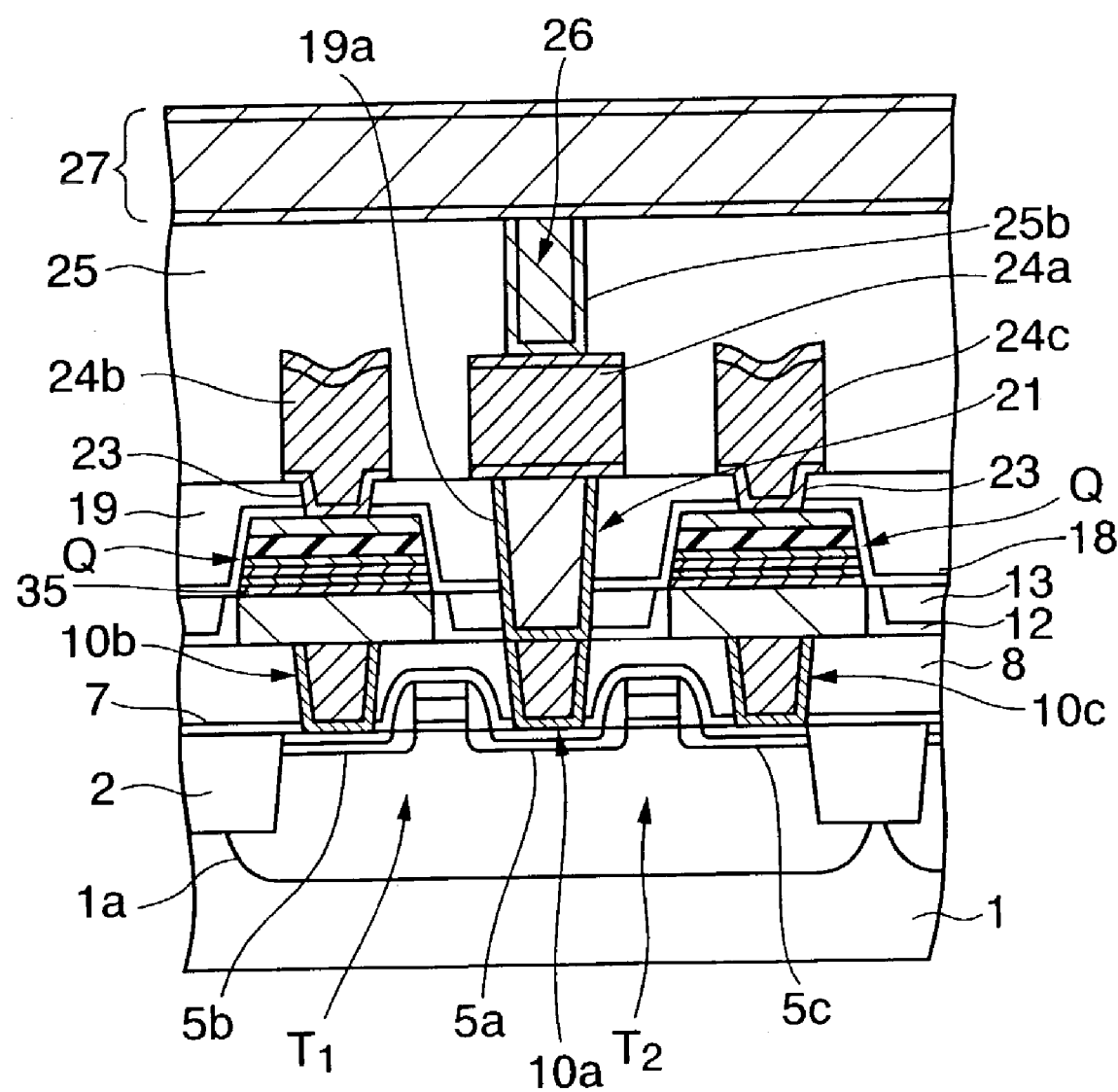

Then, as shown in FIG. 4E, in compliance with the same steps as the second embodiment, the capacitor protection layer 18, the second interlayer insulating layer 19, the fourth conductive plug 21, the conductive pad 24a, the first-layer metal wirings 24b, 24c, the third interlayer insulating layer 25, the fifth conductive plug 26, the bit line 27, etc. are formed. In this case, in FIG. 4E, the same reference symbols as those in FIG. 3I denote the same elements.

In the present embodiment described above, the upper surface of the oxygen-barrier metal layers 11a having the shape of the capacitors lower electrode is exposed by polishing the oxidation-preventing insulating layer 12 and the insulating adhesion layer 13, then the conductive adhesion layer 35 is formed on the oxygen-barrier metal layers 11a, the oxidation-preventing insulating layer 12, and the insulating adhesion layer 13, and then the first conductive layer 14b, the ferroelectric layer 15, and the second conductive layer 16 are formed sequentially on the conductive adhesion layer 35.

According to this, as shown in FIG. 4B, since the conductive adhesion layer 35 is interposed between the polished surface of the oxygen-barrier metal layers 11a and the first conductive layer 14b, the $IrO_2$ layer 14x constituting the first conductive layer 14b is prevented from peeling off from the oxygen-barrier metal layers 11a. Such prevention of the peeling-off has been checked based on the experiment.

It may be considered that, when the oxidation-preventing insulating layer 12 and the insulating adhesion layer 13 are polished, the surface of the oxygen-barrier metal layers 11a is altered in quality. If the conductive adhesion layer 35 is not formed, the oxygen-barrier metal layers 11a and the $IrO_2$ layer 14x are put in the state that they are easily peeled off because they are patterned into the almost same planar shape respectively.

In contrast, in the state of which the conductive adhesion layer 35 made of the same material as the oxygen-barrier metal layers 11a is formed on the oxygen-barrier metal layers 11a, such conductive adhesion layer 35 is formed to have good adhesiveness to the oxygen-barrier metal layers 11a and also the adhesiveness of the conductive adhesion layer 35, whose surface is not altered in quality, to the $IrO_2$ layer 14x is improved.

Therefore, according to the present embodiment, if the oxygen-barrier metal layers 11a is formed in the same size as the lower electrodes 14a of the capacitor Q, the lower electrodes 14a is never lifted up because of the peeling-off.

In this case, in the above embodiment, the conductive adhesion layer 35 is made of the same material as the oxygen-barrier metal layers 11a. But such conductive adhesion layer may be formed of other conductive material that has good adhesiveness to the oxygen-barrier metal layers 11a.

Fourth Embodiment

In the first and second embodiments, there is employed such a structure that the oxygen-barrier metal layers 11 or 11a is formed on the second or third conductive plug 10b, 10c formed directly under the capacitors Q and the oxidation-preventing insulating layer 12 is formed on the first conductive plug 10a.

In the present embodiment, to form the oxygen-barrier metal layer on not only the second and third conductive plugs 10b, 10c, which are formed directly under the capacitors Q, but also the first conductive plug 10a, which is not formed directly under the capacitors Q, will be explained hereunder.

FIGS. 5A to 5G are sectional views showing steps of manufacturing a semiconductor device according to a fourth embodiment of the present invention.

Figure 5A:
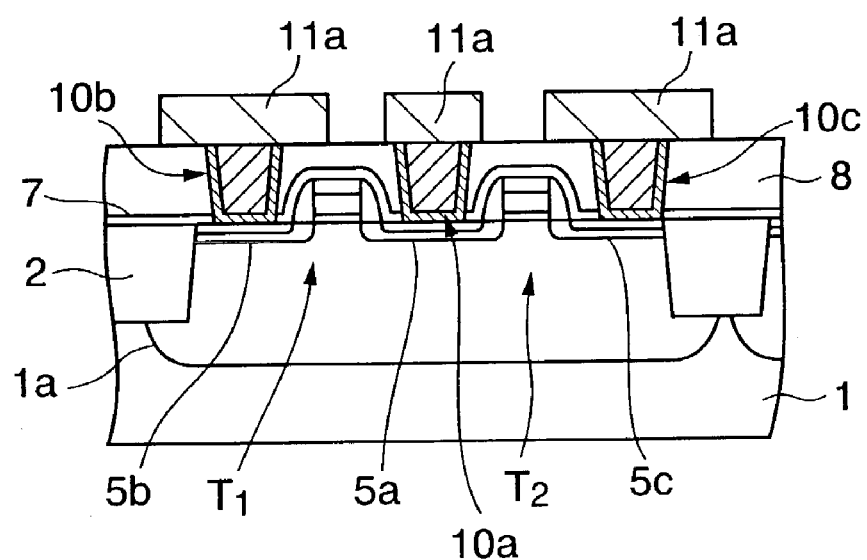
FIGS. 5A to 5G are sectional views showing steps of manufacturing a semiconductor device according to a fourth embodiment of the present invention.

First, steps required until a structure shown in FIG. 5A is formed will be explained hereunder.

Like the case shown in FIG. 3A, in compliance with the steps shown in the second embodiment, the MOS transistors $T_1$, $T_2$ are formed on the silicon substrate 1 and then the cover layer 7, the first interlayer insulating layer 8, and the first to third conductive plugs 10a to 10c are formed.

Then, as shown in FIG. 3B, the iridium layer of 400 nm thickness is formed as the conductive oxygen-barrier metal layer 11a on the first to third conductive plugs 10a to 10c and the first interlayer insulating layer 8 by the sputter. The oxygen-barrier metal layer 11a constitutes a part of the lower electrode of the capacitor Q, as described later.

Then, the masks (not shown) are formed on the oxygen-barrier metal layer 11a over the first, second and third conductive plugs 10a, 10b, 10c and their peripheral areas respectively. It is preferable that, like the second embodiment, the hard mask should be employed as the mask.

Then, the oxygen-barrier metal layer 11a is left on the first, second, and third conductive plugs 10a, 10b, 10c and their peripheral areas respectively by etching the region of the oxygen-barrier metal layer 11a, which is not covered with the masks. Here, the oxygen-barrier metal layer 11a left on the second and third conductive plugs 10b, 10c is patterned into a size that is prevent the oxidation of the second and third conductive plugs 10b, 10c and act as the lower electrodes of the capacitors. Also, the oxygen-barrier metal layer 11a left on the first conductive plug 10a is patterned into an island-like shape that is prevent the oxidation of the first conductive plug 10a.

Figure 5B:
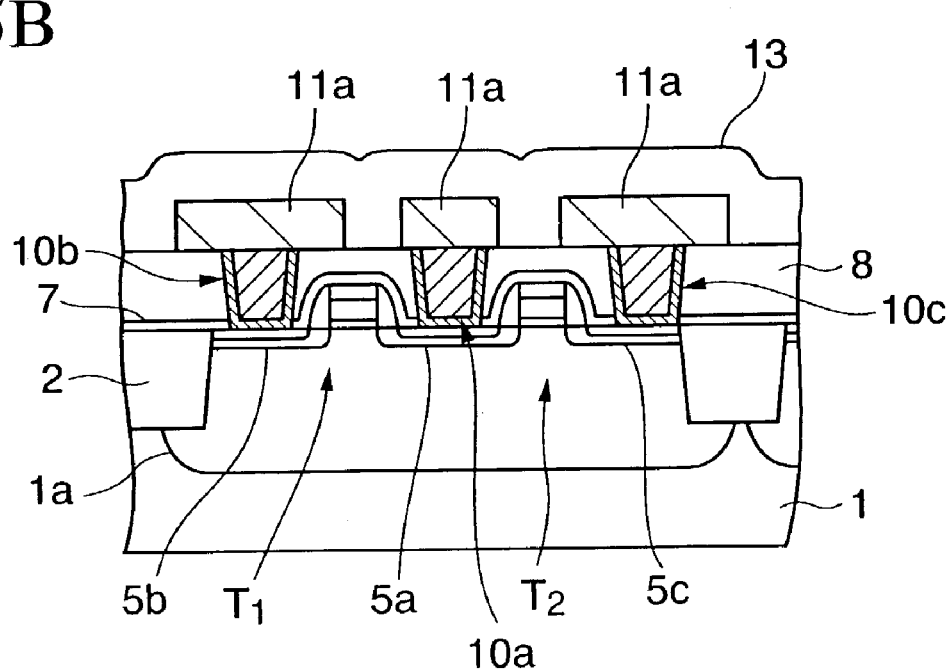

Then, as shown in FIG. 5B, the silicon oxide ($SiO_2$) layer of 300 nm thickness, for example, is formed as the insulating adhesion layer 13 on the oxygen-barrier metal layer 11a and the first interlayer insulating layer 8 by the CVD method using TEOS, for example. In this case, like the second embodiment, the oxidation-preventing insulating layer 12 may be formed under the insulating adhesion layer 13.

Figure 5C:
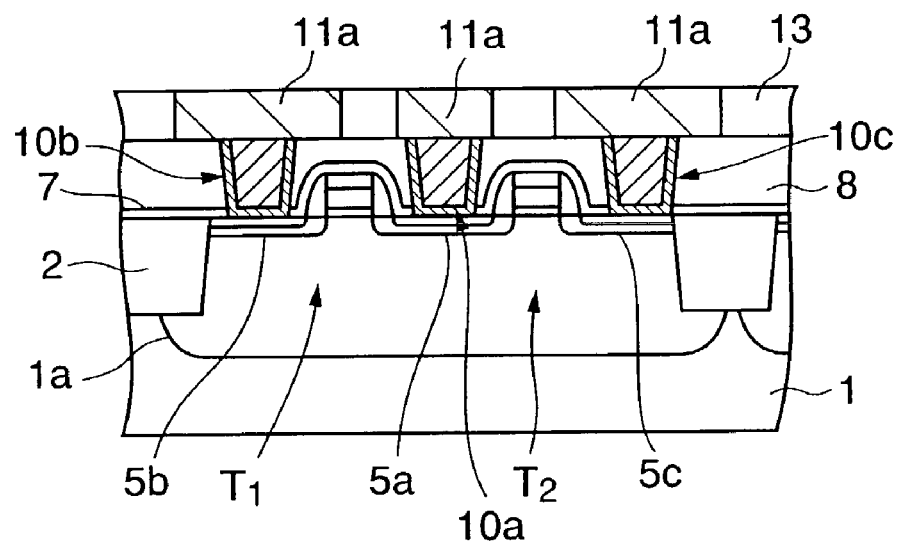

Then, as shown in FIG. 5C, the upper surface of the oxygen-barrier metal layer 11a is exposed by polishing the insulating adhesion layer 13 by means of the CMP method while causing the island-like oxygen-barrier metal layer 11a to function as the stopper layer. In this case, upper surfaces of the oxygen-barrier metal layer 11a and the insulating adhesion layer 13 are made flat by the CMP method.

Figure 5D:
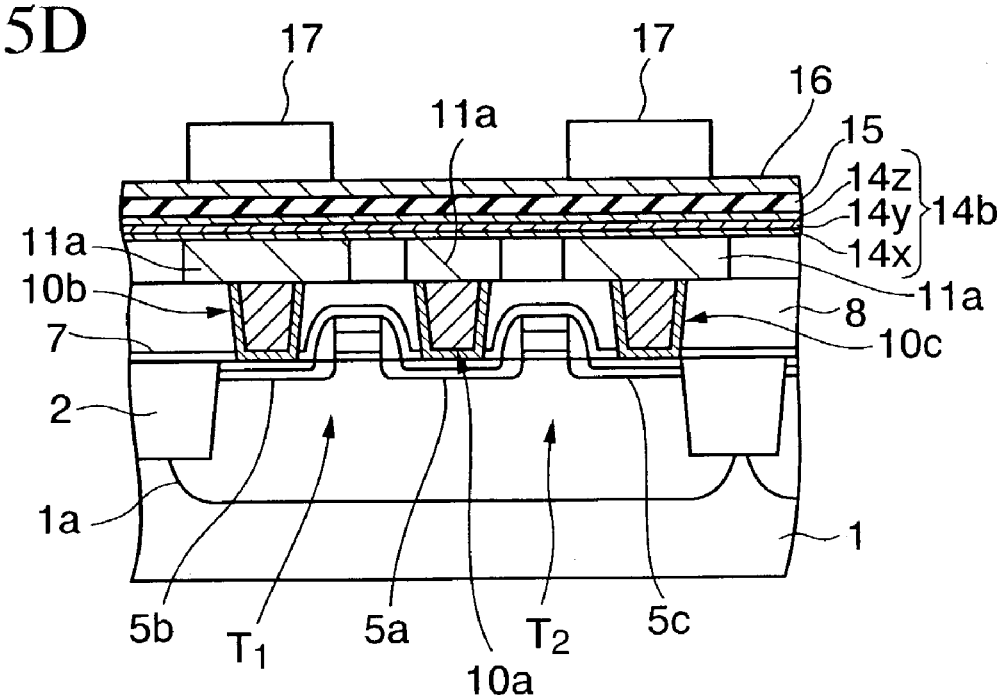

Then, as shown in FIG. 5D, the $IrO_2$ layer 14x of 30 nm thickness, the PtO layer 14y of 30 nm thickness, and the Pt layer 14z of 50 nm thickness, for example, are formed in sequence as the first conductive layer 14b on the oxygen-barrier metal layer 11a and the insulating adhesion layer 13 by the sputter.

In this case, the insulating adhesion layer 13 is annealed to prevent the peeling-off of the layer, for example, before or after the first conductive layer 14b is formed. As the annealing method, the RTA executed at 750° C. for 60 second in the argon atmosphere, for example, may be employed.

Then, the PZT layer of 200 nm thickness, for example, is formed as the ferroelectric layer 15 on the first conductive layer 14b by the similar method to that in the second embodiment. Then, the ferroelectric layer 15 annealed in the oxygen-containing atmosphere to crystallize. As such annealing, two-step RTA process having the first step that is executed at the substrate temperature of 600° C. for 90 second in the mixed-gas atmosphere consisting of Ar and $O_2$ and the second step that is executed at the substrate temperature of 750° C. for 60 second in the oxygen atmosphere, for example, is employed.

Then, the $IrO_2$ of 200 nm thickness, for example, is formed as the second conductive layer 16 on the ferroelectric layer 15 by the sputter method.

Then, the hard masks 17 having the same structure as the second embodiment are formed on the second conductive layer 16. The hard masks 17 are patterned into the planar shape, which is almost same as the oxygen-barrier metal layers 11a, over the second and third conductive plugs 10b, 10c by the photolithography method. The hard mask 17 has a double-layered structure consisting of titanium nitride and silicon oxide, for example.

Then, like the second embodiment, the second conductive layer 16, the ferroelectric layer 15, and the first conductive layer 14b in the region that is not covered with the hard masks 17 are etched sequentially. Then, the hard masks 17 are removed.

Figure 5E:
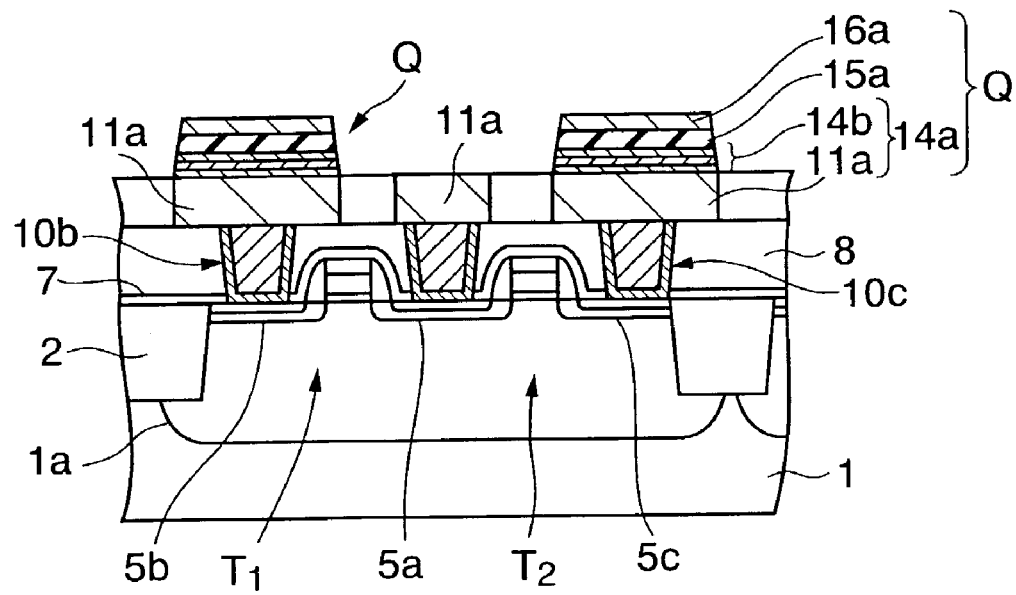

According to the above, as shown in FIG. 5E, the capacitors Q are formed on the first interlayer insulating layer 8. The lower electrode 14a of the capacitor Q is made of the first conductive layer 14b and the oxygen-barrier metal layers 11a. Also, the dielectric layer 15a of the capacitor Q is made of the ferroelectric layer 15. Also, the upper electrode 16a of the capacitor Q is made of the second conductive layer 16.

Two capacitors Q are arranged over one well 1a. These lower electrodes 14a are connected electrically to the second or third n-type impurity diffusion region 5b, 5c via the second or third conductive plug 10b, 10c respectively.

In this case, since the layer thickness of the first conductive layer 14b to be etched is thin rather than the first conductive layer 14 in the first embodiment, the hard masks 17 can also be formed thinner than the first embodiment.

Then, in order to recover the damage of the ferroelectric layer 15 caused by the etching, the recovery annealing is executed. The recovery annealing in this case is carried out at the substrate temperature of 650° C. for 60 minute in the furnace containing the oxygen, for example.

In this manner, when the annealing process such as the recovery annealing or the like is applied immediately after the patterning of the ferroelectric layer 15 is executed, the thermal resistance of the second and third conductive plugs 10b, 10c formed directly under the lower electrodes 14a and the oxidation resistance of the first conductive plug 10a not positioned directly under the lower electrodes 14a are decided by the oxygen permeability of the oxygen-barrier metal layers 11a respectively.

Although the above thermal processes are required to form the capacitors Q, the abnormal oxidization is not caused in the first to third conductive plugs 10a to 10c by the oxygen annealing in the condition of which the iridium layer of 400 nm, for example, is present as the oxygen-barrier metal layers 11a on the first to third conductive plugs 10a to 10c, which are made of tungsten, and their peripheral areas respectively.

Figure 5F:
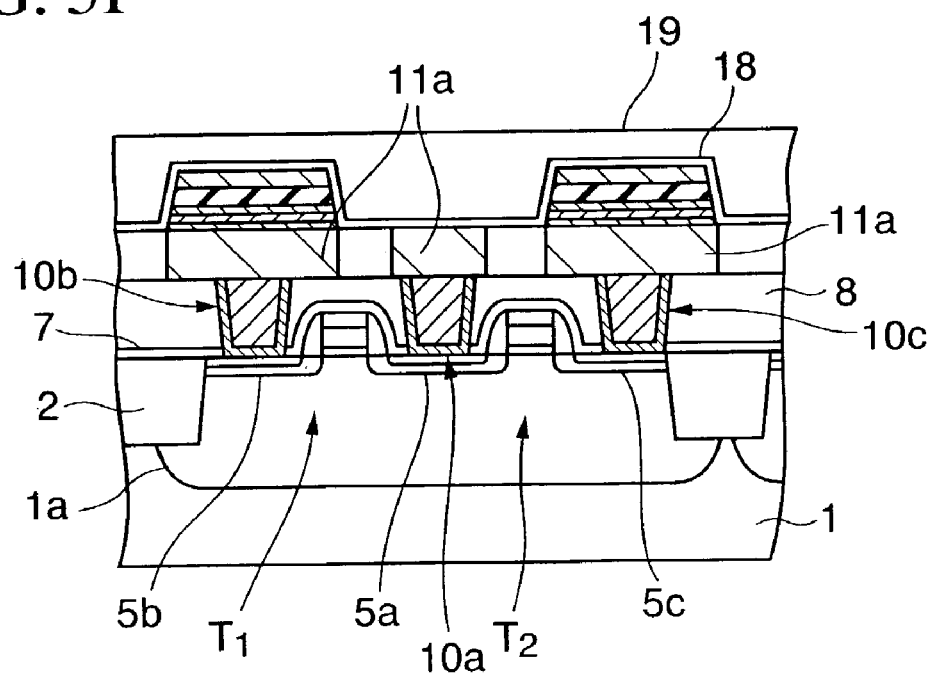

Then, as shown in FIG. 5F, the alumina of 50 nm thickness is formed as the capacitor protection layer 18 on the capacitors Q and the insulating adhesion layer 13 by the sputter. This capacitor protection layer 18 protects the capacitors Q from the process damage, and may be formed of PZT in addition to the alumina. Then, the capacitors Q are annealed at 650° C. for 60 minute in the oxygen atmosphere in the furnace.

Figure 5G:
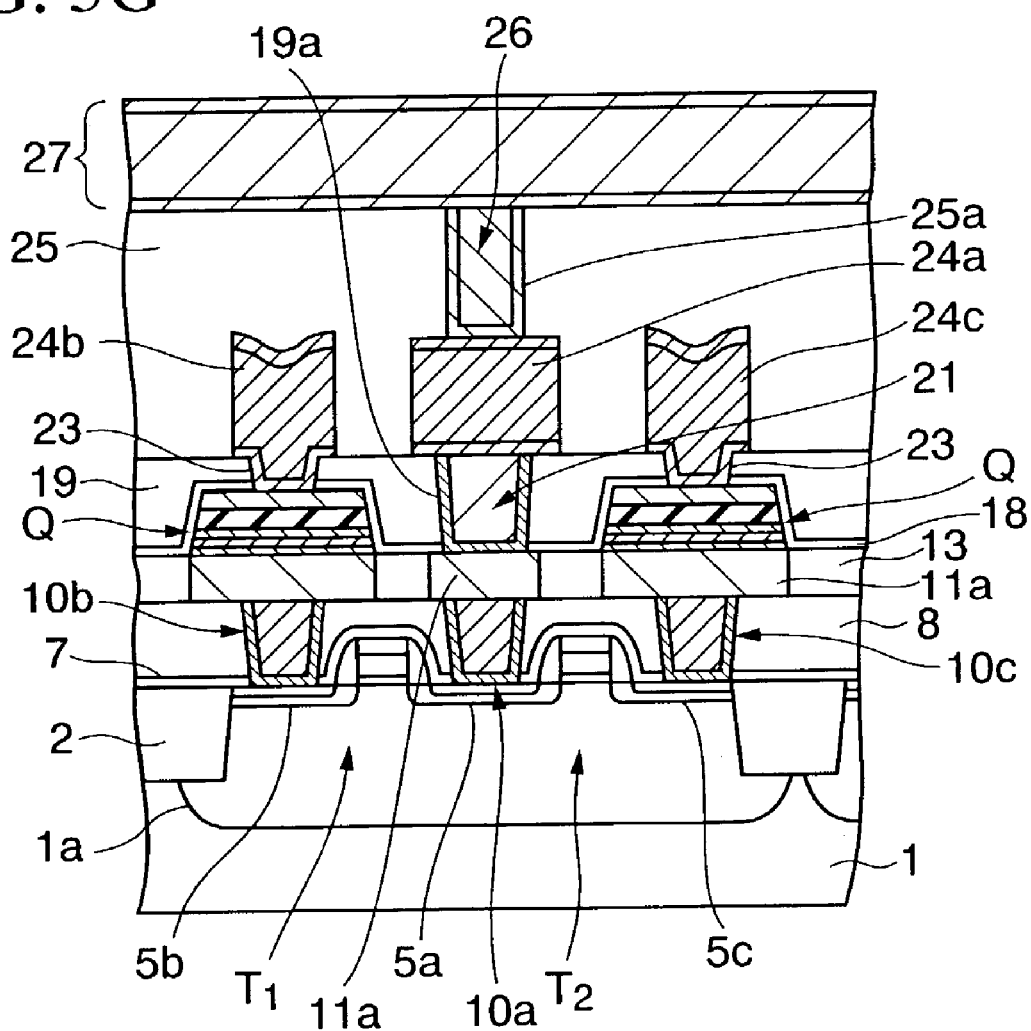

Then, as shown in FIG. 5G, the fourth conductive plug 21, the conductive pad 24a, the first-layer metal wirings 24b, 24c, the third interlayer insulating layer 25, the fifth conductive plug 26, the bit line 27, etc. are formed.

In this case, the fourth conductive plug 21 is formed in the second interlayer insulating layer 19 and the capacitor protection layer 18 over the first n-type impurity diffusion region 5a, and is connected to the island-like oxygen-barrier metal layer 11a. Hence, the bit line 27 is connected electrically to the first n-type impurity diffusion region 5a via the fifth conductive plug 26, the conductive pad 24a, the fourth conductive plug 21, the oxygen-barrier metal layer 11a, and the first conductive plug 10a.

As described above, in the present embodiment, the island-like oxygen-barrier metal layer 11a is formed previously on the first to third conductive plugs 10a to 10c, then the insulating adhesion layer 13 is formed on oxygen-barrier metal layers 11a and the first interlayer insulating layer 8, then the oxygen-barrier metal layer 11a is exposed by polishing the insulating adhesion layer 13 by virtue of the CMP method, and then upper portions of the lower electrodes 14a are formed on the oxygen-barrier metal layers 11a that covers the second and third conductive plugs 10b, 10c. Here, in the present embodiment, like the second embodiment, the iridium layer is also formed as the oxygen-barrier metal layer.

Accordingly, in the present embodiment, the oxygen-barrier metal layers 11a is formed to use as not only the layer for preventing the abnormal oxidation of the second and third conductive plugs 10b, 10c but also a part of the lower electrodes 14a. Thus, such a merit is achieved that steps of forming the layers of the capacitors Q and steps of patterning them are reduced rather than first embodiment.

In addition, since the oxygen-barrier metal layer 11a is left like the island to cover the first conductive plug 10a to which the bit line is connected electrically, steps of forming the oxidation-preventing insulating layer, shown in the first and second embodiments, can be omitted.

As a result, in the crystallization annealing of the ferroelectric layer 15 and in the recovery annealing after the capacitors Q are formed, the abnormal oxidation of the first to third conductive plugs 10a to 10c is prevented by the oxygen-barrier metal layer 11a.

In addition, since the upper surfaces of the oxygen-barrier metal layers 11a and the insulating adhesion layer 13 are planarized by the CMP method, the first conductive layer 14a formed on the oxygen-barrier metal layers 11a and the insulating adhesion layer 13 is made flat in the neighborhood of the oxygen-barrier metal layers 11a. Thus, degradation of the crystal of the ferroelectric layer 15 formed on the first conductive layer 14a is prevented.

Also, the conductive plugs 10a, 21 for the bit-line contact are formed separately in the first interlayer insulating layer 8 and the second interlayer insulating layer 19. As a result, not only the yield of the FeRAM product can be increased but also the existing equipment can be still employed, so that there can be achieved such a merit that reduction in the development cost and the step cost can be implemented.

Here, the oxygen-barrier metal layer 11a constitutes the lower electrode 14a of the capacitor Q. The oxygen-barrier metal layer 11a may be formed like the island that is narrower than the lower electrode 14a of the capacitor Q, like the first embodiment. In this case, the first conductive layer 14 having the quadruple-layered structure employed in the first embodiment may be formed on the oxygen-barrier metal layer 11a and the insulating adhesion layer 13 over the second and third conductive plugs 10b, 10c, and then the lower electrodes 14a may be formed by patterning the first conductive layer 14.

Figure 6:
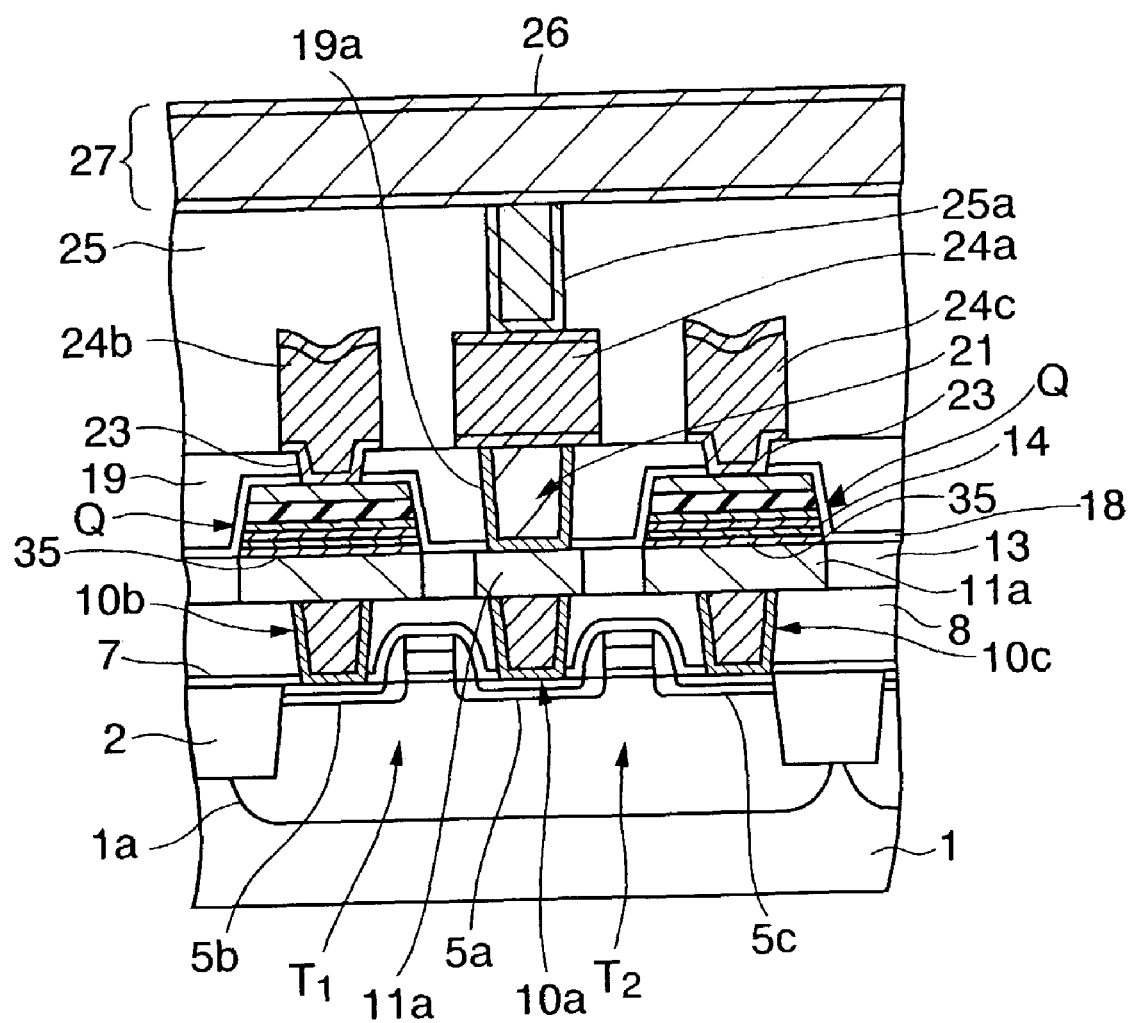
FIG. 6 is a sectional view showing steps of manufacturing another semiconductor device according to the fourth embodiment of the present invention.

In this case, as shown in FIG. 6, like the third embodiment, by adopting the conductive adhesion layer 35 formed between the oxygen-barrier metal layer 11a and the IrO$_2$ layer 14x in the lower electrode 14a of the capacitor Q, the peeling-off in the lower electrode 14a is prevented. In this case, the conductive adhesion layer 35 on the island-like oxygen-barrier metal layer 11a that covers the first conductive plug 10a is removed by the etching.

Fifth Embodiment

In the above embodiments, the glue layer 9a and the tungsten layer 9b are removed from the upper surface of the first interlayer insulating layer 8 by the CMP process at the time of forming the first to third conductive plugs 10a to 10c. It is possible that the erosion and the recess are generated around the first to third contact holes 8a to 8c in the CMP process. Since the object of the CMP process in this case is the glue layer 9a and the tungsten layer 9b, upper surfaces of the first to third conductive plugs 10a to 10c are polished excessively due to generation of the erosion and the recess around the contact holes 8a to 8c. Thus, it is possible that the concave portions are formed in the first to third conductive plugs 10a to 10c and their peripheral areas. There is such a possibility that concave portions are also generated slightly on upper surfaces of the oxygen-barrier metal layers 11, 11a that are formed on the second and third conductive plugs 10b, 10c in the situation that such concave portions are formed In the above embodiments, the oxygen-barrier metal layers 11, 11a are planarized by the steps of polishing the insulating adhesion layer 13 by means of the CMP. But such planarization is still insufficient in some cases.

If the concave portions are present on the oxygen-barrier metal layers 11, 11a, such concave portions affect the lower electrode 14a, the ferroelectric layer 15a, and the upper electrode 16a to deteriorate and also it is a chance to make the polarization characteristic of the capacitor worse.

Therefore, in the present embodiment, a structure of capable of planarizing the oxygen-barrier metal layer much more and a method of forming the same will be explained hereunder.

FIGS. 7A to 7I are sectional views showing steps of manufacturing a semiconductor device according to a fifth embodiment of the present invention.

Figure 7A:
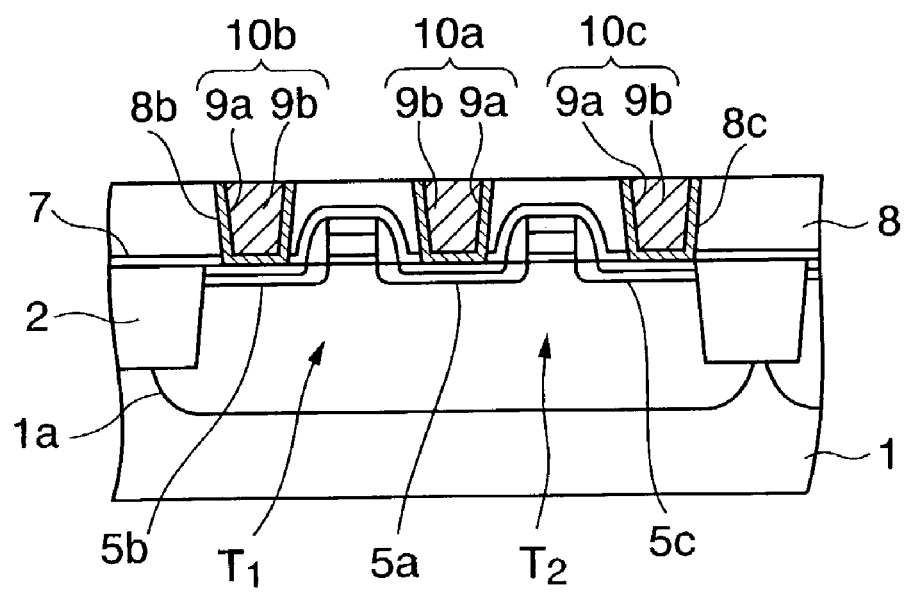
FIGS. 7A to 7I are sectional views showing steps of manufacturing a semiconductor device according to a fifth embodiment of the present invention.

First, as shown in FIG. 7A, in compliance with the steps shown in the first embodiment, the MOS transistors $T_1$, $T_2$ are formed on the silicon substrate 1 and then the cover layer 7, the first interlayer insulating layer 8, and the first to third conductive plugs 10a to 10c are formed.

Figure 7B:
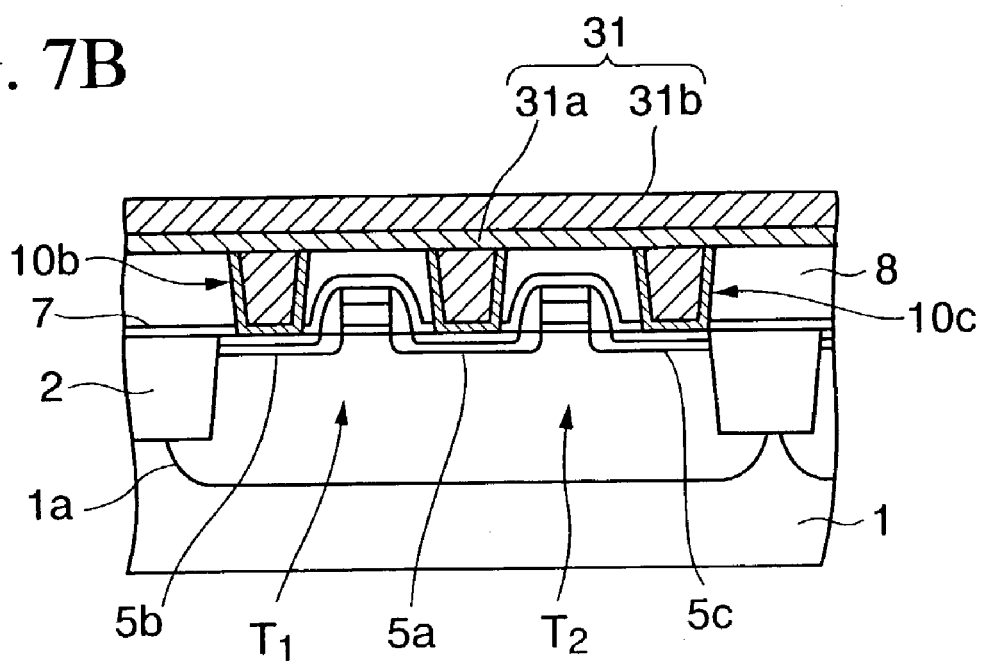

Then, as shown in FIG. 7B, a conductive oxygen-barrier metal layer 31 is formed on the first to third conductive plugs 10a to 10c and the first interlayer insulating layer 8 by the sputter.

In the present embodiment, the oxygen-barrier metal layer 31 has a double-layered structure consisting of a lower metal layer 31a and an upper metal layer 31b. The conductive material that can be easily planarized by the CMP is selected as the upper metal layer 31b. For instance, the lower metal layer 31a made of iridium (Ir) and the upper metal layer 31b made of iridium oxide ($IrO_2$) are formed as the oxygen-barrier metal layer 31. The iridium layer is formed in the argon atmosphere by the sputter using an iridium target. Also, the iridium oxide layer is formed in the atmosphere containing argon and oxygen by the sputter using the iridium target. Here, the argon gas and the oxygen gas are introduced at a ration of 80 and 20 respectively.

The oxygen-barrier metal layer 31 is formed to have the thickness enough to prevent the abnormal oxidation of the second and third conductive plugs 10b, 10c. In order to prevent the abnormal oxidation of the second and third conductive plugs 10b, 10c in the annealing at the substrate temperature of 550° C. in the oxygen-containing atmosphere, the lower Ir layer 31a is formed to have a thickness of 200 nm and the upper $IrO_2$ layer 31b is formed to have a thickness of 200 nm, for example.

In this case, in the present embodiment, a concept of the "oxygen-barrier metal" contains metal oxide.

Figure 7C:
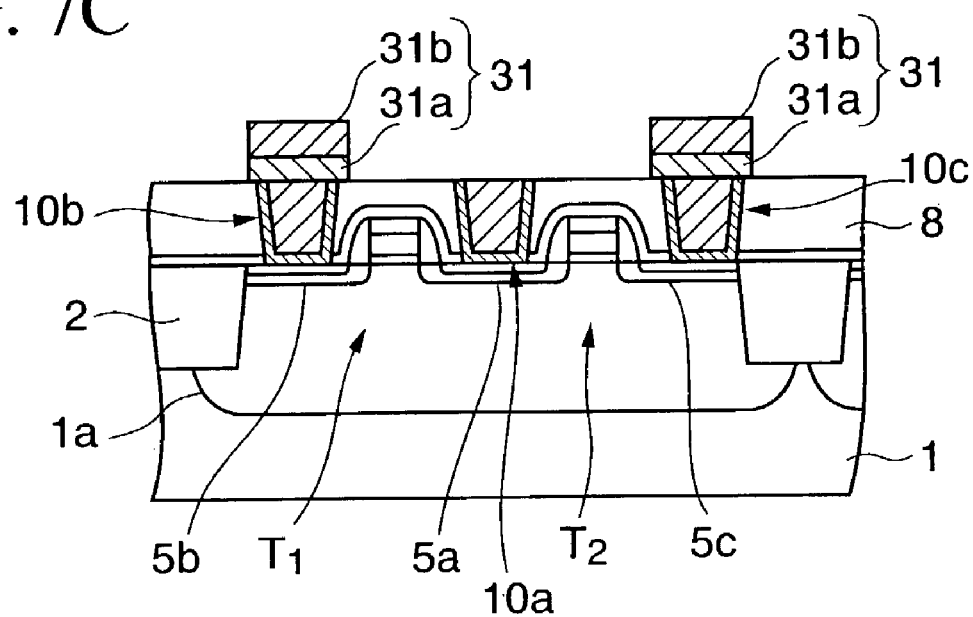

Then, as shown in FIG. 7C, the oxygen-barrier metal layer 31 is left on the second and third conductive plugs 10b, 10c and their peripheral areas by etching the oxygen-barrier metal layer 31 while using a mask (not shown). In this case, it is preferable to use the hard mask as the mask, but the resist mask may be employed.

Figure 7D:
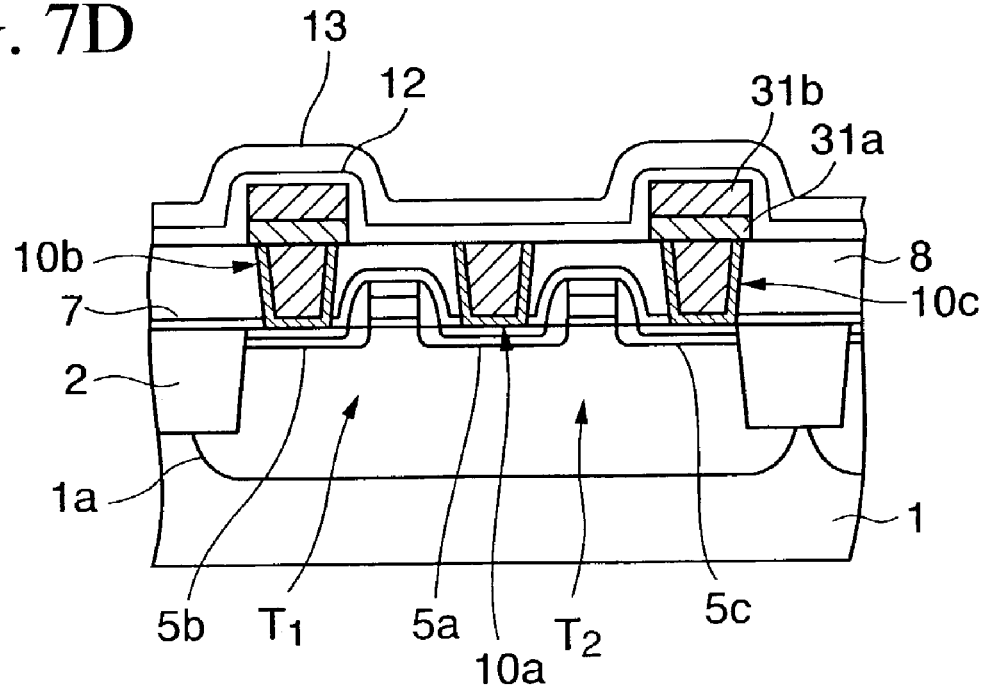

Then, as shown in FIG. 7D, the SiON layer or the $Si_3N_4$ layer of 100 nm thickness, for example, is formed as the oxidation-preventing insulating layer 12 on the oxygen-barrier metal layer 31 and the first interlayer insulating layer 8 by the CVD method. Then, the $SiO_2$ layer of 300 nm thickness, for example, is formed as the insulating adhesion layer 13 on the oxidation-preventing insulating layer 12 by the CVD method using TEOS, for example.

Figure 7E:
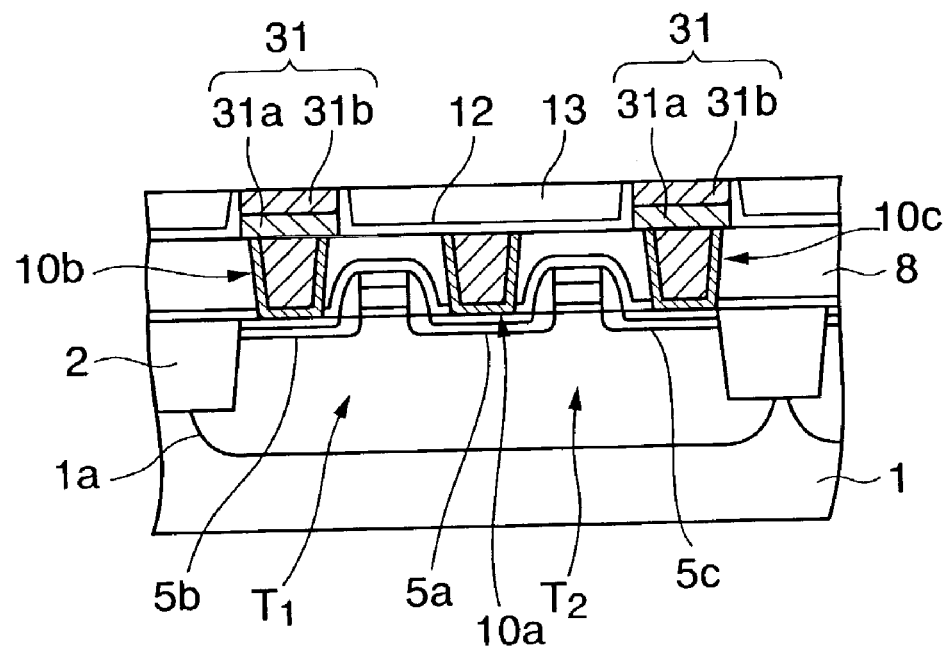

Then, as shown in FIG. 7E, an upper surface of the upper layer 31b of the oxygen-barrier metal layer 31 is exposed by polishing the insulating adhesion layer 13 and the oxidation-preventing insulating layer 12 by virtue of the CMP process. The upper layer 31b is scraped up to a thickness of about 100 nm by executing the CMP process continuously.

Hence, successive upper surfaces of the oxygen-barrier metal layer 31, the insulating adhesion layer 13, and the oxidation-preventing insulating layer 12 are planarized by the CMP method. In this case, as the CMP slurry for the silicon oxide, the silicon nitride, and the silicon nitride oxide, the slurry prepared by adding the water to SS-25 manufactured by CABOT Inc., for example, is employed. According to this, the $IrO_2$ layer constituting the upper layer 31b is planarized more easily than the Ir layer, and is employed as the sacrifice layer.

Figure 7F:
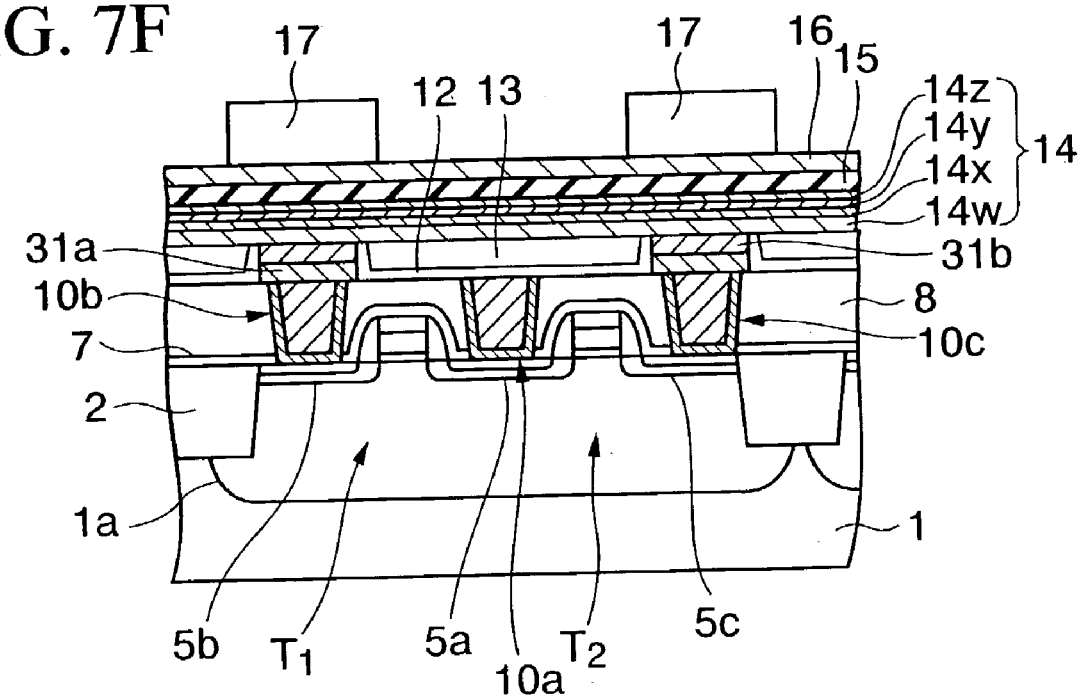

Then, as shown in FIG. 7F, the Ir layer 14w of 200 nm thickness, the $IrO_2$ layer 14x of 30 nm thickness, the PtO layer 14y of 30 nm thickness, and the Pt layer 14z of 50 nm thickness, for example, are formed in sequence as the first conductive layer 14 on the upper layer 31b of the oxygen-barrier metal layer 31, the oxidation-preventing insulating layer 12, and the insulating adhesion layer 13 by the sputter.

In this case, the insulating adhesion layer 13 is annealed to prevent the peeling-off of the layer, for example, before or after the first conductive layer 14 is formed. As the annealing method, the RTA executed at 750° C. for 60 second in the argon atmosphere, for example, may be employed.

Then, the PZT layer of 200 nm thickness, for example, is formed as the ferroelectric layer 15 on the first conductive layer 14 by the sputter method. As the method of forming the ferroelectric layer 15, there are the MOD method, the MOCVD method, the sol-gel method, etc. in addition to this. Also, as the material of the ferroelectric layer 15, other PZT material such as PLCSZT, PLZT, etc., the Bi-layered structure compound material such as $SrBi_2Ta_2O_9$, $SrBi_2(Ta,Nb)_2O_9$, etc., and other metal oxide ferroelectric substance may be employed in addition to PZT.

Then, the ferroelectric layer 15 is annealed in the oxygen-containing atmosphere to crystallize. As such annealing, two-step RTA process having the first step that is executed at the substrate temperature of 600° C. for 90 second in the mixed-gas atmosphere consisting of Ar and $O_2$ and the second step that is executed at the substrate temperature of 750° C. for 60 second in the oxygen atmosphere, for example, is employed.

Then, the $IrO_2$ of 200 nm thickness, for example, is formed as the second conductive layer 16 on the ferroelectric layer 15 by the sputter method.

Then, the TiN layer and the $SiO_2$ layer are formed in sequence as the hard mask 17 on the second conductive layer 16. The TiN layer is formed by the sputter, and the $SiO_2$ layer is formed by the CVD method using TEOS. The hard masks 17 are patterned into the planar shape of the capacitor over the second and third conductive plugs 10b, 10c by the photography method.

Then, the second conductive layer 16, the ferroelectric layer 15, and the first conductive layer 14 in the region that is not covered with the hard masks 17 are etched sequentially. In this case, the ferroelectric layer 15 is etched by the sputter reaction in the atmosphere containing the halogen element. Here, since the oxidation-preventing insulating layer 12 functions as the etching stopper even after the insulating adhesion layer 13 is etched by such etching, the first conductive plug is never exposed.

Figure 7G:
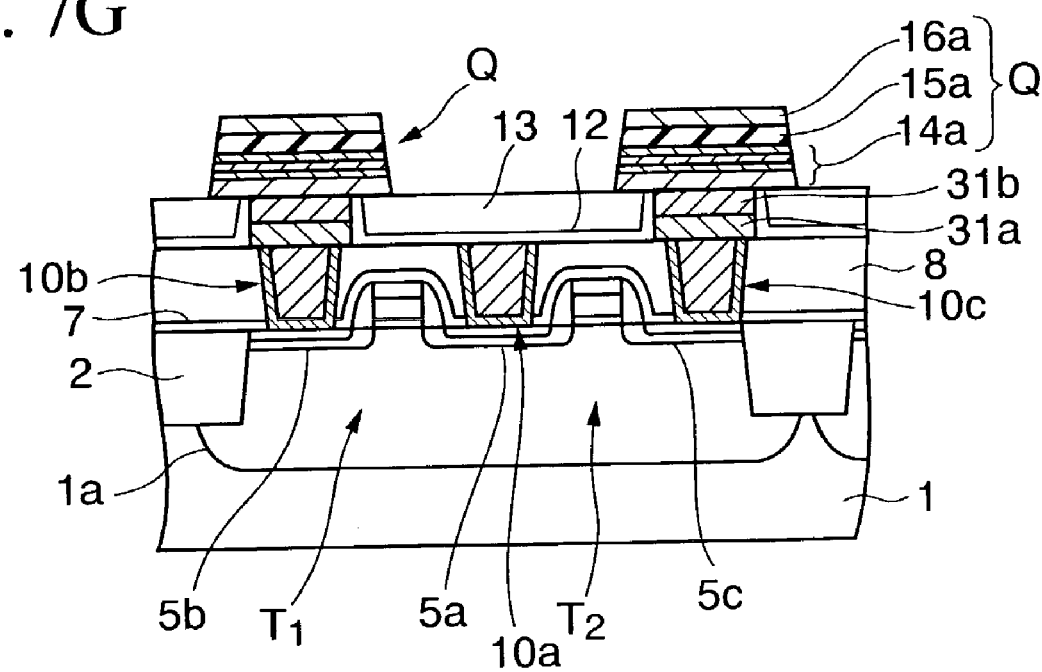

According to the above, as shown in FIG. 7G, the capacitors Q are formed on the first interlayer insulating layer 8. The lower electrode 14a of the capacitor Q is made of the first conductive layer 14. Also, the dielectric layer 15a of the capacitor Q is made of the ferroelectric layer 15. Also, the upper electrode 16a of the capacitor Q is made of the second conductive layer 16.

Two capacitors Q are arranged over one well 1a. These lower electrodes 14a are connected electrically to the second or third n-type impurity diffusion region 5b, 5c via the second or third conductive plug 10b, 10c respectively.

The hard masks 17 are removed after the patterns of the capacitors Q are formed.

Then, in order to recover the damage of the ferroelectric layer 15 caused by the etching, the recovery annealing of the capacitors Q is carried out. The recovery annealing in this case is carried out at the substrate temperature of 650° C. for 60 minute in the furnace containing the oxygen, for example.

In this manner, when the annealing process such as the recovery annealing or the like is applied immediately after the patterning of the ferroelectric layer 15 is executed, the thermal resistance of the second and third conductive plugs 10b, 10c formed directly under the lower electrodes 14a is decided by the oxygen permeability of the oxygen-barrier metal layers 31, and also the oxidation resistance of the first conductive plug 10a not positioned directly under the lower electrodes 14a is decided by the oxygen permeability of the insulating adhesion layer 13 and the oxidation-preventing insulating layer 12.

Although the above thermal processes are required to form the capacitors Q, the first conductive plug 10a made of tungsten is not abnormally oxidized in the condition of which the thickness of the silicon nitride layer used as the insulating adhesion layer 13 is set to 70 nm.

Also, in the condition of which the iridium layer of 400 nm thickness is present on the second and third conductive plugs 10b, 10c made of tungsten, the second and third conductive plugs 10b, 10c are not abnormally oxidized by the oxygen annealing.

In the present embodiment, a total thickness of the iridium layer is 400 nm under the ferroelectric layer 15 and also the IrO$_2$ layer still remains about 100 nm in thick. In this case, since both layers prevents the permeation of oxygen, the abnormal oxidation of the conductive plugs 10b, 10c is not caused.

Figure 7H:
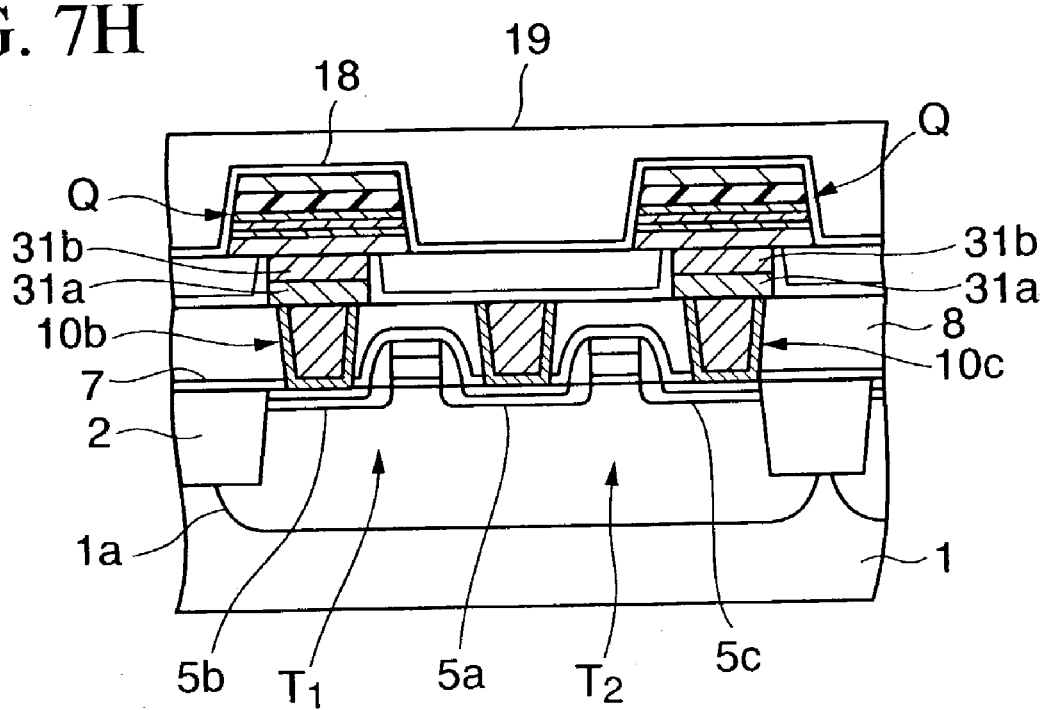

Then, as shown in FIG. 7H, the alumina of 50 nm thickness is formed as the capacitor protection layer 18 on the capacitors Q, the oxidation-preventing insulating layer 12, and the insulating adhesion layer 13 by the sputter. This capacitor protection layer 18 protects the capacitors Q from the process damage, and may be formed of PZT in addition to the alumina. In turn, the capacitors Q are annealed at 650° C. for 60 minute in the oxygen atmosphere.

Figure 7I:
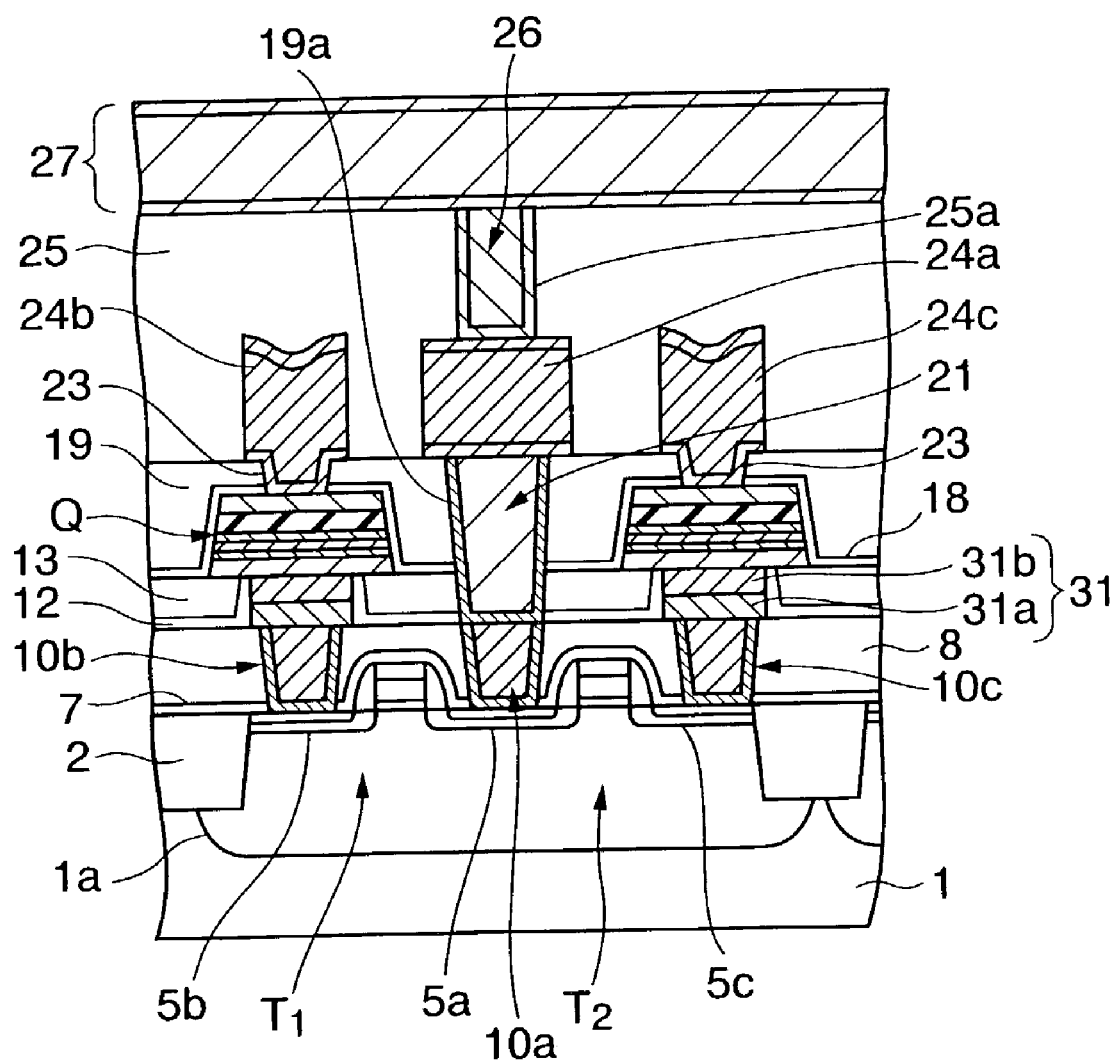

Then, as shown in FIG. 7I, in compliance with the steps shown in the first embodiment, the fourth conductive plug 21, the conductive pad 24a, the first-layer metal wirings 24b, 24c, the third interlayer insulating layer 25, the fifth conductive plug 26, the bit line 27, etc. are formed.

As described above, in the present embodiment, the oxygen-barrier metal layer 31 having the double-layered structure is left like the island on the second and third conductive plugs 10b, 10c, then the oxidation-preventing insulating layer 12 and the insulating adhesion layer 13 are formed on the oxygen-barrier metal layer 31 and the first interlayer insulating layer 8, then the upper surface of the oxygen-barrier metal layer 31 is exposed by polishing the oxidation-preventing insulating layer 12 and the insulating adhesion layer 13 by virtue of the CMP process, and then the upper layer 31b of the oxygen-barrier metal layer 31 is reduced in thickness by executing further the CMP process.

Since the upper layer 31b of the oxygen-barrier metal layer 31 is planarized more easily by the CMP than the Ir layer, it can be facilitated to eliminate the recess on the upper surface of the upper layer 31b caused by the concave portion generated on the second and third conductive plugs 10b, 10c and their peripheral areas.

Therefore, since layers of the first conductive layer 14 and the ferroelectric layer 15 formed on the upper layer 31b can be formed flat, deterioration of the layer quality of the ferroelectric layer 15 resulted from unevenness can be prevented. As a result, the characteristics of the capacitors Q formed by patterning the first conductive layer 14, the ferroelectric layer 15, and the second conductive layer 16 can be improved.

Also, the second and third conductive plugs 10b, 10c below the lower electrodes 14a constituting the capacitors Q are covered with the oxygen-barrier metal layer 31 and the first conductive plug 10a, connected to the bit line 27, and the first interlayer insulating layer 8 are covered with the oxidation-preventing insulating layer 12. Hence, in the crystallization annealing or the recovery annealing of the ferroelectric layer 15, the abnormal oxidation of the first conductive plug 10a is prevented by the oxidation-preventing insulating layer 12 and also the abnormal oxidation of the second and third conductive plugs 10b, 10c is prevented by the oxygen-barrier metal layer 31. In addition, the oxidation-preventing insulating layer 12 still covers the first conductive plug 10a until the fourth contact hole 19a is formed, the first conductive plug 10a is never oxidized by the annealing applied in the formation of the capacitors Q and subsequent steps.

Further, patterned side surfaces of the oxygen-barrier metal layer 31 are covered with the oxidation-preventing insulating layer 12. Therefore, if a size of the oxygen-barrier metal layer 31 is formed almost equal to the second and third conductive plugs 10b, 10c, the oxygen is prevented from entering into the oxygen-barrier metal layer 31 from their side surfaces and thus the abnormal oxidation of the second and third conductive plugs 10b, 10c is not generated.

Also, in the present embodiment, the via-to-via contact is formed between the first n-type impurity diffusion region 5a and the contact pad 24a via two conductive plugs 21, 10a. As a result, not only the yield of the FeRAM product can be increased but also the existing equipment can be still employed, so that there can be achieved such an advantage that reduction in the development cost and the step cost can be implemented.

In this case, like the oxygen-barrier metal layer 14a in the second and third embodiments, the oxygen-barrier metal layer 31 having the above structure may be shaped into the planar shape, which has the same size as the lower electrode 14a of the capacitor Q, so as to constitute a part of the lower electrode. Also, like the oxygen-barrier metal layers 11a in the fourth embodiment, the oxygen-barrier metal layer 31 having the above structure may be left like the island on the first conductive plug 10a.

Sixth Embodiment

In the first to fifth embodiments, in order to prevent the oxidation of the second and third conductive plugs 10b, 10c, the iridium layer is formed as the oxygen-barrier metal layer 11 or 11a on the second and third conductive plugs 10b, 10c.

The iridium layer is formed on the first interlayer insulating layer 8, which is formed by using TEOS, around the second and third conductive plugs 10b, 10c.

Figure 8:
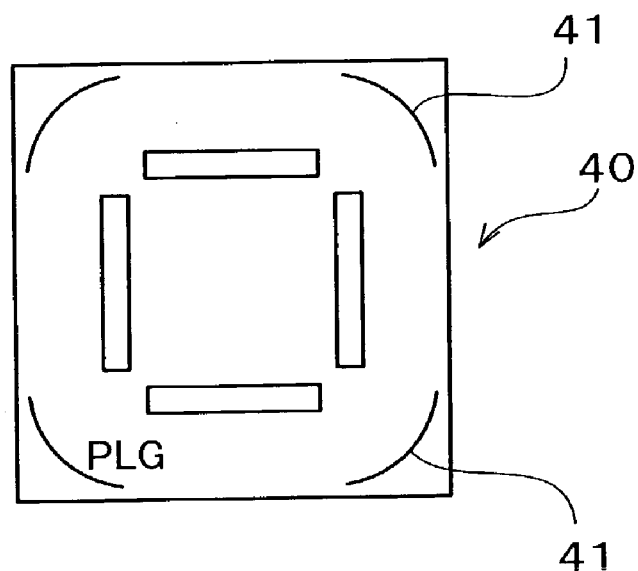
FIG. 8 is a plan view showing an alignment mark in the semiconductor wafer.

By the way, a plurality of semiconductor devices are formed via a scribing region on one sheet of silicon wafer. A plurality of alignment marks 40 shown in FIG. 8 are formed in the scribing region. When the alignment marks 40 are checked after the capacitors Q are formed in accordance with the steps shown in the first embodiment, traces 41 such as swellings are found in a part of the alignment marks 40. In this case, the alignment mark 40 shown in FIG. 8 consists of a plurality of layers constituting the capacitor Q.

Figure 9:
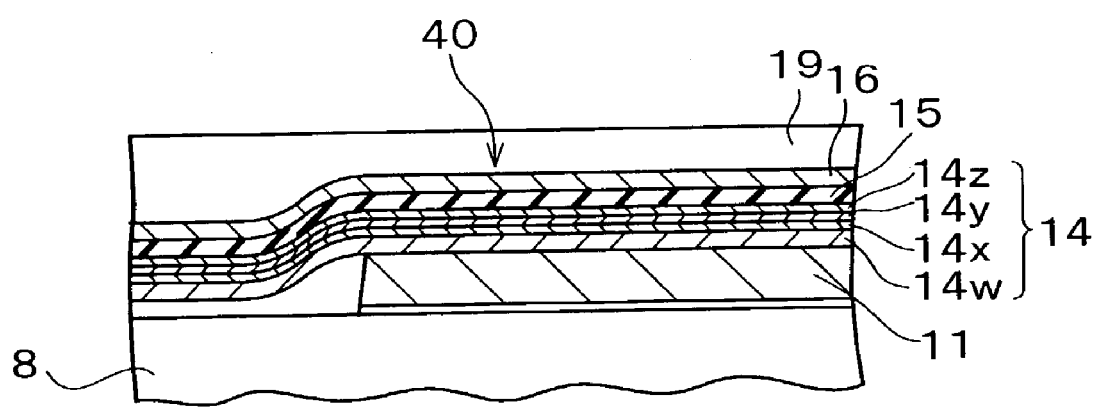
FIG. 9 is a plan view showing another alignment mark in the semiconductor wafer.

Hence, when a cross section of the alignment mark 40, in which the swelling seems to be generated, is watched by SEM, a clearance is formed between the oxygen-barrier metal layer 11, which is made of iridium, and the first interlayer insulating layer 8, as shown in FIG. 9.

Accordingly, in the memory cell region of the semiconductor device, adherence between the oxygen-barrier metal layer 11 and the first interlayer insulating layer 8 must be enhanced much more. In this case, adherence between the second and third conductive plugs 10b, 10c and the oxygen-barrier metal layer 11 is good.

Therefore, in the present embodiment, a structure for improving adhesiveness between the oxygen-barrier metal layer 11 and the first interlayer insulating layer 8 and steps of forming the same will be explained hereunder.

FIGS. 10A to 10I are sectional views showing steps of manufacturing a semiconductor device according to a sixth embodiment of the present invention.

Figure 10A:
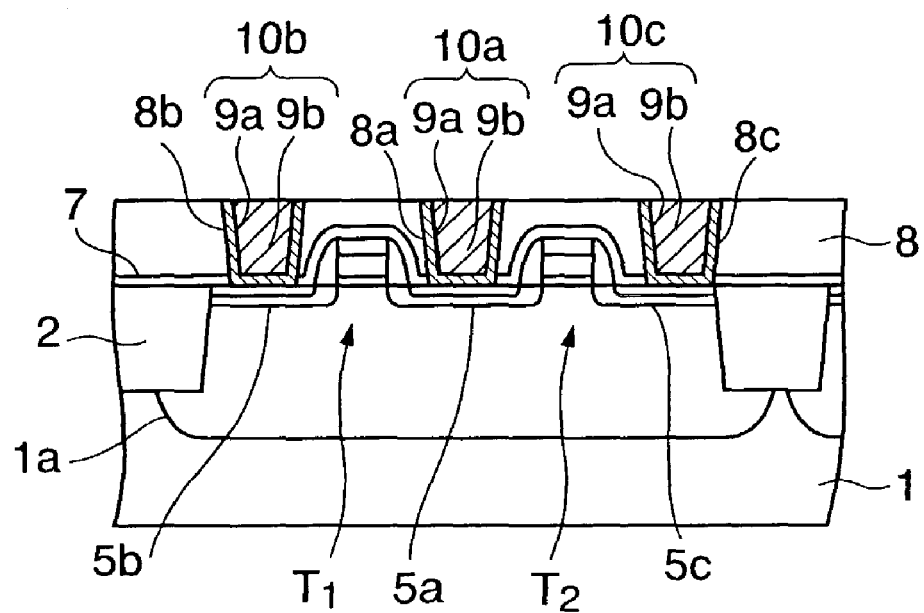
FIGS. 10A to 10I are sectional views showing steps of manufacturing a semiconductor device according to a sixth embodiment of the present invention.

First, as shown in FIG. 10A, in compliance with the steps shown in the first embodiment, the MOS transistors $T_1$, $T_2$ are formed on the silicon substrate 1, and then the cover layer 7, the first interlayer insulating layer 8, and the first to third conductive plugs 10a to 10c are formed. In this case, the first interlayer insulating layer 8 is a silicon oxide layer formed by using TEOS as the source gas, for example.

Figure 10B:
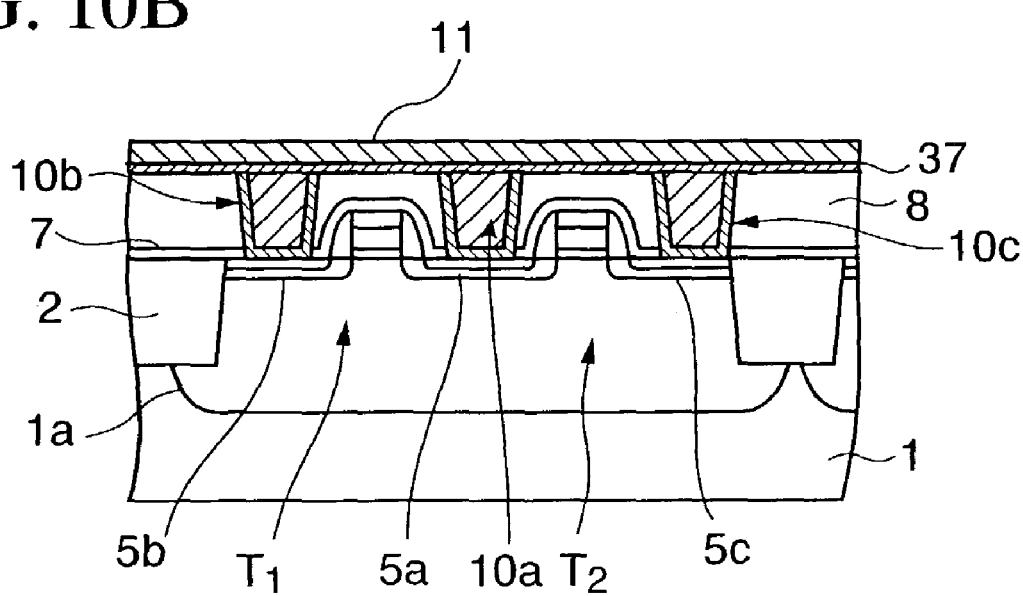

Then, as shown in FIG. 10B, a titanium (Ti) layer having a thickness of more than 5 nm but less than 20 nm, for example, 10 nm, is formed as a conductive adhesion layer 37 on the first to third conductive plugs 10a to 10c and the first interlayer insulating layer 8 by the sputter. In this case, as the conductive adhesion layer 37, a single-layer structure of the titanium nitride (TiN) layer or a double-layered structure consisting of a TiN upper layer and a Ti lower layer may be employed.

Then, the iridium layer is formed as the conductive oxygen-barrier metal layer 11 on the conductive adhesion layer 37 by the sputter. As explained in the first embodiment, the oxygen-barrier metal layer 11 is formed to have a thickness enough to prevent the abnormal oxidation of the second and third conductive plugs 10b, 10c.

Figure 10C:
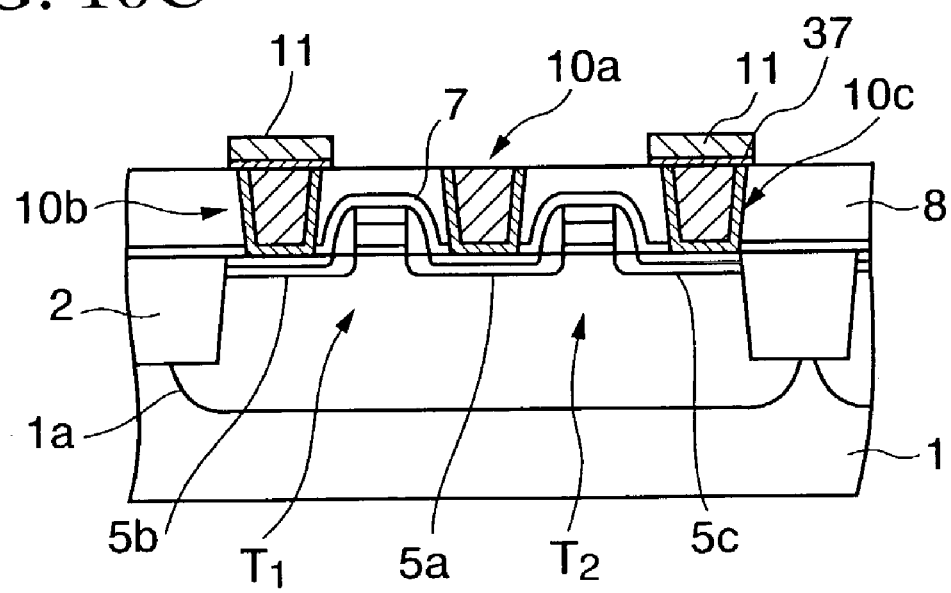

Then, as shown in FIG. 10C, the oxygen-barrier metal layer 11 and the conductive adhesion layer 37 are left like the island on the second and third conductive plugs 10b, 10c and their peripheral areas by etching the oxygen-barrier metal layer 11 and the conductive adhesion layer 37 while using the same mask (not shown) as the first embodiment. Thus, the first conductive plug 10a is exposed. Then, the masks are removed.

Figure 10D:
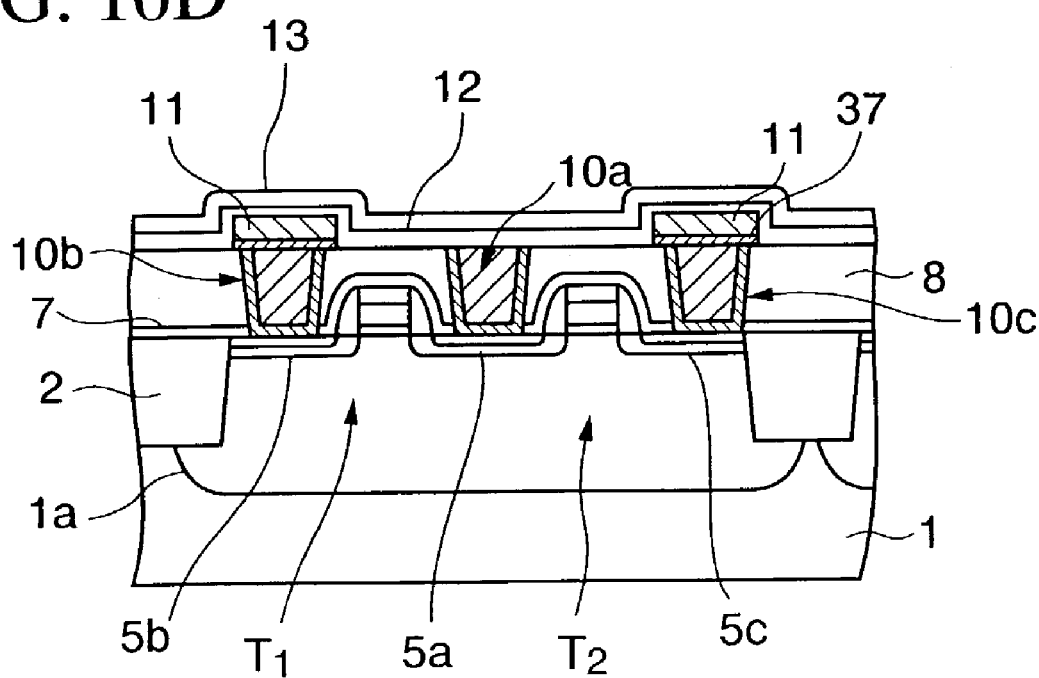

Then, as shown in FIG. 10D, the SiON layer or the $Si_3N_4$ layer of 100 nm thickness, for example, is formed as the oxidation-preventing insulating layer 12 on the oxygen-barrier metal layer 11, the conductive adhesion layer 37, and the first interlayer insulating layer 8 by the CVD method. Then, the insulating adhesion layer 13 is formed on the oxidation-preventing insulating layer 12. As the insulating adhesion layer 13, the $SiO_2$ layer of 100 nm thickness, for example, is formed by the CVD method using TEOS, for example.

Figure 10E:
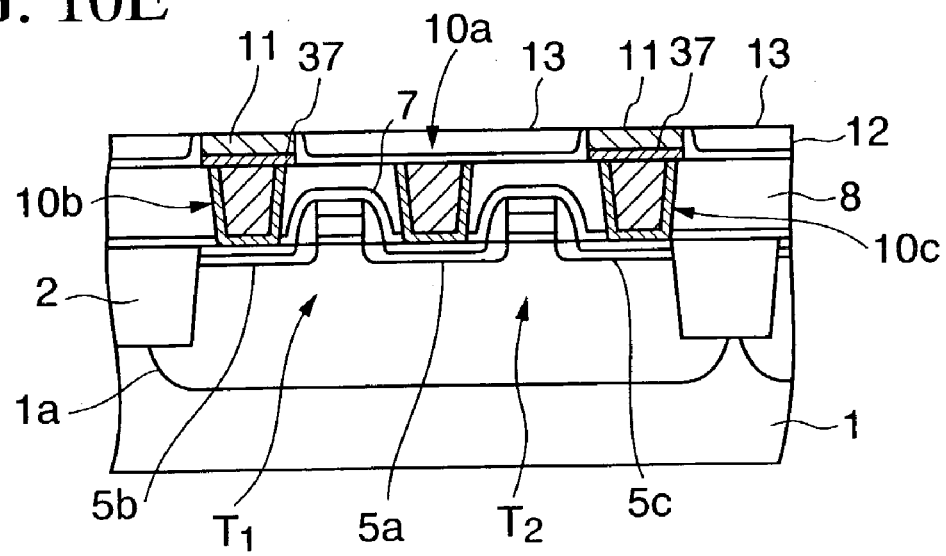

Then, as shown in FIG. 10E, the upper surface of the oxygen-barrier metal layer 11 is exposed by polishing the insulating adhesion layer 13 and the oxidation-preventing insulating layer 12 by means of the CMP method while causing the oxygen-barrier metal layer 11 to function as the stopper layer. In this state, since the conductive adhesion layer 37 is covered with the oxygen-barrier metal layer 11 and the oxidation-preventing insulating layer 12, the oxidation of the conductive adhesion layer 37 is prevented.

Figure 10F:
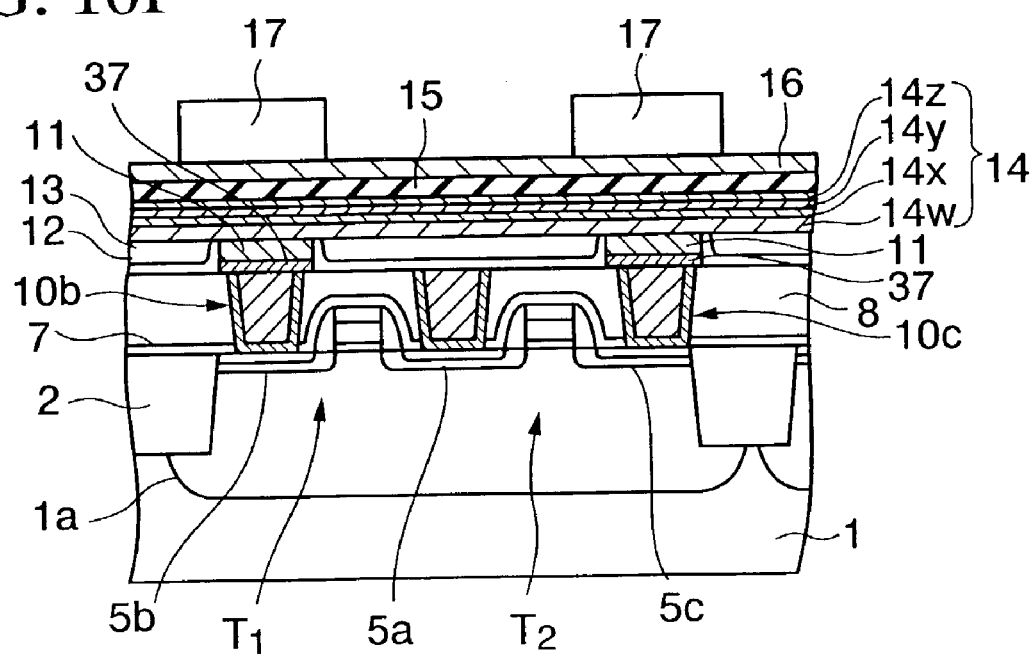

Then, as shown in FIG. 10F, the first conductive layer 14 is formed on the oxygen-barrier metal layer 11, the oxidation-preventing insulating layer 12, and the insulating adhesion layer 13. As shown in the first embodiment, as the first conductive layer 14, for example, the Ir layer 14w, the $IrO_2$ layer 14x, the PtO layer 14y, and the Pt layer 14z are formed in sequence by the sputter. In this case, the insulating adhesion layer 13 is annealed to prevent the peeling-off of the layer, for example, before or after the first conductive layer 14 is formed.

Then, as shown in the first embodiment, the ferroelectric layer 15 is formed on the first conductive layer 14. Then, the ferroelectric layer 15 is crystallized by two-step annealing in the oxygen-containing atmosphere under the same conditions as the first embodiment.

Then, like the first embodiment, the second conductive layer 16 is formed on the ferroelectric layer 15 by the sputter method.

Then, the hard masks 17 each having the planar shape of the capacitor are formed on the second conductive layer 16.

Then, the capacitors Q are formed on the oxygen-barrier metal layer 11, the insulating adhesion layer 13, and the oxidation-preventing insulating layer 12 by etching in sequence the second conductive layer 16, the ferroelectric layer 15, and the first conductive layer 14 in the region that is not covered with the hard masks 17.

Figure 10G:
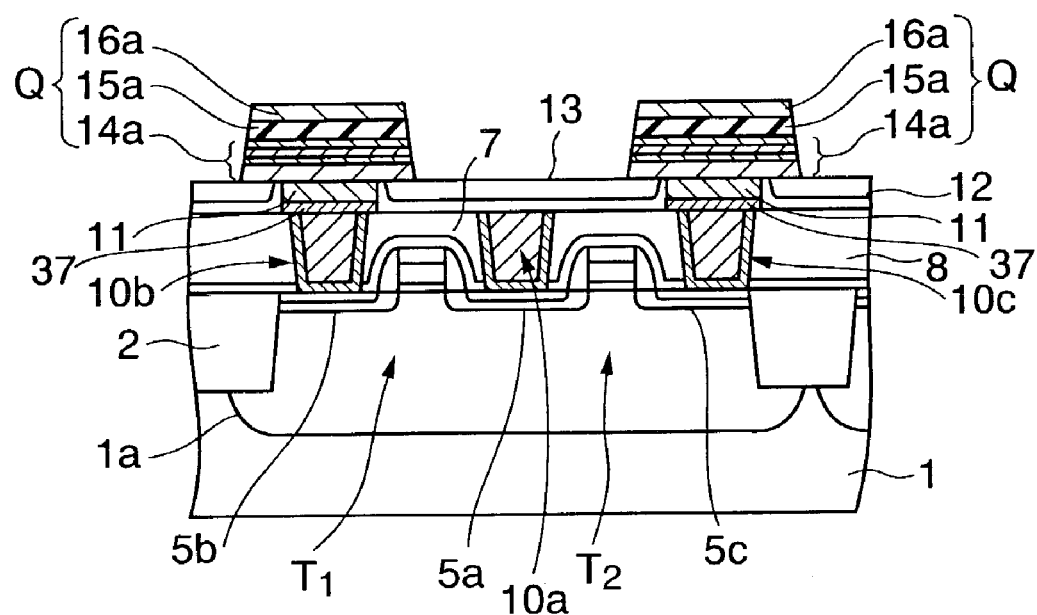

As shown in FIG. 10G, each of the capacitors Q consists of the lower electrode 14a made of the first conductive layer 14, the dielectric layer 15a made of the ferroelectric layer 15, and the upper electrode 16a made of the second conductive layer 16. Then, in order to recover the damage of the ferroelectric layer 15 caused by the etching, the recovery annealing is carried out.

In this manner, when the annealing process such as the recovery annealing or the like is applied immediately after the patterning of the ferroelectric layer 15 is executed, the thermal resistance of the second and third conductive plugs 10b, 10c formed directly under the lower electrodes 14a is decided by the oxygen permeability of the oxygen-barrier metal layers 11, and the oxidation resistance of the first conductive plug 10a not positioned directly under the lower electrodes 14a is decided by the oxygen permeability of the insulating adhesion layer 13 and the oxidation-preventing insulating layer 12.

In the annealing process in the above oxygen atmosphere, the conductive adhesion layer 37 covered with the oxidation-preventing insulating layer 12 and the oxygen-barrier metal layers 11 is not oxidized and thus increase of the resistance of the conductive adhesion layer 37 is suppressed. Also, the oxidation of the first conductive plug 10a is prevented by the oxidation-preventing insulating layer 12. In addition, the abnormal oxidization of the second and third conductive plugs 10b, 10c is prevented by the iridium constituting the oxygen-barrier metal layers 11 and the first conductive layer 14.

Figure 10H:
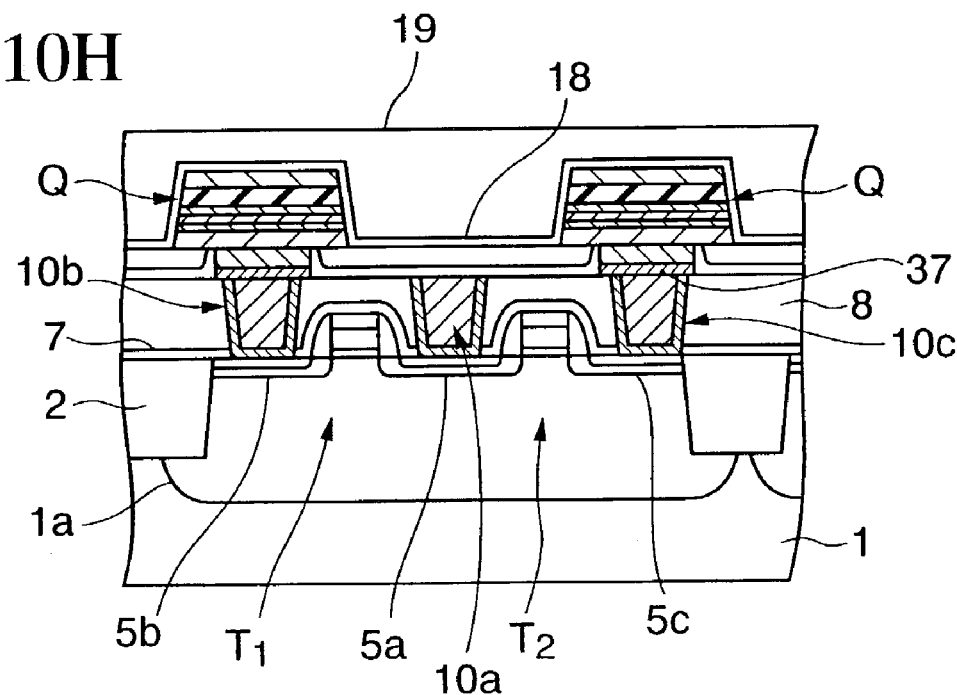

Then, as shown in FIG. 10H, the capacitor protection layer 18 is formed on the capacitors Q and the insulating adhesion layer 13 by the sputter. Then, the capacitors Q are annealed in the oxygen atmosphere. Then, the second interlayer insulating layer 19 is formed on the capacitor protection layer 18 by the plasma CVD method. Then, the upper surface of the second interlayer insulating layer 19 is planarized by the CMP method.

Figure 10I:
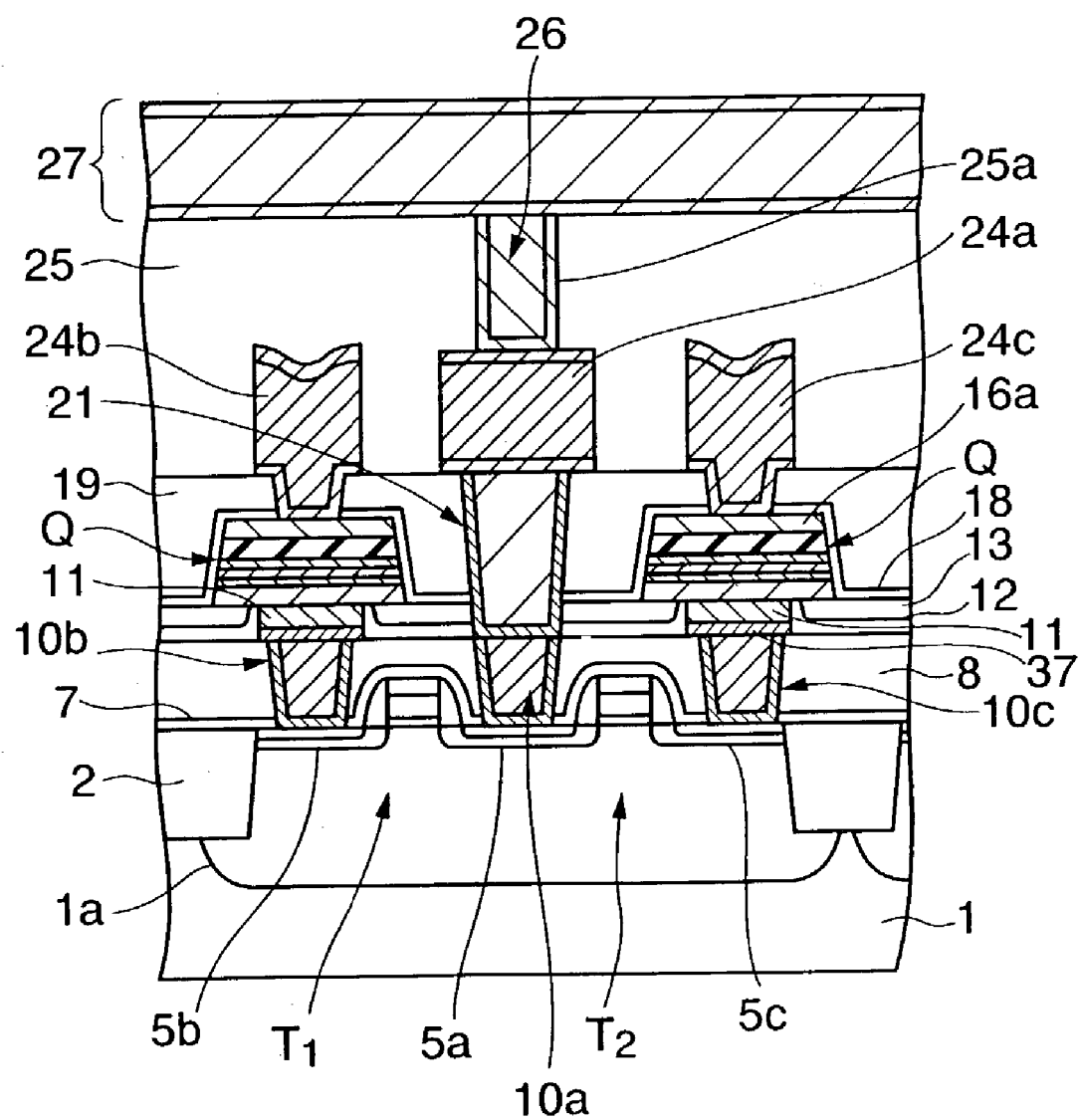

Then, as shown in FIG. 10I, in compliance with the same steps as the first embodiment, the capacitor protection layer 18, the second interlayer insulating layer 19, the fourth conductive plug 21, the conductive pad 24a, the first-layer metal wirings 24b, 24c, the third interlayer insulating layer 25, the fifth conductive plug 26, the bit line 27, etc. are formed. In this case, in FIG. 10I, the same symbols as those in FIG. 2O denote the same elements.

As described above, according to the present embodiment, since the conductive adhesion layer 37 is formed of the material that has good adhesiveness to both the oxygen-barrier metal layers 11 and the first interlayer insulating layer 8, the clearance is never generated under the island-like the oxygen-barrier metal layers 11. If the clearance is generated under the island-like oxygen-barrier metal layers 11, it is possible that the second and third conductive plugs 10b, 10c are oxidized through the clearance.

In addition, by employing the Ti layer as the conductive adhesion layer 37, orientation strength of a (111) face of the oxygen-barrier metal layers 11 is enhanced. Thus, orientation strength of a (111) face of the first conductive layer 14 formed on the oxygen-barrier metal layers 11 also is enhanced, and also crystallinity of the ferroelectric layer 15 formed on the first conductive layer 14 is improved.

Also, when the alignment marks formed on the scribing lines of the silicon substrate (wafer) 1 were checked, no trace of the swelling was generated and no clearance was found under the iridium layer constituting the alignment marks.

In the meanwhile, in the above fifth embodiment, in the case of which the oxygen-barrier metal layers 31 each having the double-layered structure consisting of the Ir lower layer 31a and the IrO$_2$ upper layer 31b are formed like the island on the second and third conductive plugs 10b, 10c and their peripheral areas, this conductive adhesion layer 37 may be formed between the oxygen-barrier metal layers 31 and the first interlayer insulating layer 8.

Figure 11:
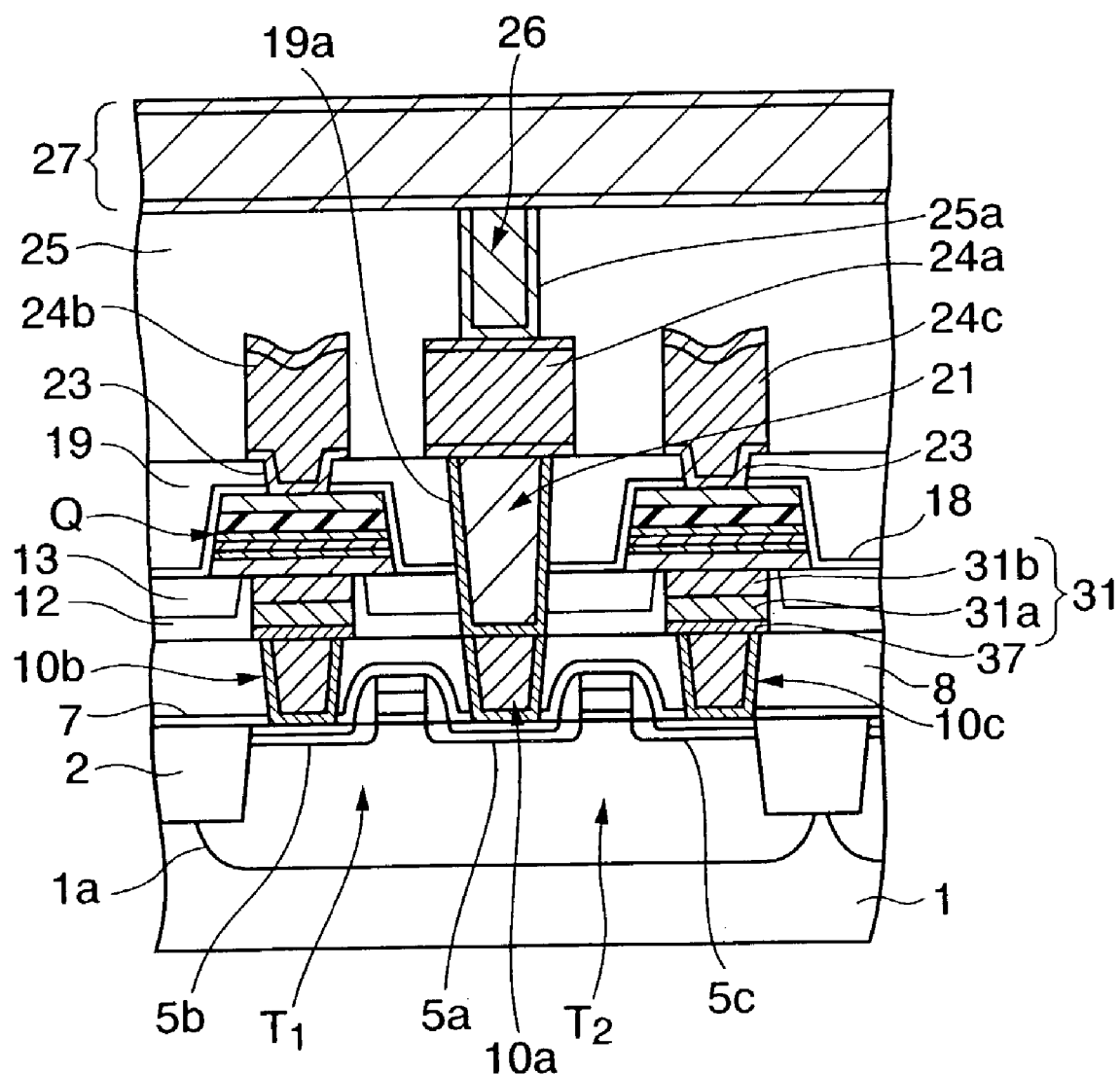
FIG. 11 is a sectional view showing another semiconductor device according to the sixth embodiment of the present invention.

More particularly, as shown in FIG. 11, the island-like oxygen-barrier metal layers 31 may be formed on the second and third conductive plugs 10b, 10c and their peripheral areas via the island-like conductive adhesion layer 37. Hence, the peeling-off of the oxygen-barrier metal layers 31 formed on the second and third conductive plugs 10b, 10c is prevented. In this case, the conductive adhesion layers 37 formed under the oxygen-barrier metal layers 31 are covered with the oxygen-barrier metal layers 31 and the oxidation-preventing insulating layer 12, the oxidation of the conductive adhesion layers 37 during the annealing to form the capacitors is prevented.

Seventh Embodiment

As shown in the second embodiment, by adopting a size of the island-like oxygen-barrier metal layers 11a set equal to the capacitor lower electrodes 14a, the adhesiveness between the oxygen-barrier metal layers 11a, which is formed to prevent the oxidation of tungsten constituting the second and third conductive plugs 10b, 10c, and the first interlayer insulating layer 8 must be improved much more.

FIGS. 12A to 12G are sectional views showing steps of manufacturing a semiconductor device according to a seventh embodiment of the present invention.

Figure 12A:
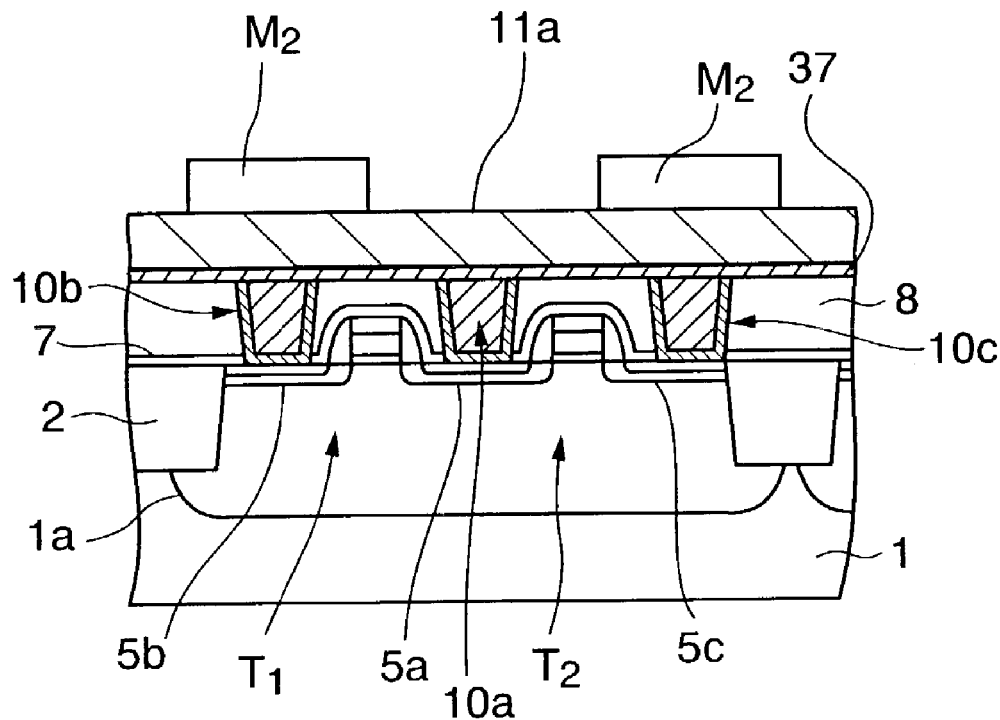
FIGS. 12A to 12G are sectional views showing steps of manufacturing a semiconductor device according to a seventh embodiment of the present invention.

Next, steps required until a structure shown in FIG. 12A is formed will be explained hereunder.

First, in compliance with the steps shown in the first embodiment, the MOS transistors $T_1$, $T_2$ are formed on the silicon substrate 1, and then the cover layer 7, the first interlayer insulating layer 8, and the first to third conductive plugs 10a to 10c are formed.

Then, the titanium (Ti) layer is formed as the conductive adhesion layer 37 on the first to third conductive plugs 10a to 10c and the first interlayer insulating layer 8 by the sputter. It is preferable that a thickness of the titanium layer should be set to keep conductivity of the titanium layer if the titanium layer is oxidized, and the thickness is set to more than 5 nm but less than 20 nm, for example, 10 nm. As the conductive adhesion layer 37, the single-layer structure consisting of the TiN layer or the double-layered structure consisting of the TiN upper layer and the Ti lower layer may be employed.

Then, the iridium layer of 400 nm thickness is formed as the conductive oxygen-barrier metal layer 11a on the conductive adhesion layer 37 by the sputter. The oxygen-barrier metal layer 11a constitutes a part of the lower electrode of the capacitor Q, as described later.

Then, the hard masks made of titanium nitride, silicon oxide, or the like are formed as the masks $M_2$ on the oxygen-barrier metal layer 11a over the second and third conductive plugs 10b, 10c and their peripheral areas. The planar shape of the masks $M_2$ are set equal to the shape of the lower electrode of the capacitor, to be described later.

Figure 12B:
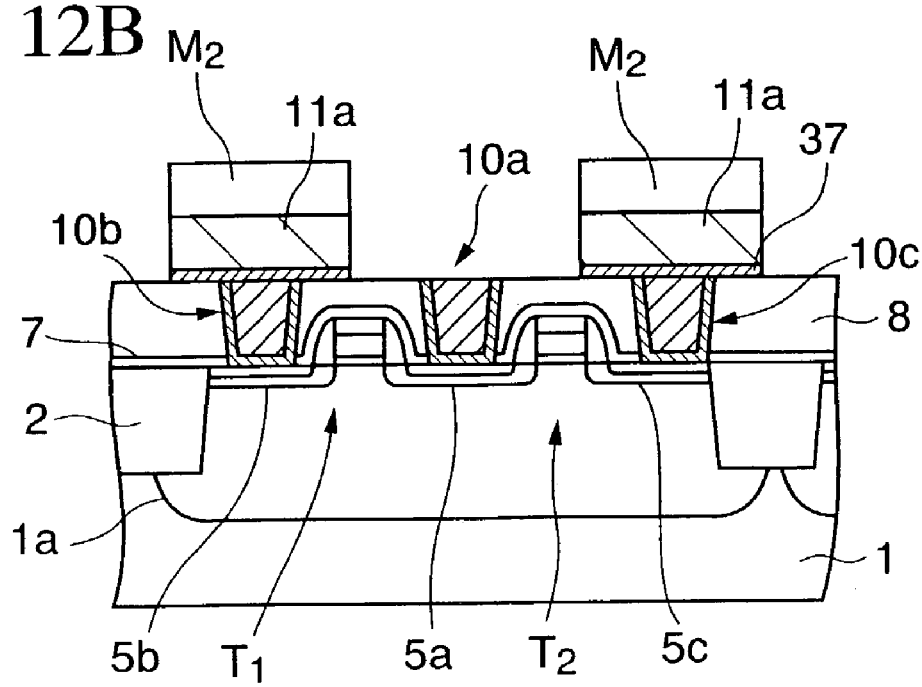

Then, as shown in FIG. 12B, the oxygen-barrier metal layer 11a and the conductive adhesion layer 37 are etched in the region that is not covered with the masks $M_2$. Thus, the oxygen-barrier metal layer 11a and the conductive adhesion layer 37 are left on the second and third conductive plugs 10b, 10c and their peripheral areas to have the size of the capacitor. Here, the first conductive plug 10a is exposed. Then, the masks $M_2$ are removed.

Figure 12C:
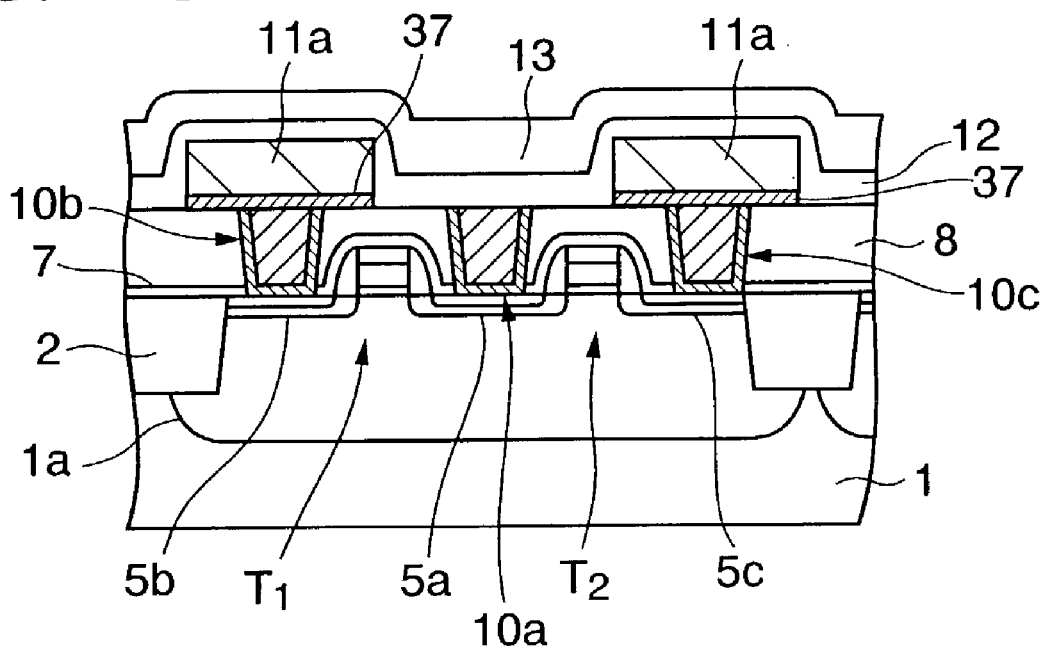

Then, as shown in FIG. 12C, the oxidation-preventing insulating layer 12 and the insulating adhesion layer 13 are formed in sequence on the oxygen-barrier metal layer 11a, the conductive adhesion layer 37, the first conductive plug 10a, and the first interlayer insulating layer 8 under the same conditions as the second embodiment.

Figure 12D:
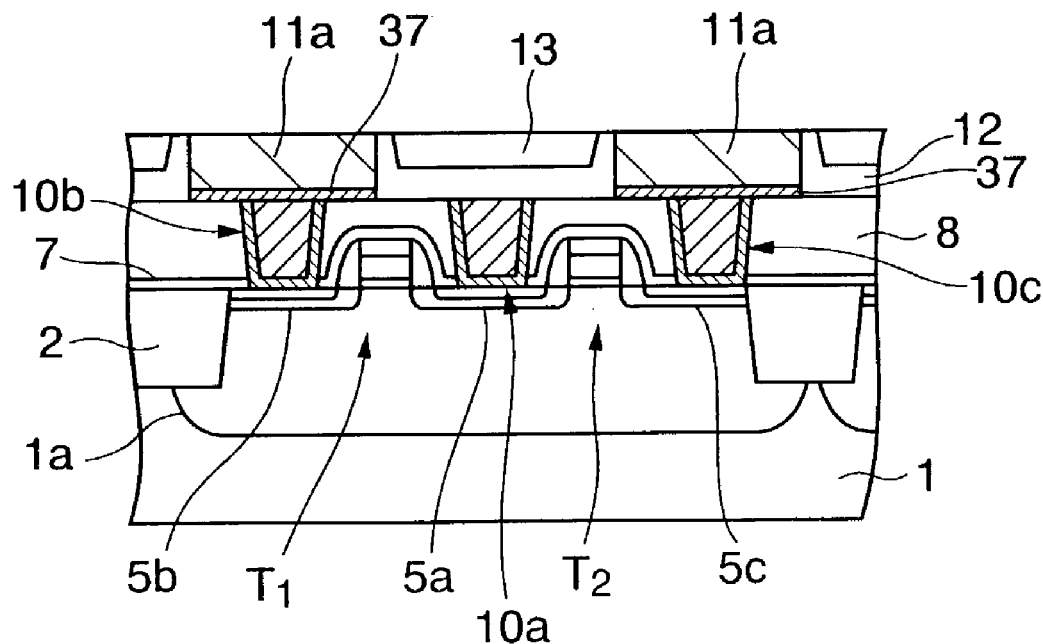

Then, as shown in FIG. 12D, the upper surface of the oxygen-barrier metal layer 11a is exposed by polishing the oxidation-preventing insulating layer 12 and the insulating adhesion layer 13 by means of the CMP method while causing the oxygen-barrier metal layer 11a to function as the stopper layer. Hence, upper surfaces of the oxygen-barrier metal layer 11a, the insulating adhesion layer 13, and the oxidation-preventing insulating layer 12 are made flat substantially.

Figure 12E:
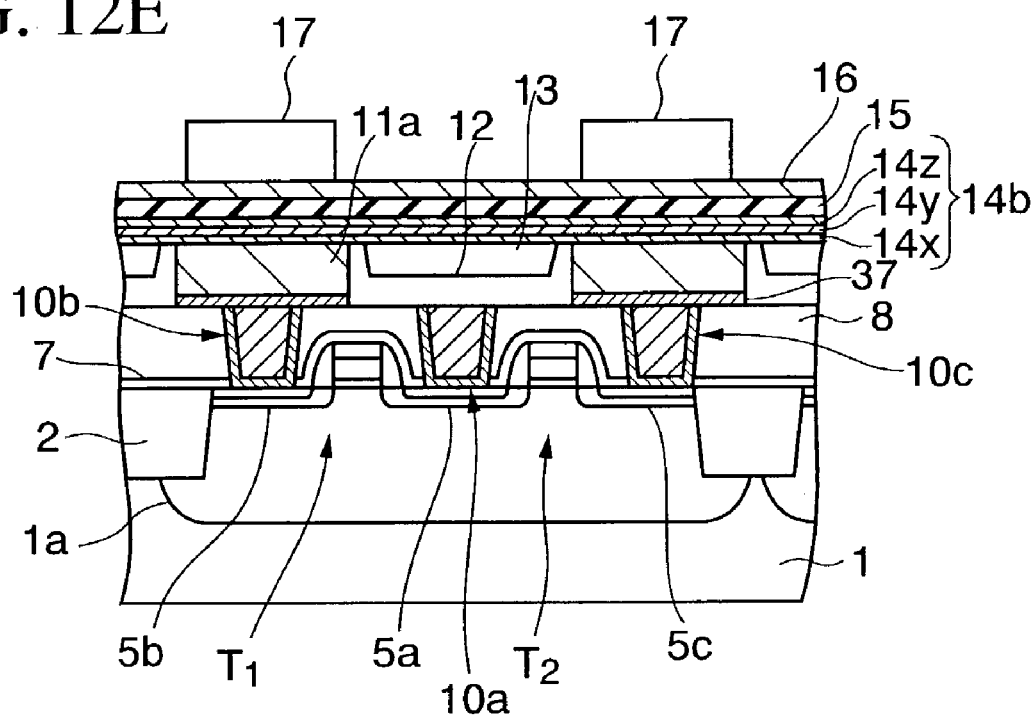

Then, as shown in FIG. 12E, like the second embodiment, the IrO$_2$ layer 14x of 30 nm thickness, the PtO layer 14y of 30 nm thickness, and the Pt layer 14z of 50 nm thickness, for example, are formed sequentially as the first conductive layer 14b on the oxygen-barrier metal layer 11a, the oxidation-preventing insulating layer 12, and the insulating adhesion layer 13 by the sputter. In this case, the insulating adhesion layer 13 is annealed to prevent the peeling-off of the layer before or after the first conductive layer 14b is formed.

Then, the ferroelectric layer 15 is formed on the first conductive layer 14 under the conditions shown in the second embodiment. Then, the ferroelectric layer 15 is annealed in the oxygen-containing atmosphere to crystallize. As shown in the second embodiment, two-step RTA process is employed as such annealing. Then, the IrO$_2$ layer of 200 nm thickness, for example, is formed as the second conductive layer 16 on the ferroelectric layer 15 by the sputter method.

Then, the TiN layer and the SiO$_2$ layer are formed sequentially on the second conductive layer 16, and then the hard masks 17 are formed by patterning these layers. each having the planar shape of the capacitor. The hard masks 17 are patterned into the capacitor shape, which is almost similar to the oxygen-barrier metal layer 11a, over the second and third conductive plugs 10b, 10c.

Then, the second conductive layer 16, the ferroelectric layer 15, and the first conductive layer 14b in the region, which is not covered with the hard masks 17, are etching in sequence under the same conditions as the second embodiment. Then, the hard masks 17 are removed.

Figure 12F:
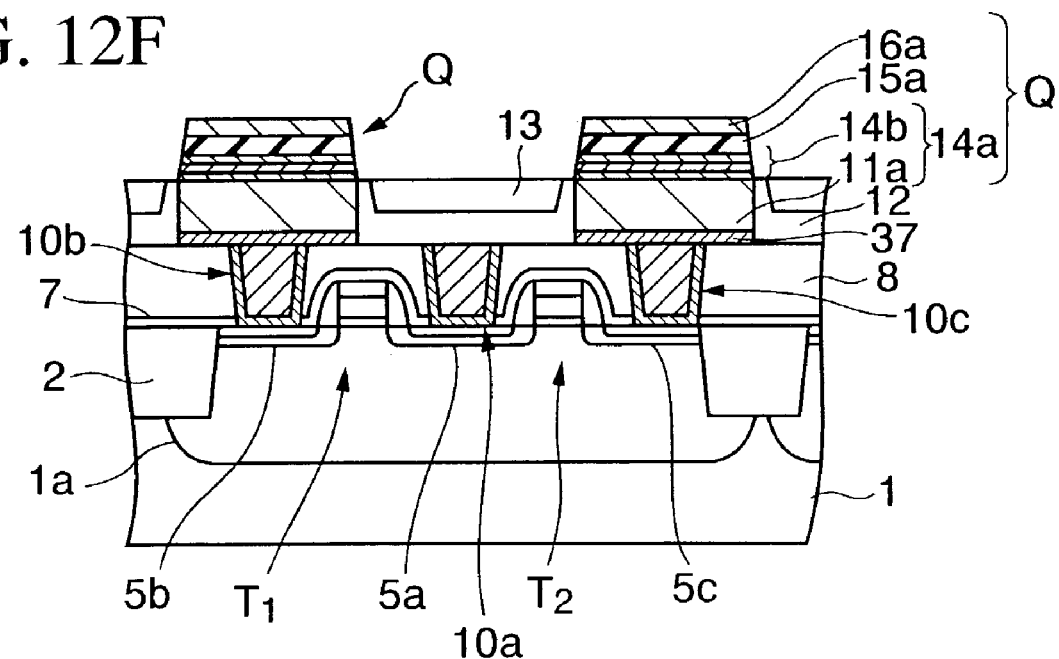

With the above, as shown in FIG. 12F, the capacitors Q are formed on the first interlayer insulating layer 8. The lower electrode 14a of the capacitor Q is made of the first conductive layer 14b and the oxygen-barrier metal layer 11a. Also, the dielectric layer 15a of the capacitor Q is made of the ferroelectric layer 15, and the upper electrode 16a of the capacitor Q is made of the second conductive layer 16.

Figure 12G:
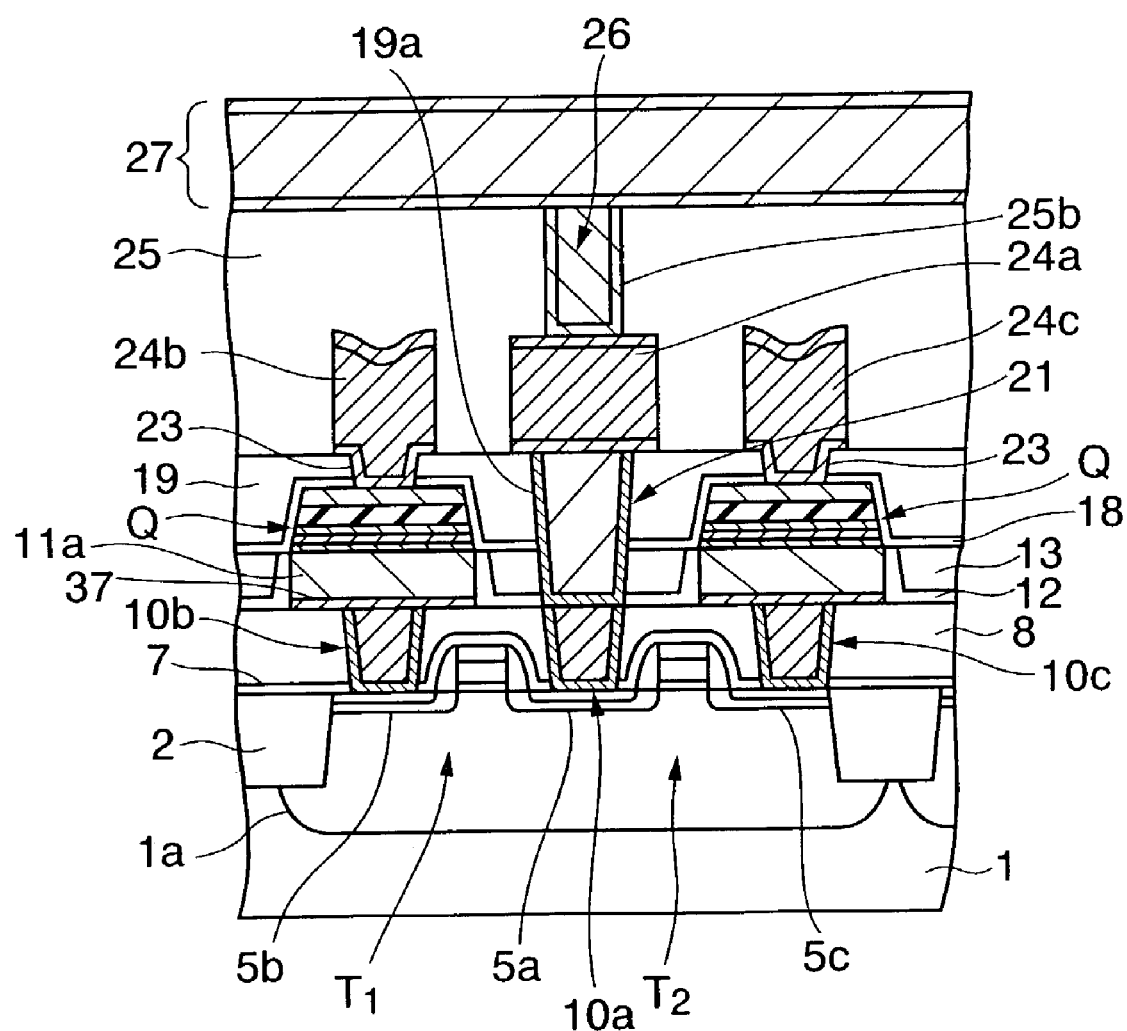

After this, as shown in FIG. 12G, in compliance with the same steps as the second embodiment, the capacitor protection layer 18, the second interlayer insulating layer 19, the fourth conductive plug 21, the conductive pad 24a, the first-layer metal wirings 24b, 24c, the third interlayer insulating layer 25, the fifth conductive plug 26, the bit line 27, etc. are formed. In this case, in FIG. 12G, the same symbols as those in FIG. 3I denote the same elements.

As described above, according to the present embodiment, since the conductive adhesion layer 37 is formed of that material that has good adhesiveness to both the oxygen-barrier metal layers 11a and the first interlayer insulating layer 8, the clearance is never generated under the oxygen-barrier metal layers 11a constituting the lower electrode 14a of the capacitor Q. In addition, by adopting the Ti layer as the conductive adhesion layer 37, the orientation strength of the (111) face of the lower electrode 14a is enhanced. Thus, the crystallinity of the ferroelectric layer 15 is improved.

By the way, as shown in the fourth embodiment, in the structure in which the island-like oxygen-barrier metal layer 11a is formed on not only the second and third conductive plugs 10b, 10c and their peripheral areas but also the first conductive plug 10a and its peripheral area, the conductive adhesion layer 37 may be formed between the first interlayer insulating layer 8 and the island-like oxygen-barrier metal layers 11a around the first conductive plug 10a and its peripheral area.

Figure 13:
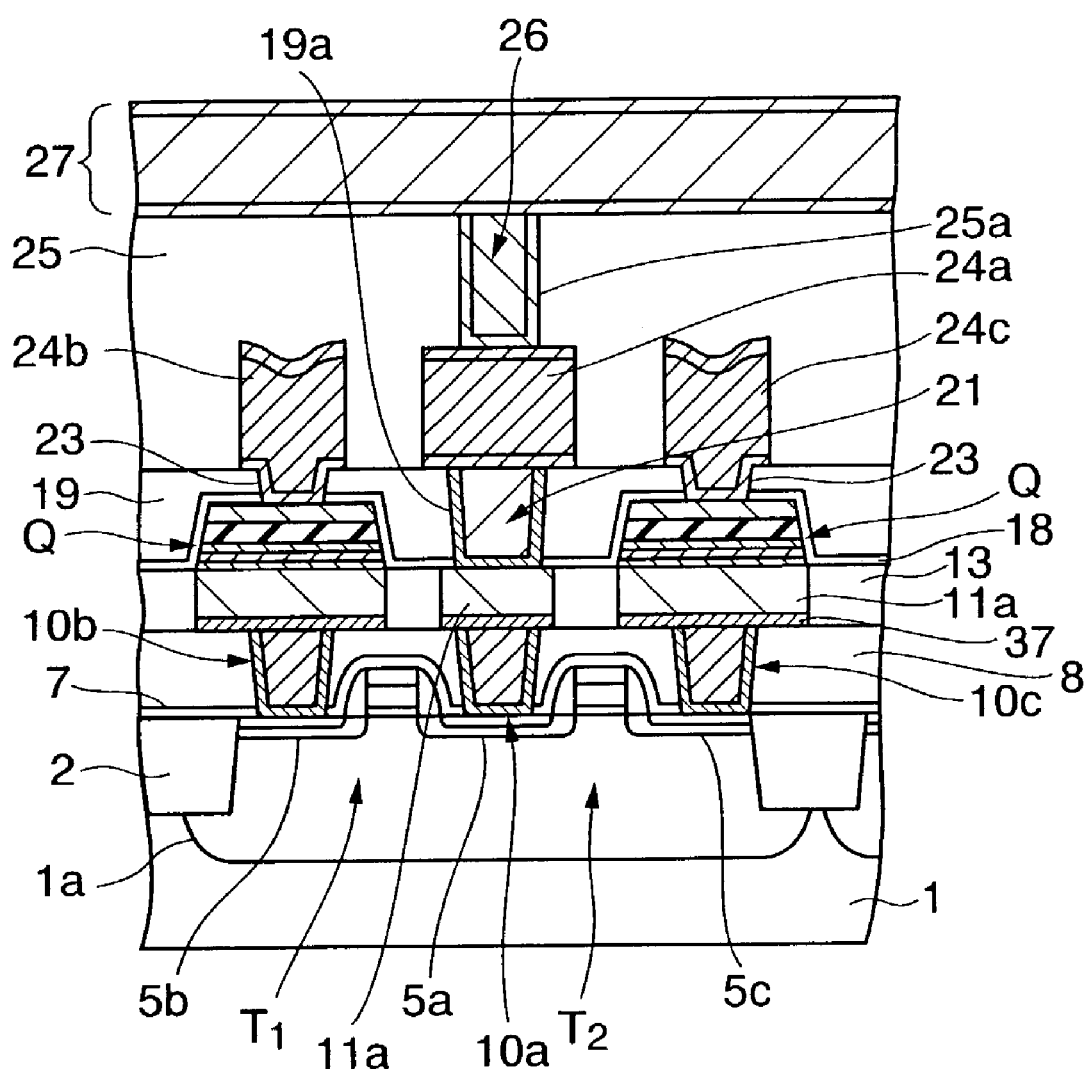
FIG. 13 is a sectional view showing another semiconductor device according to the seventh embodiment of the present invention.

Accordingly, as shown in FIG. 13, the clearance is never formed under the island-like oxygen-barrier metal layers 11a that are formed on not only the second and third conductive plugs 10b, 10c but also the first conductive plug 10a. As a result, the first to third conductive plugs 10a to 10c are not oxidized in the annealing in the oxygen atmosphere. If the clearance is generated under the island-like oxygen-barrier metal layers 11a, it is possible that the first to third conductive plugs 10a to 10c are oxidized through the clearance.

Eighth Embodiment

In the above embodiment, the steps of patterning the oxygen-barrier metal layers 11 or 11a to leave on the second and third conductive plugs 10b, 10c and their peripheral areas like the island. The hard masks $M_1$, $M_2$ may be employed upon patterning the oxygen-barrier metal layers 11 or 11a.

In the condition of which titanium nitride is employed as the material of the hard masks $M_1$, $M_2$, it may be considered that, since the hard masks are formed as the conductive mask, such hard masks are not removed to leave as it is after the patterning of the oxygen-barrier metal layers 11 or 11a. However, the titanium nitride is oxidized by the oxygen annealing, which is applied to form the capacitor, and thus its resistance is increased higher. Hence, it is not preferable to leave the titanium nitride as it is. Therefore, after the oxygen-barrier metal layers 11 or 11a are patterned, the hard masks $M_1$, $M_2$ made of titanium nitride are removed by the wet etching using ammonium peroxide, for example.

However, as explained in the first and second embodiments, after the oxygen-barrier metal layers 11 or 11a are patterned, a part of both the tungsten layer 9b constituting the first conductive plug 10a and the glue layer 9a made of titanium nitride/titanium is exposed from the first interlayer insulating layer 8. Therefore, since the titanium nitride constituting the first conductive plug 10a is also etched simultaneously when the hard masks $M_1$, $M_2$ made of titanium nitride are removed, a recess is generated in the first conductive plug 10a. Since the insulating material is filled in the recess, it is possible to increase the resistance of the first conductive plug 10a.

As a result, in the present embodiment, memory cell forming steps of employing a new method of removing the hard masks after the patterning of the oxygen-barrier metal layers 11 or 11a will be explained hereunder.

FIGS. 14A to 14G are sectional views showing steps of manufacturing a semiconductor device according to an eighth embodiment of the present invention.

Figure 14A:
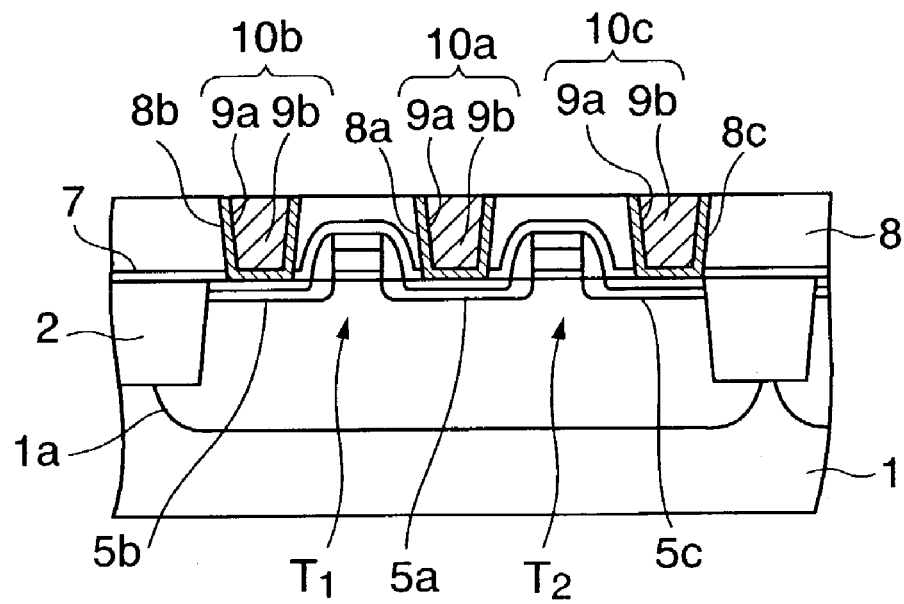
FIGS. 14A to 14G are sectional views showing steps of manufacturing a semiconductor device according to an eighth embodiment of the present invention.

Next, steps required until a structure shown in FIG. 14A is formed will be explained hereunder.

First, in compliance with the steps shown in the first embodiment, the MOS transistors $T_1$, $T_2$ are formed on the silicon substrate 1, and then the cover layer 7, the first interlayer insulating layer 8, and the first to third conductive plugs 10a to 10c are formed. After this, the first interlayer insulating layer 8 is exposed to the nitrogen plasma atmosphere at the substrate temperature of 350° C. for 120 second.

Figure 14B:
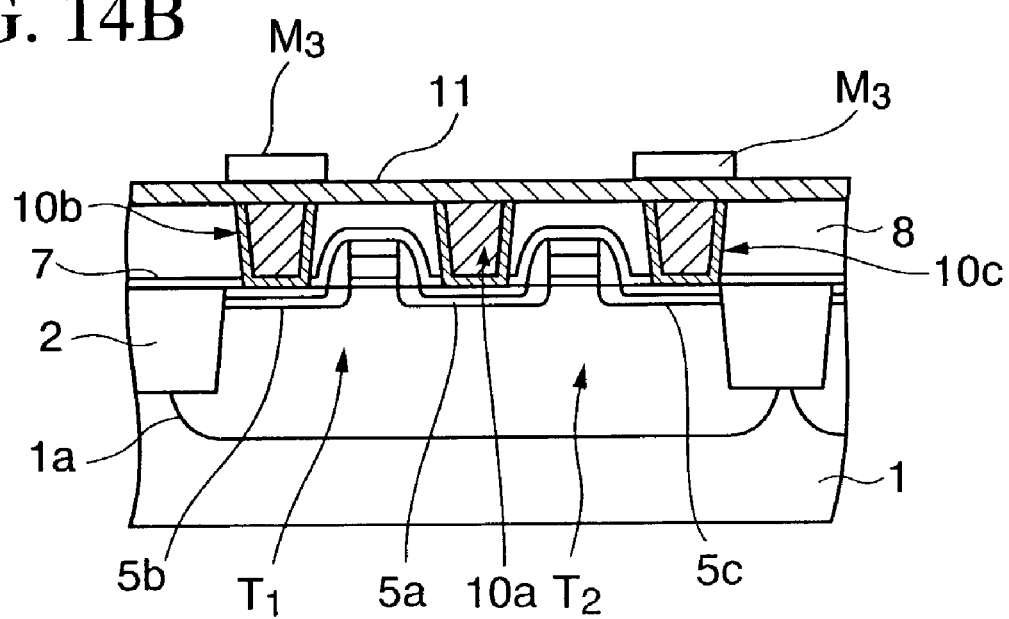

Then, as shown in FIG. 14B, the iridium layer is formed as the conductive oxygen-barrier metal layer 11 on the first to third conductive plugs 10a to 10c and the first interlayer insulating layer 8 by the sputter. The iridium layer is formed to have a thickness of 200 nm, for example.

Then, masks $M_3$ made of titanium nitride are formed on the oxygen-barrier metal layer 11 over the second and third conductive plugs 10b, 10c and their peripheral areas. A titanium nitride (TiN) layer of 200 nm thickness is formed on the oxygen-barrier metal layer 11 and then is left as the masks $M_3$ on the second and third conductive plugs 10b, 10c and their peripheral areas by etching the TiN layer while using resist patterns (not shown). In this case, the TiN layer is etched by using $BCl_3$ and $Cl_2$. Then, the resist patterns are removed.

Figure 14C:
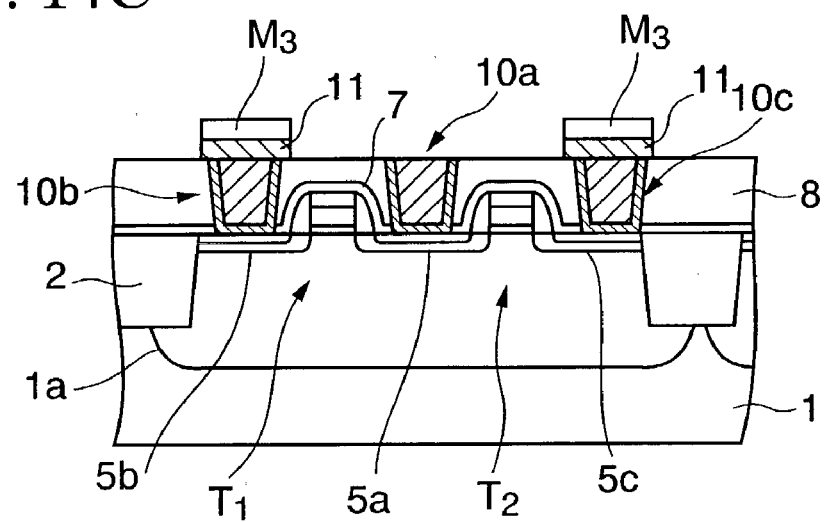

Then, as shown in FIG. 14C, the oxygen-barrier metal layer 11 is etched in the region that is not covered with the masks $M_3$. Thus, the oxygen-barrier metal layer 11 is left like the island on the second and third conductive plugs 10b, 10c and their peripheral areas. The first conductive plug 10a is exposed by the etching of the oxygen-barrier metal layer 11.

The etching of the oxygen-barrier metal layer 11 made of iridium is executed by using the ICP plasma etching equipment. The electric power of 800 W is applied to the coil antenna arranged at the upper portion in the chamber of the ICP plasma etching equipment, and the bias power of 700 W is applied to the stage on which the wafer is loaded in the chamber. Also, the pressure in the chamber is set to 0.4 Pa, and the stage temperature is set to 400° C. Also, as the etching gas of the oxygen-barrier metal layer 11, HBr and $O_2$ are introduced into the chamber at flow rates of 10 sccm and 40 sccm respectively. Also, after the etching of the oxygen-barrier metal layer 11 is completed, the over-etching is carried out for a time, a length of which is equal to the etching time, not to leave the oxygen-barrier metal layer 11 in the region except the second and third conductive plugs 10b, 10c and their peripheral areas.

Figure 14D:
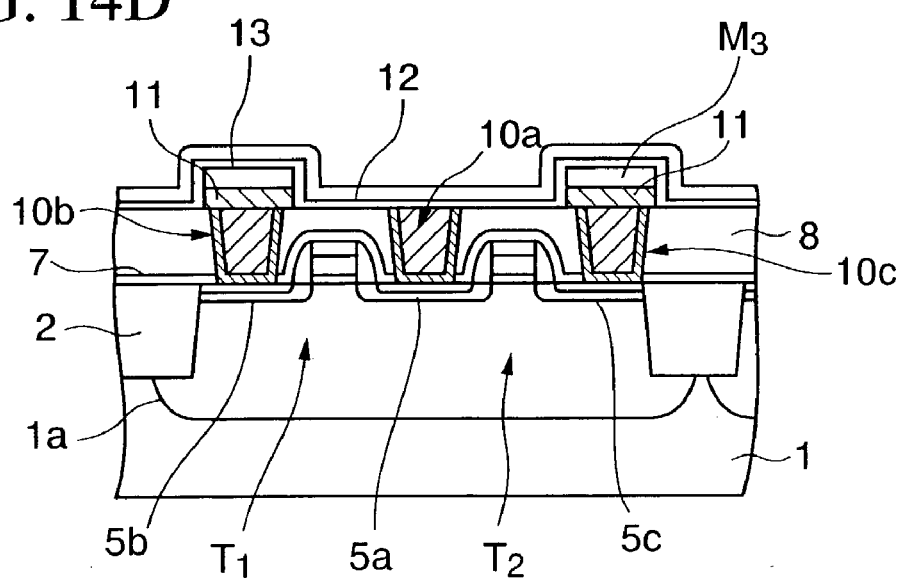

Then, as shown in FIG. 14D, the SiON layer or the $Si_3N_4$ layer of 100 nm thickness, for example, is formed as the oxidation-preventing insulating layer 12 on the masks $M_3$, the oxygen-barrier metal layer 11, the first interlayer insulating layer 8, and the first conductive plug 10a by the CVD method. Then, the insulating adhesion layer 13 is formed on the oxidation-preventing insulating layer 12. As the insulating adhesion layer 13, the SiO$_2$ layer of 100 nm thickness is formed by the CVD method using TEOS, for example.

Figure 14E:
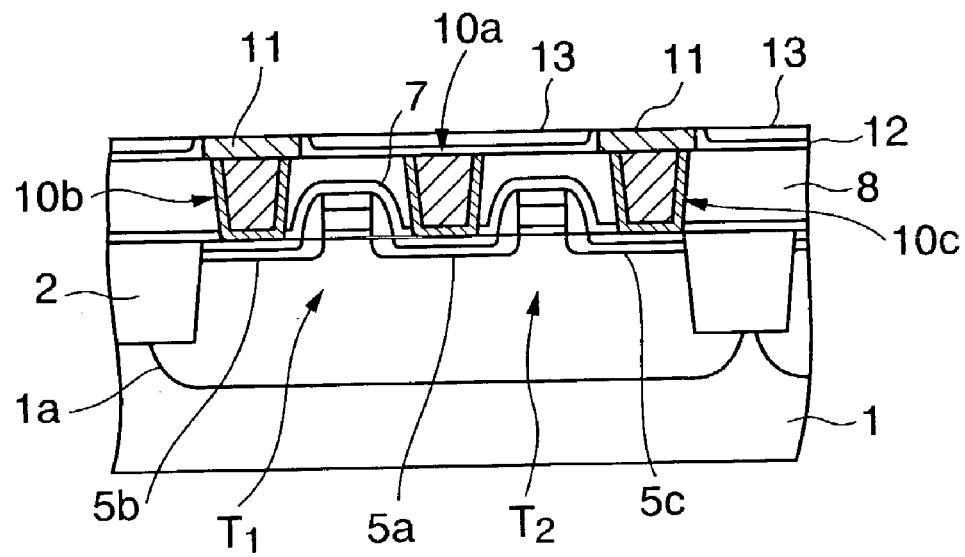

Then, as shown in FIG. 14E, the insulating adhesion layer 13, the oxidation-preventing insulating layer 12, and the masks M$_1$ are polished by the CMP method while causing the oxygen-barrier metal layer 11 to function as the stopper layer. Hence, the masks are removed and an upper surface of the oxygen-barrier metal layer 11 is exposed. In this case, the upper surfaces of the oxygen-barrier metal layer 11, the insulating adhesion layer 13, and the oxidation-preventing insulating layer 12 are made flat substantially.

This CMP method is executed by using the polishing machine. Also, a product name IC1010 manufactured by Rodel Nitta Company, for example, is used as the abrasive cloth, and SS-25E manufactured by Cabbot Corporation, for example, is used as the slurry. The polishing time is 70second, for example.

Figure 14F:
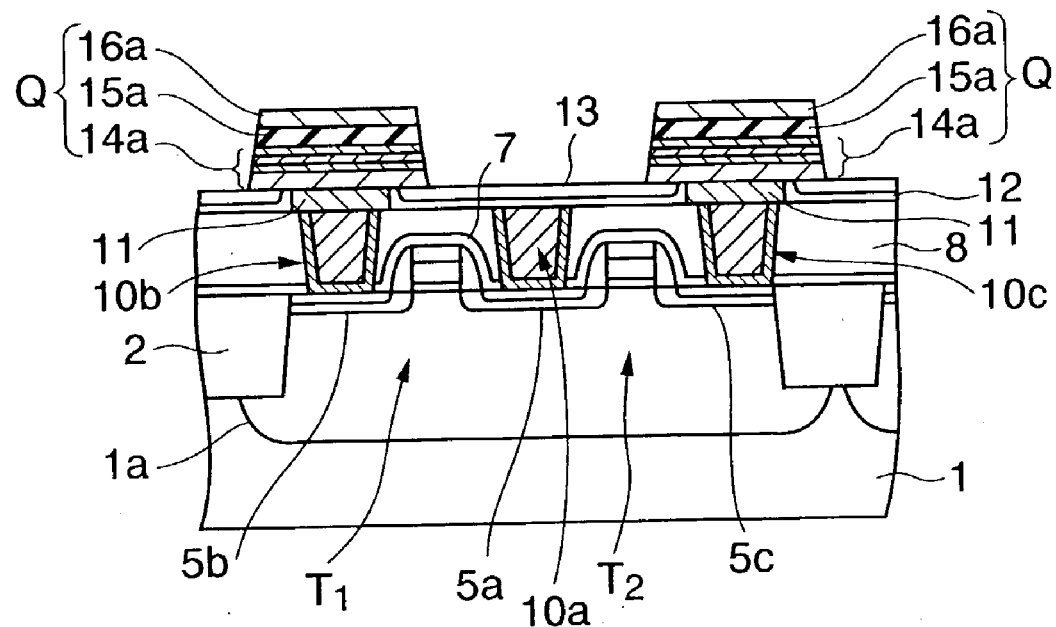

Then, as shown in FIG. 14F, in compliance with the steps shown in the first embodiment, the capacitors Q are formed on the oxidation-preventing insulating layer 12, and the insulating adhesion layer 13 on the island-like oxygen-barrier metal layers 11. The capacitor Q consists of the lower electrode 14a, the ferroelectric layer 15a, and the upper electrode 16a. The lower electrode 14a is connected to the conductive plug 10b (10c) via the island-like oxygen-barrier metal layer 11.

Figure 14G:
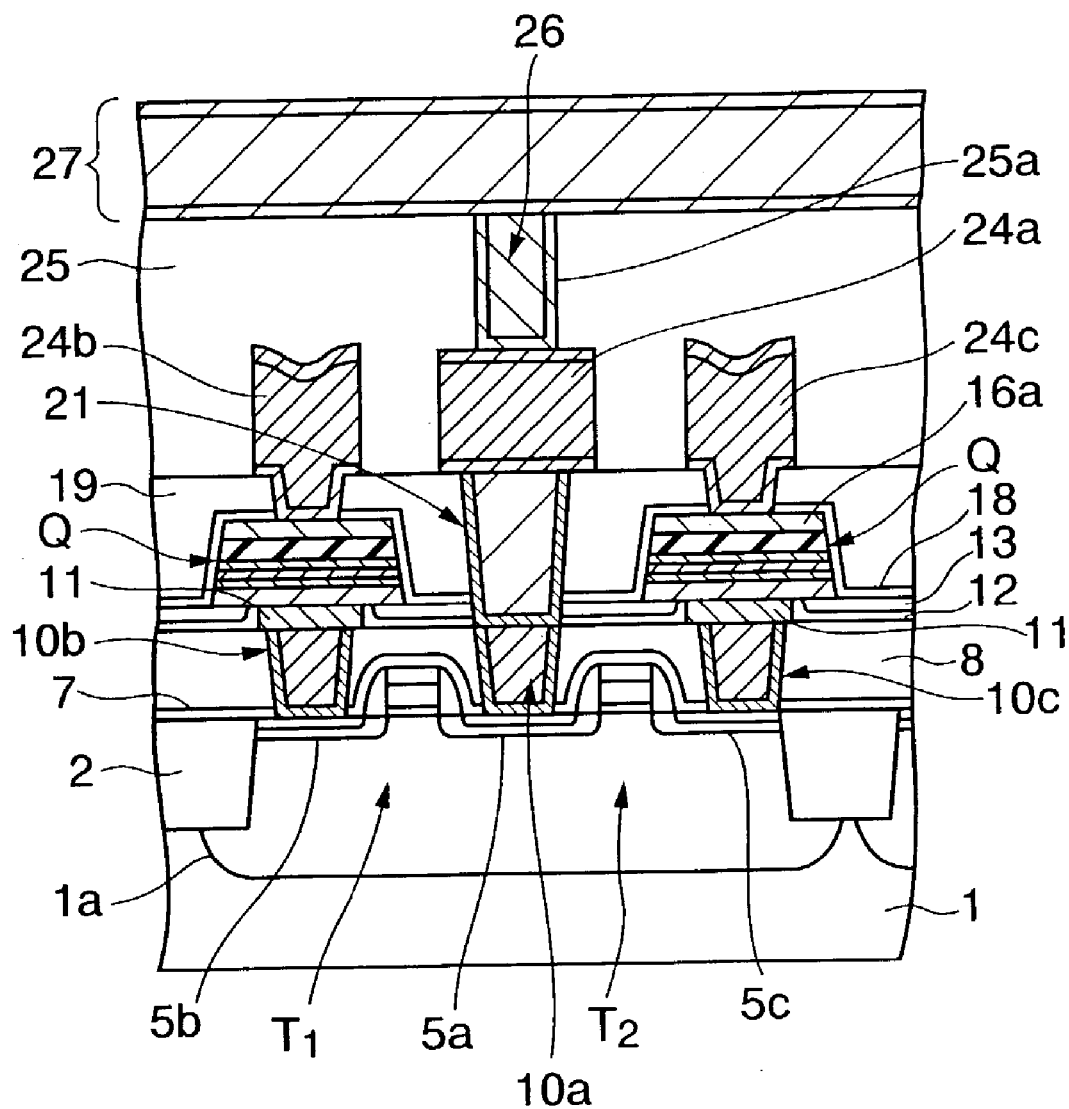

After this, as shown in FIG. 14G, in compliance with the same steps as the first embodiment, the capacitor protection layer 18, the second interlayer insulating layer 19, the fourth conductive plug 21, the conductive pad 24a, the first-layer metal wirings 24b, 24c, the third interlayer insulating layer 25, the fifth conductive plug 26, the bit line 27, etc. are formed. In this case, in FIG. 14G, the same symbols as those in FIG. 2O denote the same elements.

As described above, according to the present invention, the oxygen-barrier metal layer 11 is patterned by using the masks M$_3$ formed over the second and third conductive plugs 10b, 10c, then the oxidation-preventing insulating layer 12 and the insulating adhesion layer 13 are formed on the masks M$_3$, the first interlayer insulating layer 8, and the first conductive plug 10 g without removal of the masks M$_3$, and then the masks M$_3$ are removed by the polishing executed when the oxidation-preventing insulating layer 12 and the insulating adhesion layer 13 are to be polished.

Therefore, TiN constituting the glue layer 9a of the first conductive plug 10a is not etched in removing the masks M$_3$. As a result, the first conductive plug 10a does not suffer damage in removing the masks M$_3$, and thus the first conductive plug 10a together with the second and third conductive plugs 10b, 10c connect the impurity diffusion region 5a to the bit line 27 on a via-to-via basis. In addition, the independent step of removing the masks M$_3$ only is omitted and thus throughput is improved.

In the meanwhile, as set forth in Patent Application Publication (KOKAI) Hei 11-126778, if the masks M$_3$ is removed by the CMP method in the state shown in-FIG. 14C immediately after the oxygen-barrier metal layer 11 is patterned, the moisture enters into the surface of the first interlayer insulating layer 8 to cause the first conductive plug 10a to oxidize. Therefore, such situation is not preferable.

In this case, material of the masks M$_3$ employed to pattern the oxygen-barrier metal layer 11 is not limited to titanium nitride. The double-layered structure obtained by forming titanium nitride (TiN) and silicon oxide (SiO$_2$) sequentially may be employed, or such masks may be formed of other material.

Ninth Embodiment

Like the eighth embodiment, removal of the mask M$_2$ shown in the second embodiment may be executed at the same time when the planarization of the oxidation-preventing insulating layer 12 and the insulating adhesive layer 13 is executed by the CMP method after the oxidation-preventing insulating layer 12 and the insulating adhesive layer 13 are formed on the mask M$_2$ and the first interlayer insulating layer 8.

Therefore, steps of forming a hard mask having a double-layered structure consisting of a TiN layer and an SiO$_2$ layer as a mask used to pattern an oxygen-barrier metal layer 11a and then removing such hard mask by the CMP method will be explained hereunder.

Figure 17:
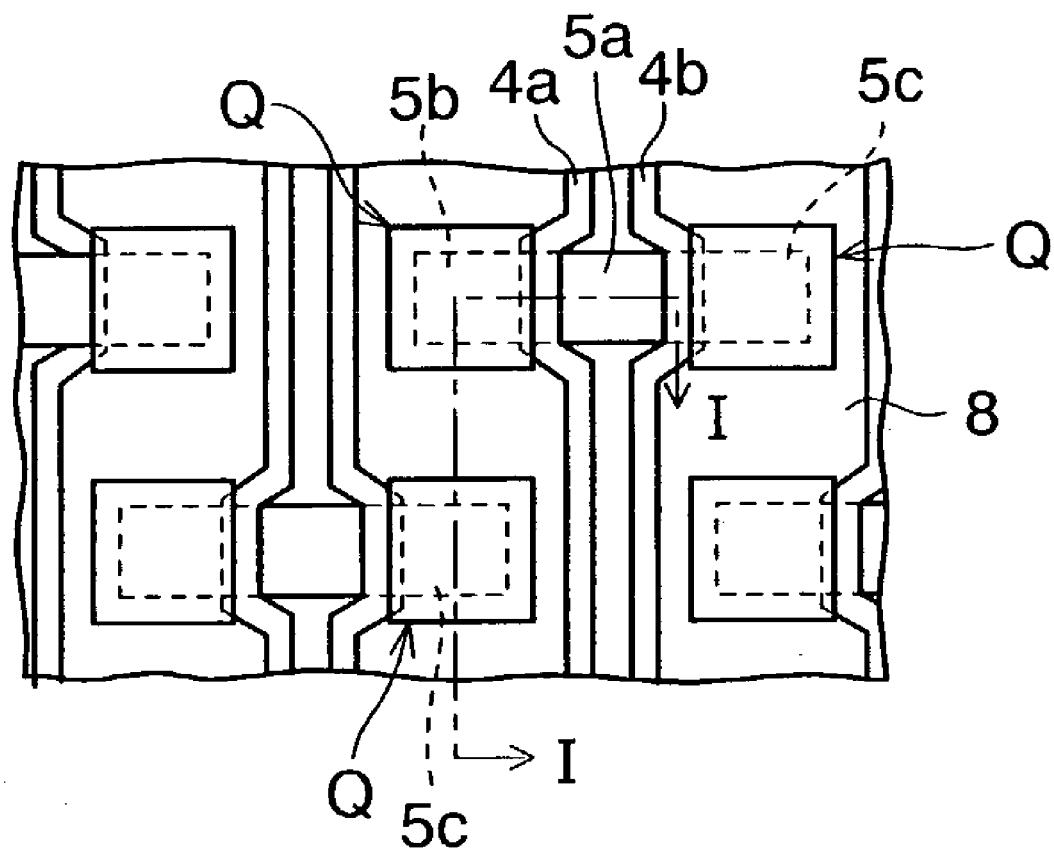
FIG. 17 is a plane view showing memory cell region in a semiconductor device according to embodiment of the present invention.

FIGS. 15A to 15D are sectional views showing steps of manufacturing a semiconductor device according to a ninth embodiment of the present invention, which are taken along a I—I line in a plan view of the memory cell region shown in FIG. 17. That is, FIGS. 15A to 15D show steps of forming the island-like oxygen-barrier metal layer 11a under the capacitor Q, which is formed on one side of one p-type well 1a, and two capacitors Q, which are positioned adjacently to each other in the extending direction of the gate electrodes (word lines) 4a, 4b, respectively.

Figure 15A:
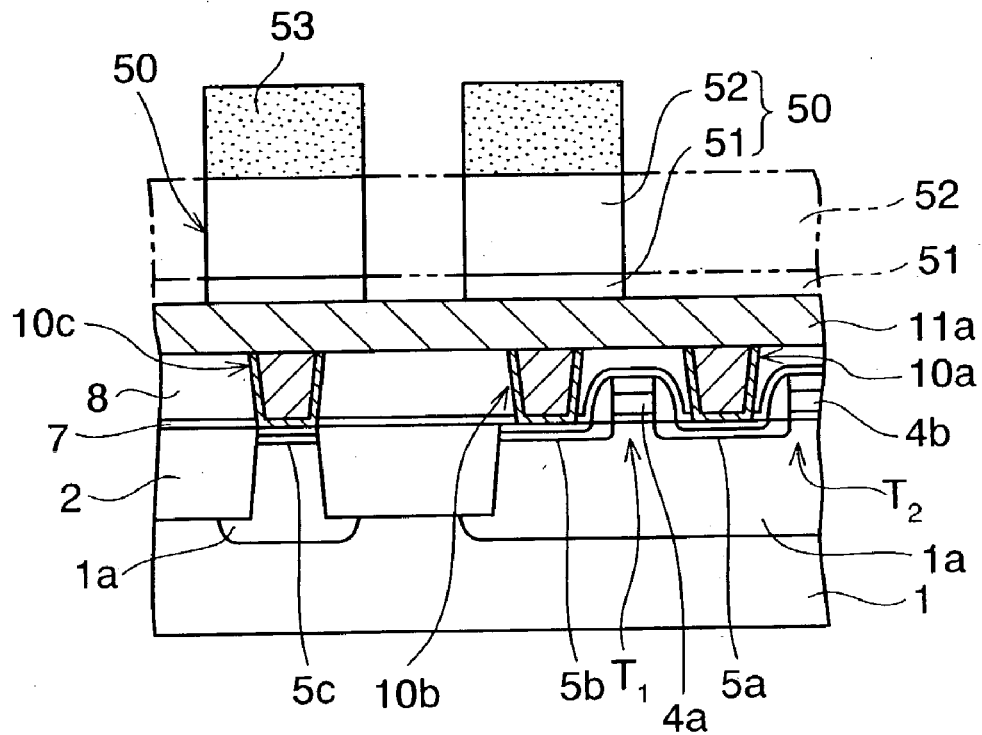
FIGS. 15A to 15D are sectional views showing steps of manufacturing a semiconductor device according to a ninth embodiment of the present invention.

Steps required until a structure shown in FIG. 15A is formed will be explained hereunder.

First, in compliance with the steps shown in the first embodiment, the MOS transistors T$_1$, T$_2$ are formed on the silicon substrate 1, and then the cover layer 7 for covering the MOS transistors T$_1$, T$_2$, the first interlayer insulating layer 8, the first to third conductive plugs 10a to 10c are formed sequentially. Then, the first interlayer insulating layer 8 is exposed to the nitrogen plasma atmosphere at the substrate temperature of 350° C. for 120 sec.

Then, the iridium (Ir) layer is formed as the conductive oxygen-barrier metal layer 11a on the first to third conductive plugs 10a to 10c and on the first interlayer insulating layer 8 by the sputter. The Ir layer is formed to have a thickness of 400 nm, for example.

Then, a TiN layer 51 of 200 nm thickness is formed on the oxygen-barrier metal layer 11a by the sputter method. Then, an SiO$_2$ layer 52 of 1000 nm thickness is formed on the TiN layer 51 by the CVD method using TEOS.

Then, a resist is coated on the SiO$_2$ layer 52, and then resist patterns 53 each having an almost capacitor planar shape are formed over the second and third conductive plugs 10b, 10c and their peripheral areas by exposing/developing the resist. Then, areas of the SiO$_2$ layer 52 and the TiN layer 51, which are not covered with the resist pattern 53, are etched. Thus, the SiO$_2$ layer 52 and the TiN layer 51 being left under the resist patterns 53 are used as a first hard mask 50.

Then, the resist patterns 53 are removed by the oxygen ashing.

Figure 15B:
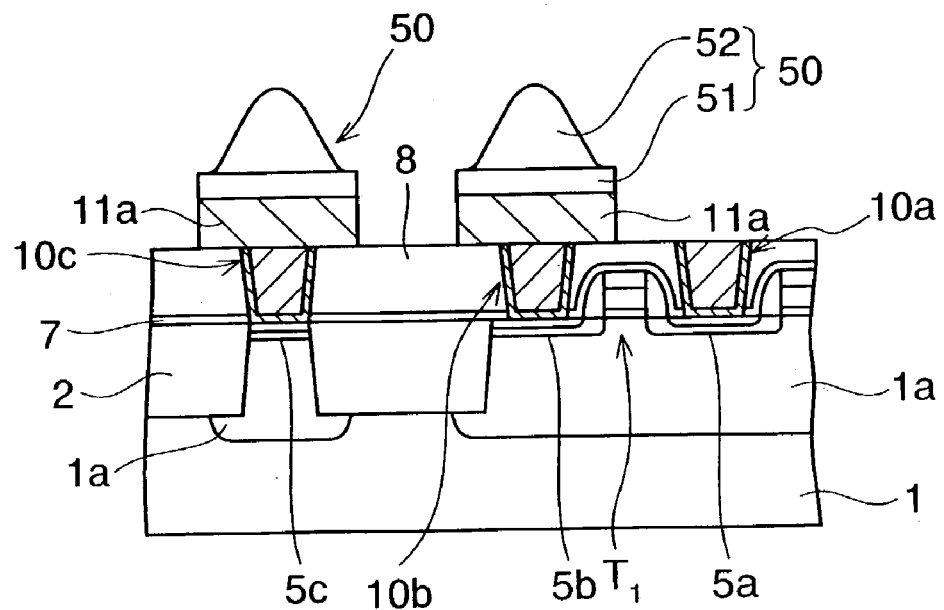

Then, as shown in FIG. 15B, areas of the oxygen barrier metal layer 11a, which are not covered with the first hard mask 50, are etched. Thus, the oxygen-barrier metal layer 11a is left like an island on the second and third conductive plugs 10b, 10c and their peripheral areas. The oxygen-barrier metal layer 11a is patterned by the dry etching using a mixed gas of HBr, O$_2$, and C$_4$F$_8$ while setting the temperature of the stage, on which the silicon substrate 1 is loaded, to 400° C. In this case, the SiO$_2$ layer 52 constituting the first hard mask 50 is also etched into an almost cone shape at the time of such etching.

Figure 15C:
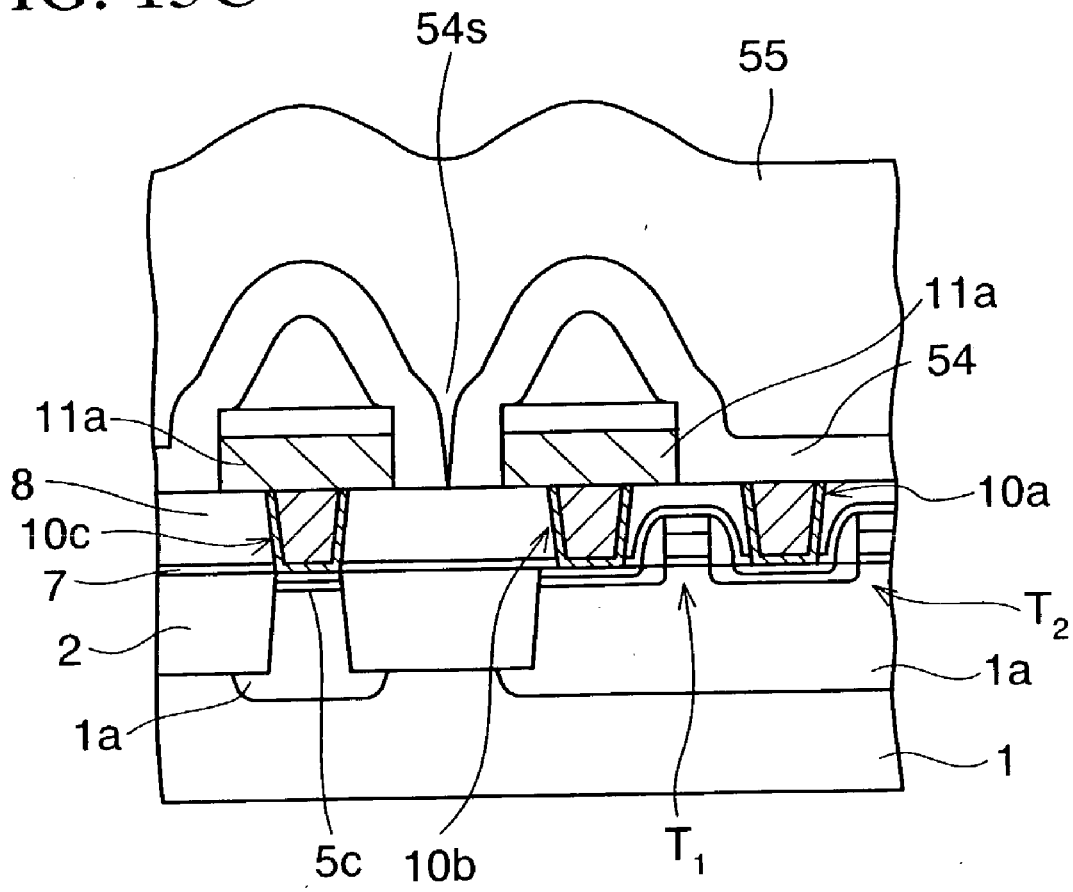
Figure 15D:
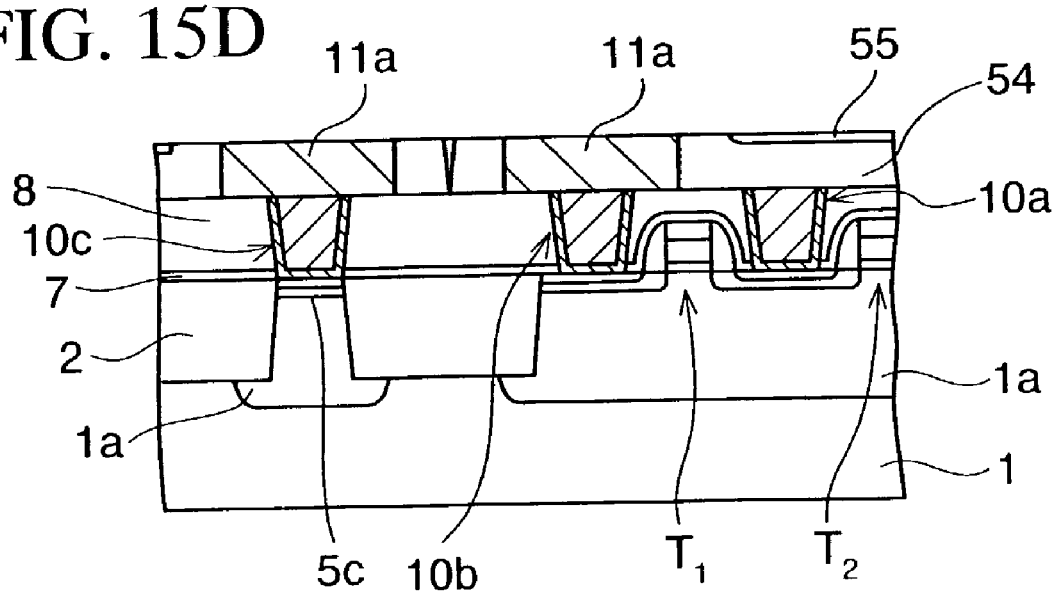

Then, as shown in FIG. 15C, a silicon oxide nitride (SiON) layer or a silicon nitride ($Si_3N_4$) layer of 350 nm thickness is formed as an oxidation-preventing insulating layer 54 on the first hard mask 50, the oxygen-barrier metal layer 11a, and the first interlayer insulating layer 8 by the CVD method. The SiON layer is formed by the CVD method using silane, ammonia, and oxygen, for example. Also, the $Si_3N_4$ layer is formed by the CVD method using silane and ammonia, for example.

Then, an $SiO_2$ layer of 600 nm thickness is formed as a sacrifice oxide layer 55 on the oxidation-preventing insulating layer 54 by the CVD method using TEOS as the growth gas. In this case, in the present embodiment, the insulating adhesive layer formed in the above embodiments is not formed on the oxidation-preventing insulating layer.

Then, as shown in FIG. 15B, the sacrifice oxide layer 55, the oxidation-preventing insulating layer 54, and the first hard mask 50 are polished by the CMP method while causing the island-like oxygen-barrier metal layer 11a to act as a stopper layer. Thus, the first hard mask 50 is removed and thus an upper surface of the oxygen-barrier metal layer 11a is exposed. Then, the oxidation-preventing insulating layer 54 is left on the first interlayer insulating layer 8 and the first conductive plug 10a on the side of the island-like oxygen-barrier metal layer 11a. Also, the thin sacrifice oxide layer 55 is left on the oxidation-preventing insulating layer 54. In this case, upper surfaces of the oxygen-barrier metal layer 11a, the oxidation-preventing insulating layer 54, and the sacrifice oxide layer 55 are made substantially flat. The abrasive cloth and the slurry shown in the eighth embodiment are employed at the time of such polishing.

Then, the capacitors are formed by the steps shown in the second embodiment, but their details will be omitted herein.

As described above, the first hard mask 50 used only for the patterning of the island-like oxygen-barrier metal layer 11a, which is used as a part of the capacitor lower electrode, is removed at the time of the planarization of the oxidation-preventing insulating layer 54. Therefore, like the eighth embodiment, the isolated step of removing only the first hard mask 50 is eliminated.

Meanwhile, if an interval between the capacitors, which are arranged adjacently in the extending direction of the gate electrodes (word lines) 4a, 4b, is narrow such as about 1 µm and the oxygen-barrier metal layer 11a is thick such as about 400 nm, for example, an aspect ratio of a space between the island-like oxygen-barrier metal layers 11a and the first hard masks 50 becomes large, as shown in FIG. 15C. Thus, the space is not perfectly buried by the oxidation-preventing insulating layer 54, and thus a narrow clearance 54s is generated in the oxidation-preventing insulating layer 54. Since the oxidation-preventing insulating layer 54 becomes thin under the clearance 54s, the following disadvantage is caused in the later capacitor forming steps.

In this case, if the interval between the capacitors Q shown in FIG. 17 is wide, the clearance 54s shown in FIG. 15C is not generated. Hence, there is caused no trouble to execute both the removal of the first hard masks 50 having the double-layered structure and the planarization of the oxidation-preventing insulating layer 54 simultaneously by the CMP method.

Therefore, the capacitor forming steps executed after the first hard masks 50 is removed will be explained simply hereunder.

Figure 16A:
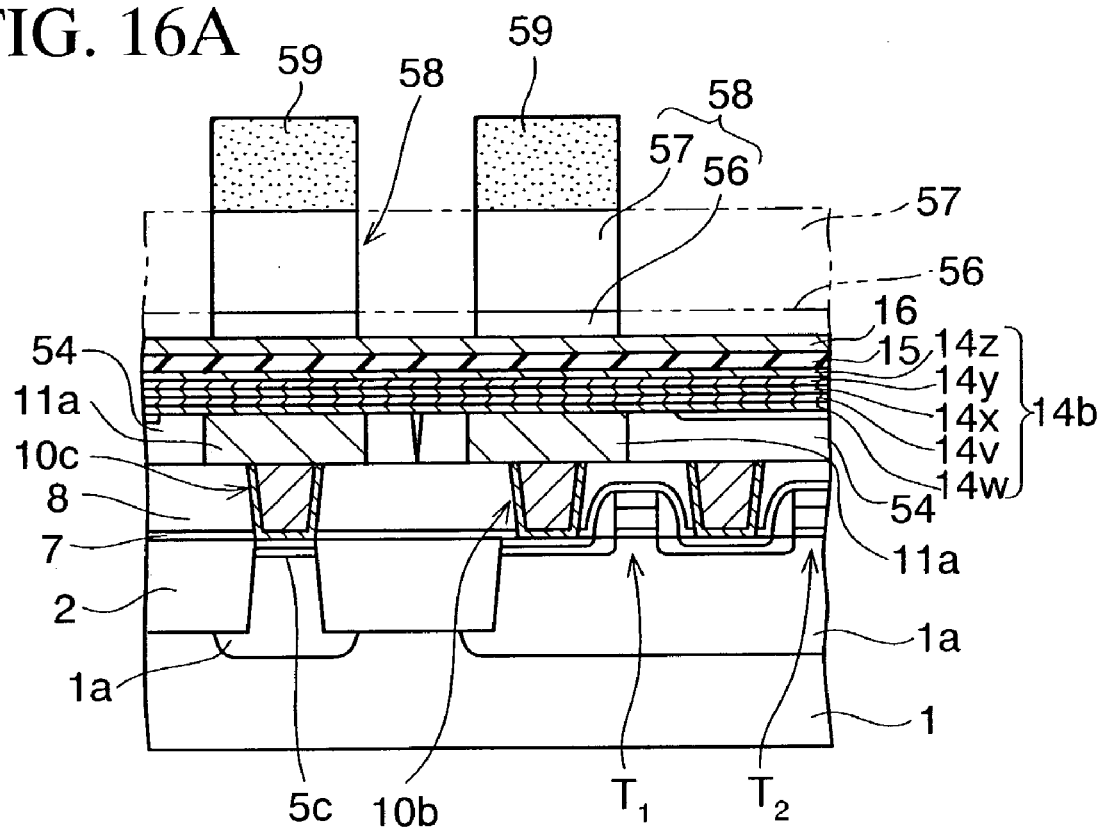
FIGS. 16A to 16C are sectional views showing steps of manufacturing a semiconductor device in which an interval between the capacitors is in narrow according to a comparative example.

First, as shown in FIG. 16A, a first conductive layer 14b is formed on the island-like oxygen-barrier metal layer 11a, the oxidation-preventing insulating layer 54, and the sacrifice oxide layer 55. As the first conductive layer 14b, a laminated structure unlike the second embodiment is formed. For example, an Ir layer 14w of 30 nm thickness, an $IrO_2$ layer 14x of about 30 nm thickness, a Pt layer 14v of 15 nm thickness, a PtO layer 14y of about 25 nm thickness, and a Pt layer 14z of about 50 nm thickness are formed sequentially by the sputter.

In this case, the oxidation-preventing insulating layer 54 is annealed in the argon atmosphere to prevent the peeling-off of the layer, for example, before or after the formation of the first conductive layer 14b.

Then, a ferroelectric layer 15 and a second conductive layer 16 are formed on the first conductive layer 14b. As the ferroelectric layer 15, a PZT layer of 140 to 200 nm thickness is formed by the sputter method. Then, the ferroelectric layer 15 is annealed in the oxygen atmosphere to crystallize the ferroelectric layer 15. In this case, as the growth method and the material of the ferroelectric layer 15, the growth method and the material shown in the second embodiment may be employed in addition to this.

Then, a TiN layer 56 of 200 nm thickness is formed on the second conductive layer 16 by the PVD method. Then, an $SiO_2$ layer 57 of 900 nm thickness is formed on the TiN layer 56 by the CVD method using TEOS.

Then, a resist is coated on the $SiO_2$ layer 57. Then, resist patterns 59 each having an almost capacitor planar shape are formed over the second and third conductive plugs 10b, 10c and their peripheral areas by exposing/developing the resist. Then, areas of the $SiO_2$ layer 57 and the TiN layer 56, which are not covered with the resist pattern 59, are etched. Thus, the $SiO_2$ layer 57 and the TiN layer 56 being left under the resist patterns 59 are used as a second hard mask 58. In this case, the $SiO_2$ layer 57 is etched by using a mixed gas of $C_4F_8$, Ar, and $CF_4$. Also, the TiN layer 56 is etched by using a mixed gas of $BCl_3$ and $Cl_2$, or other gas.

Then, the resist patterns 59 are removed by the oxygen ashing.

Figure 16B:
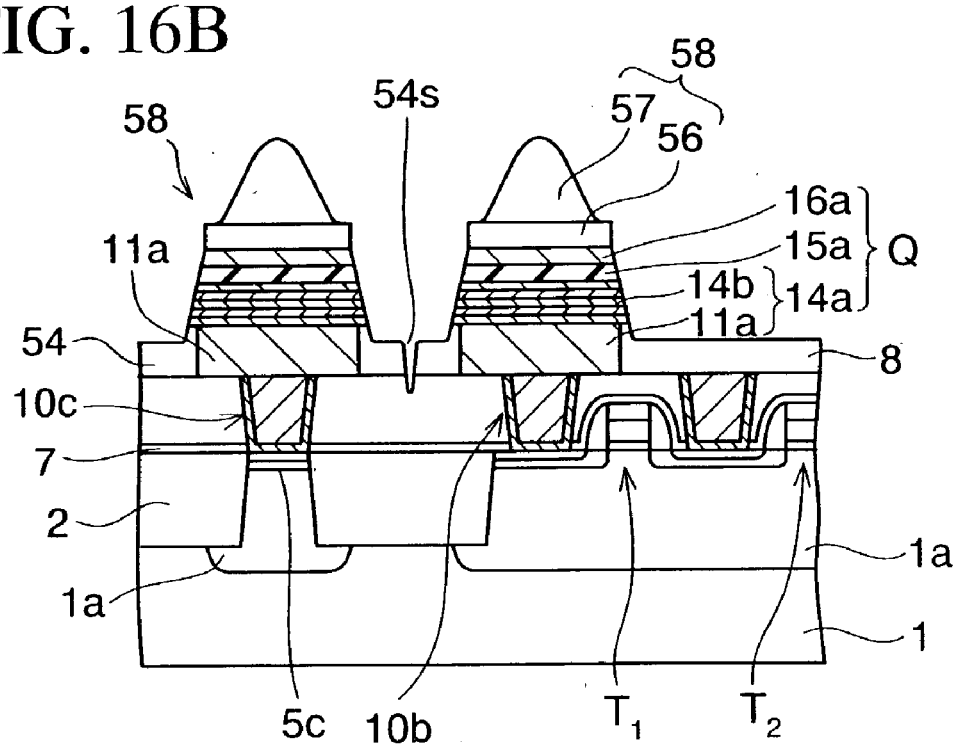

Then, as shown in FIG. 16B, the second conductive layer 16, the ferroelectric layer 15, and the first conductive layer 14b in areas that are not covered with the second hard mask 58 are etched sequentially. In this case, all the second conductive layer 16, the ferroelectric layer 15, and the first conductive layer 14b are etched by using the ICP plasma etching equipment. The substrate temperature at the time of etching is set to 400° C. Also, a mixed gas consisting of HBr and $O_2$ is used as the etching gas for the first conductive layer 14b and the second conductive layer 16. Also, a mixed gas consisting of $Cl_2$ and Ar is used as the etching gas for the ferroelectric layer 15.

Thus, the capacitors Q connected to the second and third conductive plugs 10b, 10c respectively are formed on the first interlayer insulating layer 8. The lower electrode 14a of the capacitor Q is constructed by the first conductive layer 14b and the oxygen-barrier metal layer 11a. Also, the dielectric layer 15a of the capacitor Q is constructed by the ferroelectric layer 15, and the upper electrode 16a of the capacitor Q is constructed by the second conductive layer 16.

In this case, the $SiO_2$ layer 57 constituting the second hard mask 58 is also etched into an almost cone shape at the time of such etching.

Figure 16C:
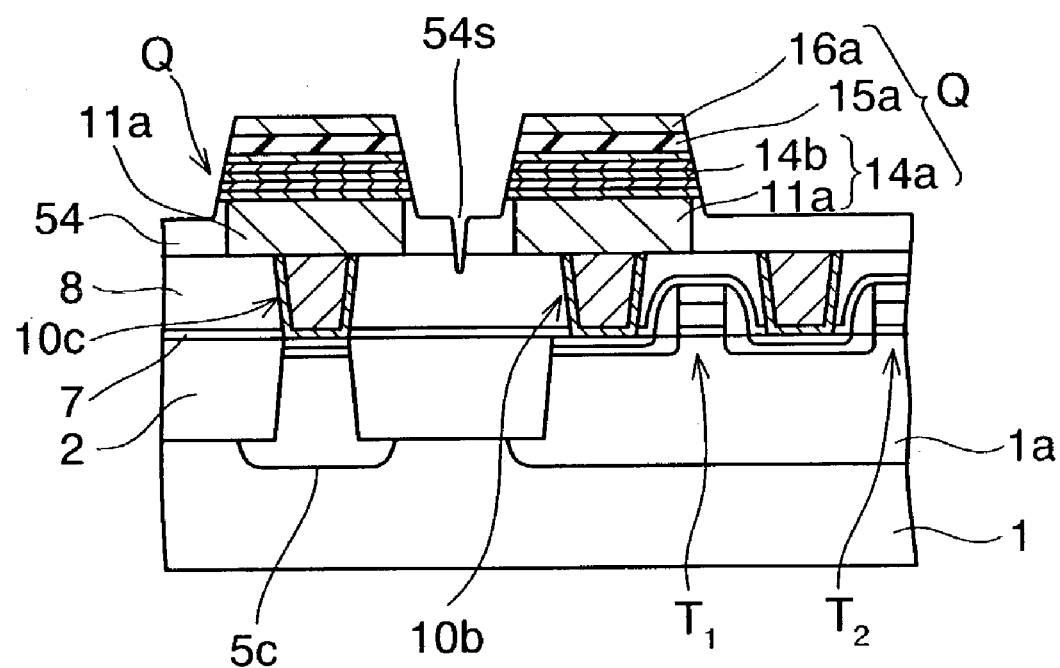

Then, as shown in FIG. 16C, the $SiO_2$ layer 57 constituting the second hard mask 58 is removed by the two-frequency reactive ion etching (two-frequency RIE) method using a mixed gas of $C_4F_8$, Ar, and $O_2$. At the time of etching of the $SiO_2$ layer 57, the oxidation-preventing insulating layer 54 consisting of the SiON layer and the $Si_3N_4$ layer functions as the etching stopper layer. Then, the TiN layer 56 of the second hard mask 58 is removed by the wet etching using a mixed chemical consisting of hydrogen peroxide and ammonia.

Then, in order to recover the damage of the ferroelectric layer 15 caused by the etching, the recovery annealing of the capacitor Q is executed. The recovery annealing in this case is executed at the substrate temperature of 650° C. for 60 min in the atmosphere containing the oxygen, for example.

Then, steps goes to the steps of forming the second interlayer insulating layer, etc. like the above embodiments, but their details will be omitted herein.

By the way, as shown in FIG. 15C, if the interval between the patterns each of which is composed of the island-like oxygen-barrier metal layer 11a and the first hard mask 50 becomes narrow, the clearance 54s is formed in the oxidation-preventing insulating layer 54 formed between such patterns. Thus, as shown in FIG. 16B, a thickness of the oxidation-preventing insulating layer 54 is reduced when the second conductive layer 16, the ferroelectric layer 15, and the first conductive layer 14b are etched, and thus the first interlayer insulating layer 8 is etched through the clearance 54s to generate an concave portion. In addition, a depth of such concave portion is increased much more through the clearance 54s when the $SiO_2$ layer 57 of the second hard mask 58 is removed.

If the depth of such concave portion in the first interlayer insulating layer 8 is increased, the oxygen enters into the first interlayer insulating layer 8 from the concave portion during the recovery annealing executed after the patterning of the capacitors Q, and then the oxygen penetrates through the first interlayer insulating layer 8. Thus, the second and third conductive plugs 10b, 10c made of tungsten are oxidized, and further the MOS transistors T1, T2 are deteriorated.

On the contrary, it may be thought of that the aspect ration of the space between the island-like oxygen barrier metal layers 11a is reduced by thinning the oxygen-barrier metal layer 11a to prevent the generation of the clearance 54s.

However, the selective etching ratio of the $SiO_2$ layer 52 constituting the first hard mask 50 is small such as about 5 to 7 in comparison with the SiON layer or the $Si_3N_4$ layer constituting the oxidation-preventing insulating layer 54 made of $SiO_2$. Therefore, the oxidation-preventing insulating layer 54 as well as the first hard mask 50 is etched during the etching of the first hard mask 50, and thus a thickness of the oxidation-preventing insulating layer 54 is reduced by about 150 nm. In addition, the thickness of the oxidation-preventing insulating layer 54 is also reduced by about 100 nm by the overetching that is caused subsequently to the formation of the capacitors Q. In contrast, in order to prevent the oxidation of the first conductive plug 10a by the oxidation-preventing insulating layer 54, the thickness of the oxidation-preventing insulating layer 54 needs about 100 nm with a small margin.

Therefore, the thickness of the oxidation-preventing insulating layer 54 must be formed thick to leave 350 nm after the polishing of the oxidation-preventing insulating layer 54. If the thickness of the oxidation-preventing insulating layer 54 is set to 350 nm, a thickness of the oxygen-barrier metal layer 11a must be set to 350 nm or more with regard to the polishing of the oxidation-preventing insulating layer 54 by the CMP method.

In this case, in the first to eighth embodiments, respective thicknesses of the oxidation-preventing insulating layer 12 and the insulating adhesive layer 13 are given by the values obtained in the condition that reduction in thicknesses of such layers are seldom considered.

With the above, if the interval between the capacitors Q is narrowed rather than 1 μm, for example, it is not preferable that the removal of the first hard mask 50 made of inorganic material and the planarization of the oxidation-preventing insulating layer 54 should executed simultaneously.

Therefore, in a next tenth embodiment, a method of removing the first hard mask 50 not to form the concave portion in the first interlayer insulating layer 8 between the capacitors Q executed when the interval between the capacitors Q becomes narrower than 1 μm will be explained hereunder.

Tenth Embodiment

FIGS. 18A to 18G are sectional views showing steps of manufacturing a semiconductor device according to a tenth embodiment of the present invention, which are taken along a I—I line in FIG. 17.

Figure 18A:
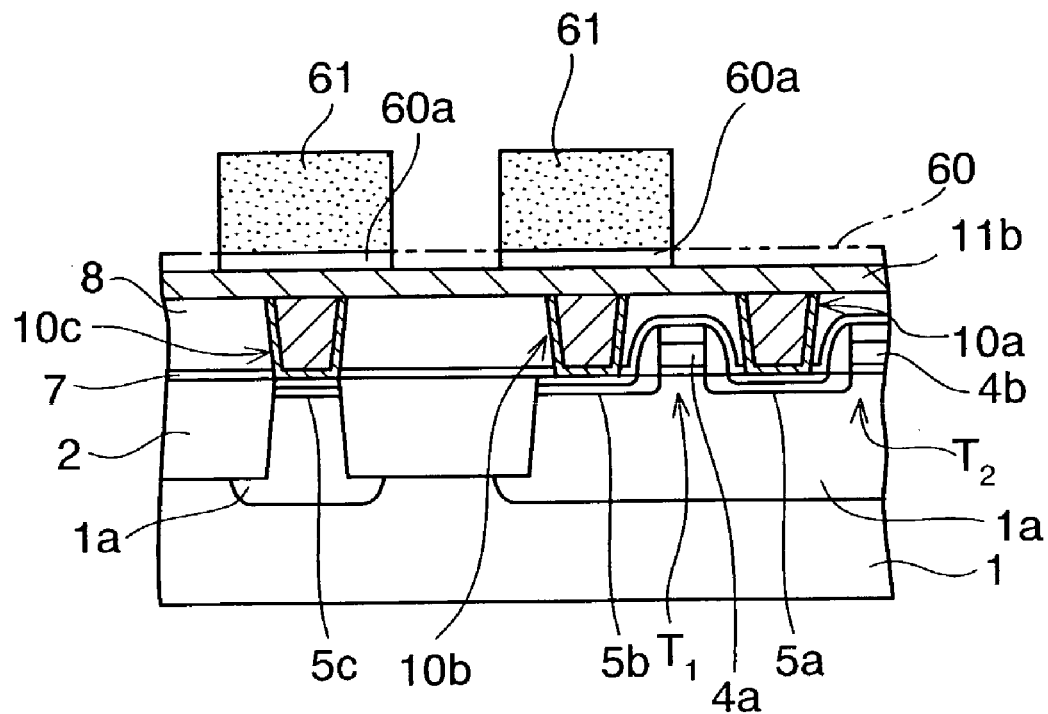
FIGS. 18A to 18G are sectional views showing steps of manufacturing a semiconductor device according to a tenth embodiment of the present invention.

Steps required until a structure shown in FIG. 18A is formed will be explained hereunder.

First, in compliance with the steps shown in the first embodiment, the MOS transistors $T_1$, $T_2$ are formed on the silicon substrate 1, and then the cover layer 7 for covering the MOS transistors $T_1$, $T_2$, the first interlayer insulating layer 8, the first to third conductive plugs 10a to 10c are formed sequentially. Then, the first interlayer insulating layer 8 is exposed to the nitrogen plasma atmosphere at the substrate temperature of 350° C. for 120 sec.

Then, the iridium layer is formed as a conductive oxygen-barrier metal layer 11b on the first to third conductive plugs 10a to 10c and on the first interlayer insulating layer 8 by the sputter. The iridium layer is formed to have a thickness of 200 nm, for example.

Then, a TiN layer 60 of 100 nm thickness is formed on the oxygen-barrier metal layer 11b by the sputter method.

Then, a resist is coated on the TiN layer 60, and then resist patterns 61 each having an almost capacitor planar shape are formed over the second and third conductive plugs 10b, 10c and their peripheral areas by exposing/developing the resist. Then, areas of the TiN layer 60, which are not covered with the resist pattern 61, are etched. Thus, the TiN layer 60 being left under the resist patterns 61 are used as a first hard mask 60a.

Then, the resist patterns 61 are removed by the oxygen ashing.

Figure 18B:
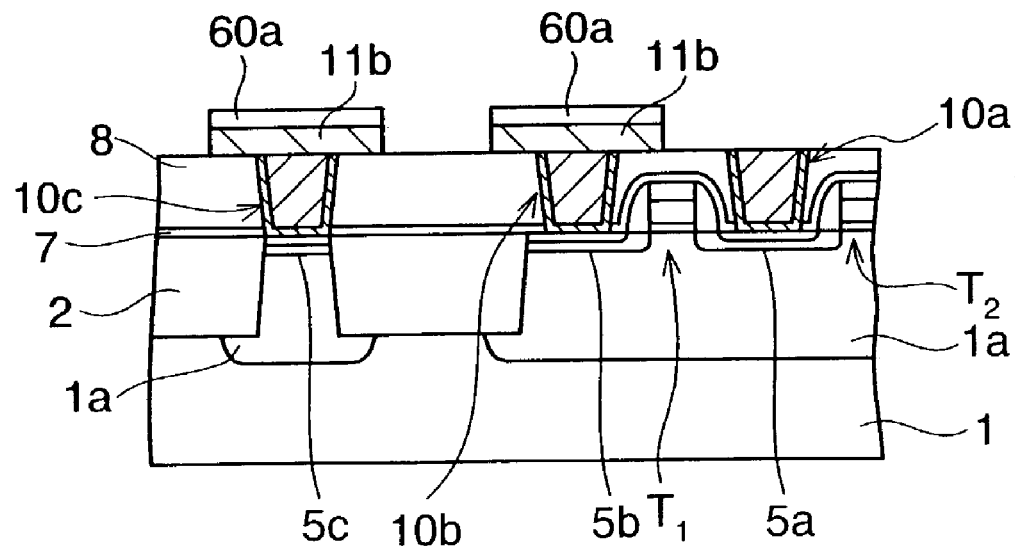

Then, as shown in FIG. 18B, areas of the oxygen barrier metal layer 11b, which are not covered with the first hard mask 60a, are etched. Thus, the oxygen barrier metal layer 11b is left like an island on the second and third conductive plugs 10b, 10c and their peripheral areas. The oxygen-barrier metal layer 11b is patterned by the high-temperature dry etching using a mixed gas of HBr, $O_2$, and $C_4F_8$ while setting the substrate temperature to 400° C. In this case, the $SiO_2$ layer 52 constituting the first hard mask 50 is also etched into an almost cone shape at the time of such etching.

Figure 18C:
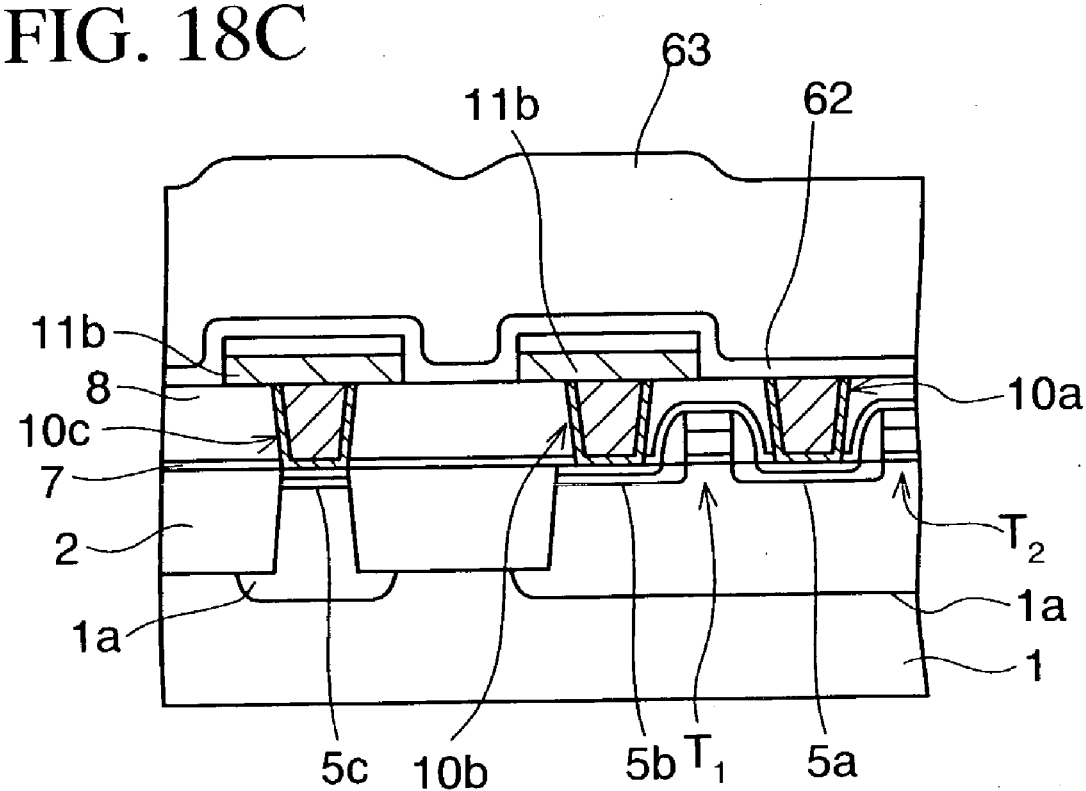

Then, as shown in FIG. 18C, an alumina layer for covering the first hard mask 60a and the oxygen-barrier metal layer 11b is formed as an oxidation-preventing insulating layer 62 on the first interlayer insulating layer 8 to have a thickness of 100 to 150 nm. The alumina layer may be formed either the sputter method or the CVD method. As the condition that the alumina layer is formed by the MOCVD method, a gas in which hydrogen ($H_2$) or ozone ($O_3$) is added to trimethylaluminium ($Al(CH_3)_3$), for example, is employed, and the substrate temperature is set to 300° C., for example.

Then, an $SiO_2$ layer of 600 nm thickness is formed as a sacrifice oxide layer 63 on the oxidation-preventing insulating layer 62. The sacrifice oxide layer 63 is formed by the CVD method using TEOS, for example.

Figure 18D:
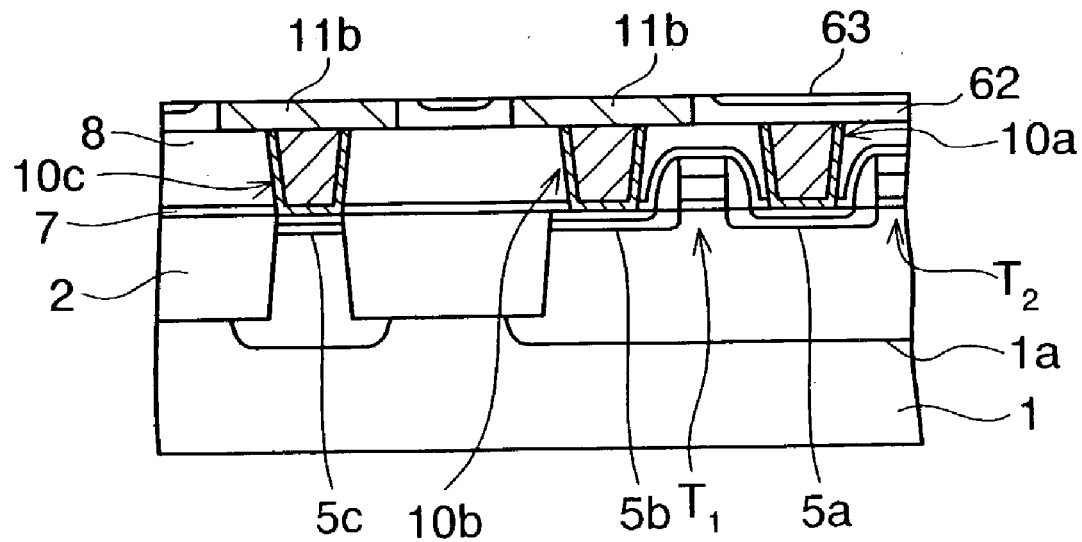

Then, as shown in FIG. 18D, the sacrifice oxide layer 63, the oxidation-preventing insulating layer 62, and the first hard mask 60a are polished by the CMP method while causing the island-like oxygen-barrier metal layer 11b to act as the stopper layer. At the time of such polishing, the abrasive cloth and the slurry shown in the eighth embodiment are employed. Thus, upper surfaces of the oxygen-barrier metal layer 11a, the oxidation-preventing insulating layer 54, and the sacrifice oxide layer 55 are made substantially flat, and the first hard mask 60a is removed and thus an upper surface of the underlying oxygen-barrier metal layer 11b is exposed. In addition, the oxidation-preventing insulating layer 54 left on the side of the island-like oxygen-barrier metal layer 11b covers the first interlayer insulating layer 8 and the first conductive plug 10a. In this case, the sacrifice oxide layer 63 is left thin on the oxidation-preventing insulating layer 62.

As described above, if the island-like oxygen barrier metal layer 11b is used as a part of the capacitor lower electrode, the first hard mask 60a is removed from the upper surface of the island-like oxygen barrier metal layer 11b by the CMP method subsequently to the oxidation-preventing insulating layer 63. Therefore, like the eighth and ninth embodiments, the isolated step of removing only the first hard mask 60a is eliminated.

Figure 18E:
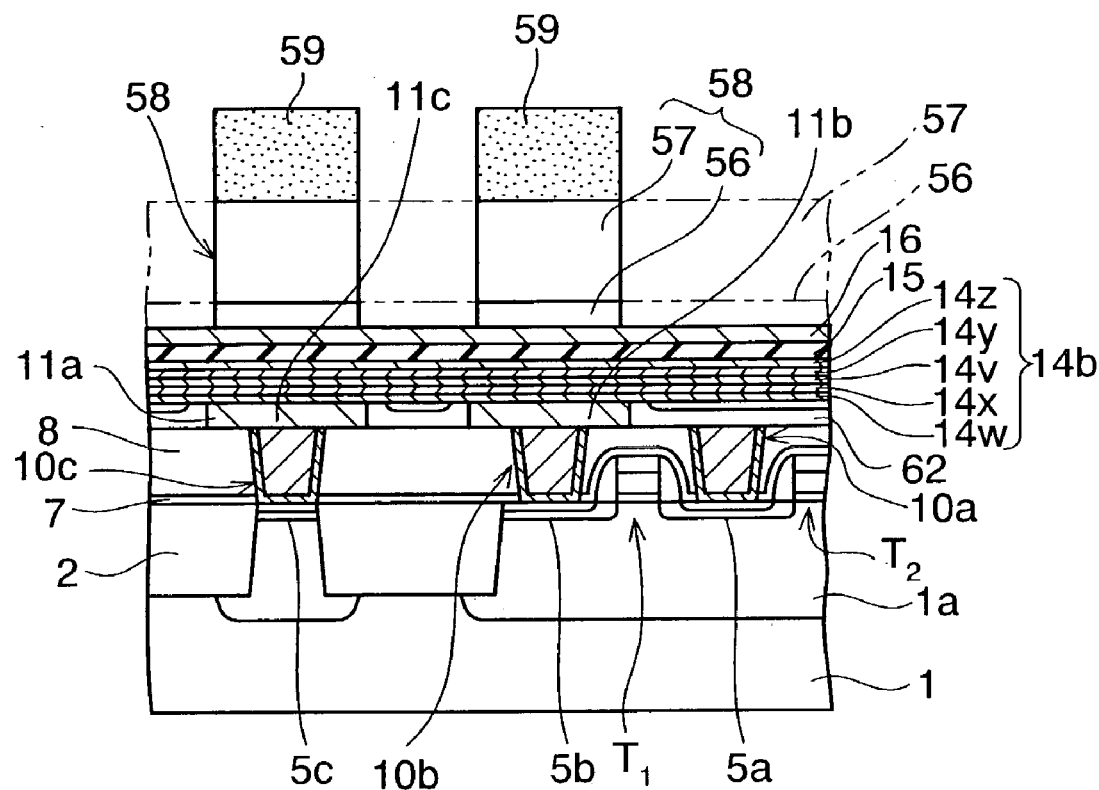

Then, as shown in FIG. 18E, the first conductive layer 14b is formed on the oxygen-barrier metal layer 11b, the oxidation-preventing insulating layer 62, and the sacrifice oxide layer 63. As the first conductive layer 14b, the laminated structure unlike the second embodiment is formed. For example, an Ir layer 14w of 100 to 200 nm thickness, an $IrO_2$ layer 14x of about 30 nm thickness, a Pt layer 14v of 15 nm thickness, a PtO layer 14y of about 25 nm thickness, and a Pt layer 14z of about 50 nm thickness are formed sequentially.

In this case, the oxidation-preventing insulating layer 54 is annealed in the argon atmosphere to prevent the peeling-off of the layer, for example, before or after the formation of the first conductive layer 14b.

Then, the ferroelectric layer 15 and the second conductive layer 16 are formed on the first conductive layer 14b. As the ferroelectric layer 15, a PZT layer of 140 to 200 nm thickness is formed by the sputter method. Then, the ferroelectric layer 15 is annealed in the oxygen atmosphere to crystallize the ferroelectric layer 15. In this case, as the growth method and the material of the ferroelectric layer 15, the growth method and the material shown in the second embodiment may be employed in addition to this.

Then, an $IrO_2$ layer of about 200 to 300 nm thickness, for example, is formed as the second conductive layer 16 on the ferroelectric layer 15 by the sputter method.

Then, a TiN layer 56 of 200 nm thickness is formed on the second conductive layer 16 by the PVD method using TEOS. Then, an $SiO_2$ layer 57 of 900 nm thickness is formed on the TiN layer 56 by the CVD method using TEOS.

Then, a resist is coated on the $SiO_2$ layer 57. Then, resist patterns 59 each having an almost capacitor planar shape are formed over the second and third conductive plugs 10b, 10c and their peripheral areas by exposing/developing the resist. Then, areas of the $SiO_2$ layer 57 and the TiN layer 56, which are not covered with the resist pattern 59, are etched. Thus, the $SiO_2$ layer 57 and the TiN layer 56 being left under the resist patterns 59 are used as a second hard mask 58. In this case, the TiN layer 56 is etched by using a mixed gas of $BCl_3$ and $Cl_2$, or $Cl_2$ or other gas. Also, the $SiO_2$ layer 57 is etched by setting the substrate temperature to 0 to 20° C. In this case, the dry etching of the $SiO_2$ layer 57 and the TiN layer 56 is executed by exchanging the etcher.

Then, the resist patterns 59 are removed by the oxygen ashing.

Figure 18F:
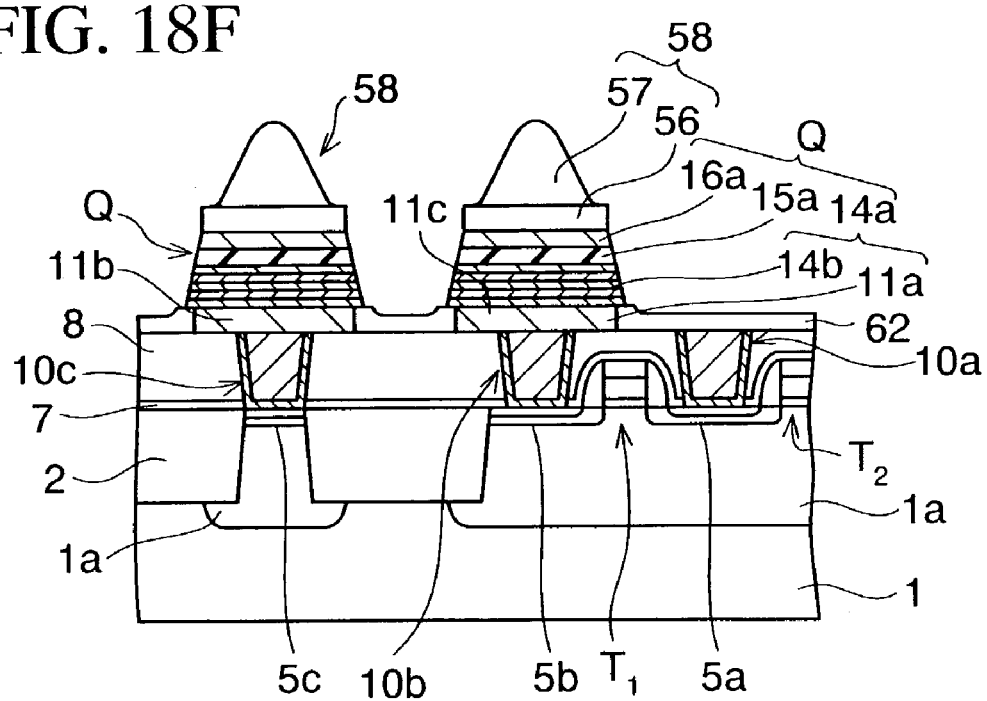

Then, as shown in FIG. 18F, the second conductive layer 16, the ferroelectric layer 15, and the first conductive layer 14b in areas that are not covered with the second hard mask 58 are etched sequentially. In this case, all the second conductive layer 16, the ferroelectric layer 15, and the first conductive layer 14b are etched by using the ICP plasma etching equipment.

As these etching conditions, a pressure in the chamber is set to 0.4 Pa, the wafer stage temperature is set to 400° C., a source power is set to 800 watt, and a bias power is set to 700 watt. Also, as the etching gas for the second conductive layer 16 and the first conductive layer 14b, HBr and $O_2$ are supplied to the etching chamber at a flow rate of 10 sccm and 40 sccm respectively. Also, as the etching gas for the ferroelectric layer 15, $Cl_2$ and Ar are supplied to the etching chamber at a flow rate of 40 sccm and 10 sccm respectively. In this case, the source power is a power of a high-frequency power supply applied to an antenna of the ICP plasma etching equipment. The bias power is a power of a high-frequency power supply applied to the semiconductor wafer (silicon substrate) 1.

Thus, a plurality of capacitors Q that are connected to the second and third conductive plugs 10b, 10c separately are formed on the first interlayer insulating layer 8. The lower electrode 14a of the capacitor Q is constructed by the first conductive layer 14b and the oxygen-barrier metal layer 11b. Also, the dielectric layer 15a of the capacitor Q is constructed by the ferroelectric layer 15, and the upper electrode 16a of the capacitor Q is constructed by the second conductive layer 16.

In this case, at the time of such etching, the $SiO_2$ layer 57 constituting the second hard mask 58 is also etched and is left like an almost cone shape.

Figure 18G:
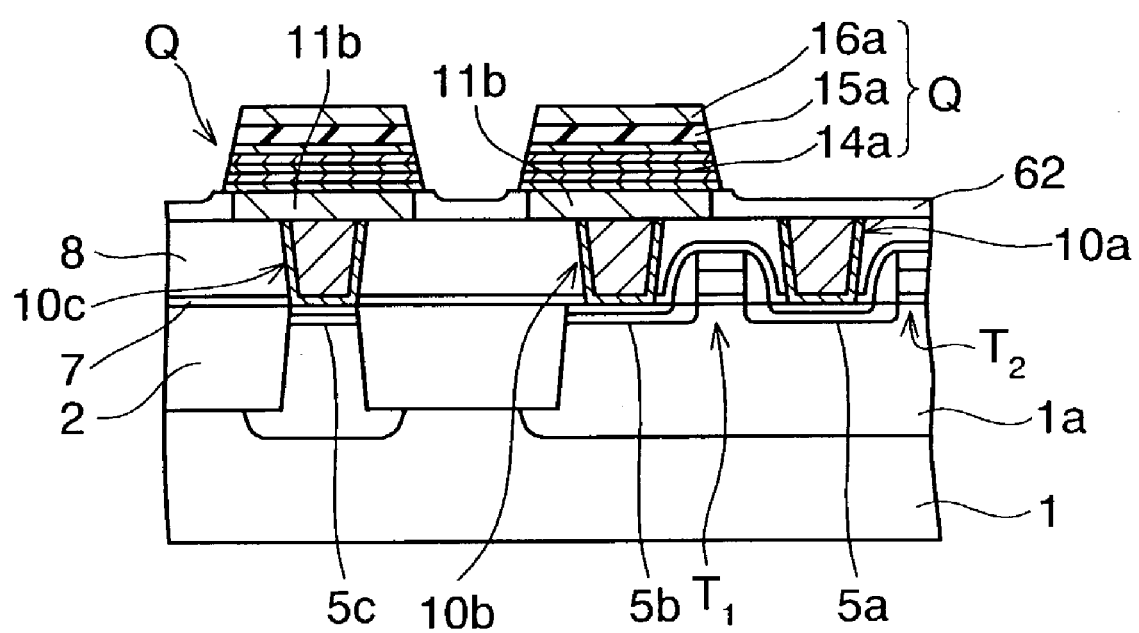

Then, as shown in FIG. 18G, the $SiO_2$ layer 57 constituting the second hard mask 58 is removed by the two-frequency reactive ion etching (two-frequency RIE) using a mixed gas consisting of $C_4F_8$, Ar, and $O_2$. At the time of such etching, for example, a power supply of 2000 W and 27.13 MHz is connected to the upper electrode out of the parallel-plate type electrodes in the reaction chamber of the two-frequency RIE equipment and a power supply of 200 W and 800 kHz is connected to the lower electrode thereof. Also, a distance between the lower electrode and the upper electrode is set to 20 mm. The temperature of the upper electrode is set to 30° C., and the temperature of the lower electrode on which the silicon substrate 1 is loaded is set to 0° C. Also, the temperature of the inner side wall of the reaction chamber is set to 50° C. Also, as the etching gas, $C_4F_8$, Ar, and $O_2$ are introduced into the reaction chamber at a flow rate of 20 sccm, 500 sccm, and 8 sccm respectively. Also, a gas pressure in the reaction chamber is set to 25 to 40 mTorr.

In this case, if the sacrifice oxide layer 63 is left on the insulating adhesive layer 62, such sacrifice oxide layer 63 as well as the $SiO_2$ layer 57 is removed.

Then, the TiN layer 56 of the second hard mask 58 is removed by the wet etching using a mixed chemical consisting of hydrogen peroxide and ammonia.

Then, in order to recover the damage of the ferroelectric layer 15 caused by the etching that is executed to form the capacitors Q, the recovery annealing of the capacitors Q is executed. The recovery annealing in this case is executed at the substrate temperature of 650° C. for 60 min in the atmosphere containing the oxygen, for example.

Then, like the second embodiment, steps goes to the steps of forming the insulating capacitor protection layer 18, the second interlayer insulating layer 19, the fourth conductive plug 21, etc., but their details will be omitted herein.

In the above embodiments, the island-like oxygen barrier metal layer 11b and the overlying first hard mask 60a are covered with the alumina-oxidation preventing insulating layer 62. Then, the first hard mask 60a is removed at the same time when the alumina-oxidation preventing insulating layer 62 is planarized by the CMP method. Therefore, like the eighth embodiment, there is no necessity to independently provide the step of removing the first hard mask 60a.

Also, the alumina layer has two times an oxidation preventing function in contrast to the SiON layer. Thus, in order to prevent the oxidation of the second and third conductive plugs 10b, 10c at the time of oxygen annealing after the formation of the island-like oxygen-barrier metal layer 11b, a thickness of the alumina-oxidation preventing insulating layer 62 may be thinned such as about 50 nm.

The selective etching ratio of the $SiO_2$ layer to the alumina layer is about 40. Hence, an etching depth of the alumina-oxidation preventing insulating layer 62 generated when the $SiO_2$ layer 57 of the second hard mask 58 is removed by the etching is about 18 to 25 nm. Also, an etching depth of the alumina-oxidation preventing insulating layer 62 generated by the overetching after the patterning of the capacitors Q is about 12 to 17 nm.

The thickness of the alumina-oxidation preventing insulating layer 62 may be set to about 100 nm or more with regard to these etching amounts. Therefore, if the alumina-oxidation preventing insulating layer 62 is planarized by the CMP method, the thickness of the oxygen barrier metal layer 11b serving as the stopper can be reduced to about 200 nm. As a result, if the distance between the island-like oxygen-barrier metal layers 11b is narrowed, an increase in the aspect ratio of the space between the oxygen-barrier metal layers 11b can be prevented. Thus, the alumina-oxidation preventing insulating layer 62 formed in the space can be perfectly buried.

Because no clearance is generated in the alumina-oxidation preventing insulating layer 62 in such space, no recess is formed in the first interlayer insulating layer 8 under the space between the island-like oxygen barrier metal layers 11b. Thus, the oxidation of the first to third conductive plugs 10a to 10c through the first interlayer insulating layer 8 can be prevented.

Also, in order to prevent the oxidation of the second and third conductive plugs 10b, 10c caused by the crystallization annealing of the ferroelectric layer 15 and the recovery annealing after the formation of the capacitors Q, the thickness of the Ir layer constituting the oxygen-barrier metal layer 11b together with the thickness of the Ir layer 14w constituting the lower electrode 14a of the capacitor Q may be set to 300 nm or more. In addition, such layer thickness may be increased further more to meet with the oxidizing annealing temperature after the patterning of the oxygen-barrier metal layer 11b.

By the way, in the present embodiment, the thickness of the Ir layer constituting the island-like oxygen-barrier metal layer 11b is set to 200 nm with regard to the thickness of the Ir layer 14w of the lower electrode 14a. If the hard mask is formed as the single-layer structure of the TiN layer, there is no trouble to pattern such Ir layer having the thickness of 200 nm.

In this case, the above oxidation preventing insulating layer 62 has the alumina single-layer structure. But the double-layered structure consisting of $SiO_2$ layer and the alumina layer or the double-layered structure consisting of the SiON layer and the alumina layer may be employed.

Other Embodiment

In the above embodiments, doped silicon may be employed as the material of the conductive plug.

Also, the ferroelectric material is employed as the dielectric layer of the capacitor, but the high-dielectric material may also be employed. In addition, the memory cell is explained in the above embodiments. Further, as explained in the first, second, and fifth embodiments, in the peripheral circuit or the logic circuit formed on the semiconductor substrate, the step of forming the oxidation-preventing insulating layer on the first-layer conductive plug may be contained. In this case, in the peripheral circuit or the logic circuit, the structure on the impurity diffusion region may be formed as the structure that connects the conductive plug formed in the contact hole in the first interlayer insulating layer 8 and the conductive plug formed in the contact hole in the oxidation-preventing insulating layer 12 and the second interlayer insulating layer 19, like the structure on the first n-type impurity diffusion region 5a. The impurity diffusion regions are the source/drain regions of the MOS transistor, for example.

Also, as explained in the third, fourth, and seventh embodiments, in the peripheral circuit or the logic circuit, the structure on the impurity diffusion regions constituting the MOS transistor may be formed as the structure that connects sequentially the conductive plug formed in the contact hole in the first interlayer insulating layer 8 and the conductive plug formed, the island-like oxygen-barrier metal layer formed on the first interlayer insulating layer, and the conductive plug formed in the second interlayer insulating layer.

In addition, ruthenium may be employed as the oxygen-barrier metal layer in place of iridium. Also, the oxygen-barrier metal layer may be formed of a ruthenium lower layer and a ruthenium oxide upper layer.

As described above, according to the present invention, the first and second conductive plugs are formed in the first insulating layer, then the oxygen-barrier metal layer is formed on the first conductive plug and the oxidation-preventing insulating layer is formed on the second conductive plug, then the capacitors are formed on the first conductive plug via the oxygen-barrier metal layer, then the second insulating layer for covering the capacitors is formed, and then the third conductive plug is formed on the second conductive plug. Therefore, the structure for connecting the impurity diffusion region and the upper wiring is made on a via-to-via basis, and it is not needed to form the holes having the large aspect ratio at a time, and the filling of the holes can be facilitated. As a result, the up-to-date equipment is not required, and the development cost and the step cost can be reduced. Also, the abnormal oxidation of the first conductive plug can be prevented by the oxygen-barrier metal layer, and also the abnormal oxidation of the second conductive plug can be prevented by the oxidation-preventing insulating layer.

In addition, since the oxygen-barrier metal layer and the insulating adhesion layer are planarized simultaneously by the polishing, the capacitor lower electrode formed on the oxygen-barrier metal layer can be formed flat. Thus, generation of the degradation of the dielectric layer formed on the lower electrode can be avoided, and also formation of the capacitors with good characteristics can be formed.

Further, by adopting the oxygen-barrier metal layer formed as the multi-layered structure and the upper layer is formed of the material that can be relatively easily polished, e.g., iridium oxide, the underlying layer of the capacitors can be formed flatter by polishing the insulating adhesion layer and the oxygen-barrier metal layer. Thus, the characteristics of the capacitors can be improved.

Furthermore, according to the present invention, the oxygen-barrier metal layer instead of the oxidation-preventing insulating layer is formed like the island on the second conductive plug. Therefore, not only the same advantages as the oxidation-preventing insulating layer can be obtained but also the step of forming the oxidation-preventing insulating layer can be omitted.

In this case, by adopting the oxygen-barrier metal layer formed on the first conductive plug immediately under the capacitor as the lower electrode, the step of patterning the lower electrode can be reduced.

In the condition of which the conductive adhesion layer is formed between the conductive layer constituting the capacitor lower electrode and the oxygen-barrier metal layer, the peeling-off of the capacitor lower electrode can be prevented without fail.

By adopting the conductive adhesion layer formed between the oxygen-barrier metal layer and the first insulating layer, the adherence between the oxygen-barrier metal layer and the first insulating layer can be improved. Therefore, the oxygen can be prevented without fail from being supplied from the clearance between the oxygen-barrier metal layer and the first insulating layer to the conductive plug, and thus the oxidation of the conductive plug can be prevented.

In the case that the oxygen-barrier metal layer is patterned by using the hard masks, the insulating adhesion layer is formed on the hard masks and the oxidation-preventing insulating layer after the patterning of the oxygen-barrier metal layer, and then the insulating adhesion layer and the hard masks are polished continuously until the oxygen-barrier metal layer is exposed. Therefore, the independent step of removing the hard masks can be omitted and thus throughput can be improved.

What is claimed is:

1. A semiconductor device comprising:
    a first impurity diffusion region and a second impurity diffusion region formed in a surface region of a semiconductor substrate;
    a first insulating layer formed over the semiconductor substrate;
    a first hole and a second hole formed in the first insulating layer;
    a first conductive plug formed in the first hole and connected electrically to the first impurity diffusion region;
    a second conductive plug formed in the second hole and connected electrically to the second impurity diffusion region;
    an oxygen-barrier metal layer formed in a shape of an island on the first conductive plug and its peripheral area and on the first insulating layer, said oxygen barrier metal layer having a side surface;
    an oxidation preventing layer formed on the first insulating layer and side surface of the oxygen-barrier metal layer and made of material that prevents oxidation of the second conductive plug, an upper surface of the oxidation preventing layer being planarized around the oxygen-barrier metal layer;
    a capacitor having a lower electrode formed on the oxygen-barrier metal layer, a dielectric layer formed on the lower electrode, and an upper electrode formed on the dielectric layer;
    a second insulating layer covering the capacitor and the oxidation preventing layer;
    a third hole formed in the second insulating layer over the second conductive plug; and
    a third conductive plug formed in the third hole and connected electrically to the second conductive plug.

2. A semiconductor device according to claim 1, wherein
    the oxidation preventing layer is an oxidation preventing insulating layer that is formed on the first insulating layer to cover side surfaces of the oxygen-barrier metal layer, and
    the third conductive plug is connected to the second conductive plug.

3. A semiconductor device according to claim 2, wherein the oxidation preventing insulating layer consists of one of alumina, silicon nitride, and silicon oxide nitride.

4. A semiconductor device according to claim 2, wherein an upper surface of the oxygen-barrier metal layer and an upper surface of the oxidation preventing insulating layer are planarized under the lower electrode.

5. A semiconductor device according to claim 2, wherein an insulating adhesion layer is formed on the oxidation preventing insulating layer and under the lower electrode.

6. A semiconductor device according to claim 1, wherein an insulating adhesion layer is formed around the oxygen-barrier metal layer under the capacitor.

7. A semiconductor device according to claim 1, wherein the lower electrode consists of conductive layers, and a lowermost layer of the conductive layers is formed of same material as the oxygen-barrier metal layer, and a total thickness of the lowermost layer and the oxygen-barrier metal layer is set to prevent oxidation of the first conductive plug at an annealing temperature of the dielectric layer.

8. A semiconductor device according to claim 1, wherein the first conductive plug and the second conductive plug contain tungsten respectively.

9. A semiconductor device according to claim 1, wherein the first impurity diffusion region and the second impurity diffusion region constitute a transistor.

* * * * *